United States Patent
Ruuttu et al.

(10) Patent No.: US 8,828,506 B2
(45) Date of Patent: Sep. 9, 2014

(54) ARRANGEMENT

(75) Inventors: Jari Ruuttu, Billnäs (FI); Vesa Myllymäki, Helsinki (FI); Reijo Lappalainen, Hiltulanlahti (FI); Lasse Pulli, Helsinki (FI); Juha Mäkitalo, Tammisaari (FI); Sampo Ylätalo, Helsinki (FI)

(73) Assignee: Picodeon Ltd Oy, Helsinki (FI)

( * ) Notice: Subject to any disclaimer, the term of this patent is extended or adjusted under 35 U.S.C. 154(b) by 1301 days.

(21) Appl. No.: 12/522,991

(22) PCT Filed: Feb. 22, 2008

(86) PCT No.: PCT/FI2008/050083
§ 371 (c)(1),
(2), (4) Date: Apr. 8, 2010

(87) PCT Pub. No.: WO2008/102062
PCT Pub. Date: Aug. 28, 2008

(65) Prior Publication Data
US 2010/0196624 A1 Aug. 5, 2010

(30) Foreign Application Priority Data
Feb. 23, 2007 (FI) .................................. 20070158

(51) Int. Cl.
C23C 14/30 (2006.01)
B23K 26/08 (2014.01)
H01J 37/32 (2006.01)
B23K 26/067 (2006.01)
C23C 14/28 (2006.01)

(52) U.S. Cl.
CPC ......... B23K 26/0807 (2013.01); B23K 26/0815 (2013.01); H01J 37/32339 (2013.01); B23K 26/067 (2013.01); C23C 14/28 (2013.01); B23K 26/0673 (2013.01)
USPC ...................................... 427/596; 359/216.1

(58) Field of Classification Search
None
See application file for complete search history.

(56) References Cited

U.S. PATENT DOCUMENTS 4,987,007 A * 1/1991 Wagal et al. .................. 427/526
5,760,366 A 6/1998 Haruta et al.
(Continued)

FOREIGN PATENT DOCUMENTS

| EP | 0579983 | 6/1993 |
|---|---|---|
| JP | 2004188437 | 7/2004 |
| JP | 2005097698 | 4/2005 |
| JP | 2005-262230 A | 9/2005 |
| JP | 2005262284 | 9/2005 |

(Continued)

OTHER PUBLICATIONS

JP Office Action issued in counterpart JP Application No. 2009-550738 on May 7, 2013.

Primary Examiner — Michael Cleveland
Assistant Examiner — Joel Horning
(74) Attorney, Agent, or Firm — Stanton IP Law

(57) ABSTRACT

The invention relates in general level to radiation transference techniques as applied for utilization of material handling. The invention relates to a radiation source arrangement comprising a path of radiation transference, or an improved path of radiation transference, which path comprises a scanner or an improved scanner. The invention also concerns a target material suitable for vaporization and/or ablation. The invention concerns an improved scanner. The invention concerns also to a vacuum vaporization/ablation arrangement that has a radiation source arrangement according to invention. The invention concerns also a target material unit, to be used in coating and/or manufacturing target material.

15 Claims, 57 Drawing Sheets

(56) References Cited

Figure 1:
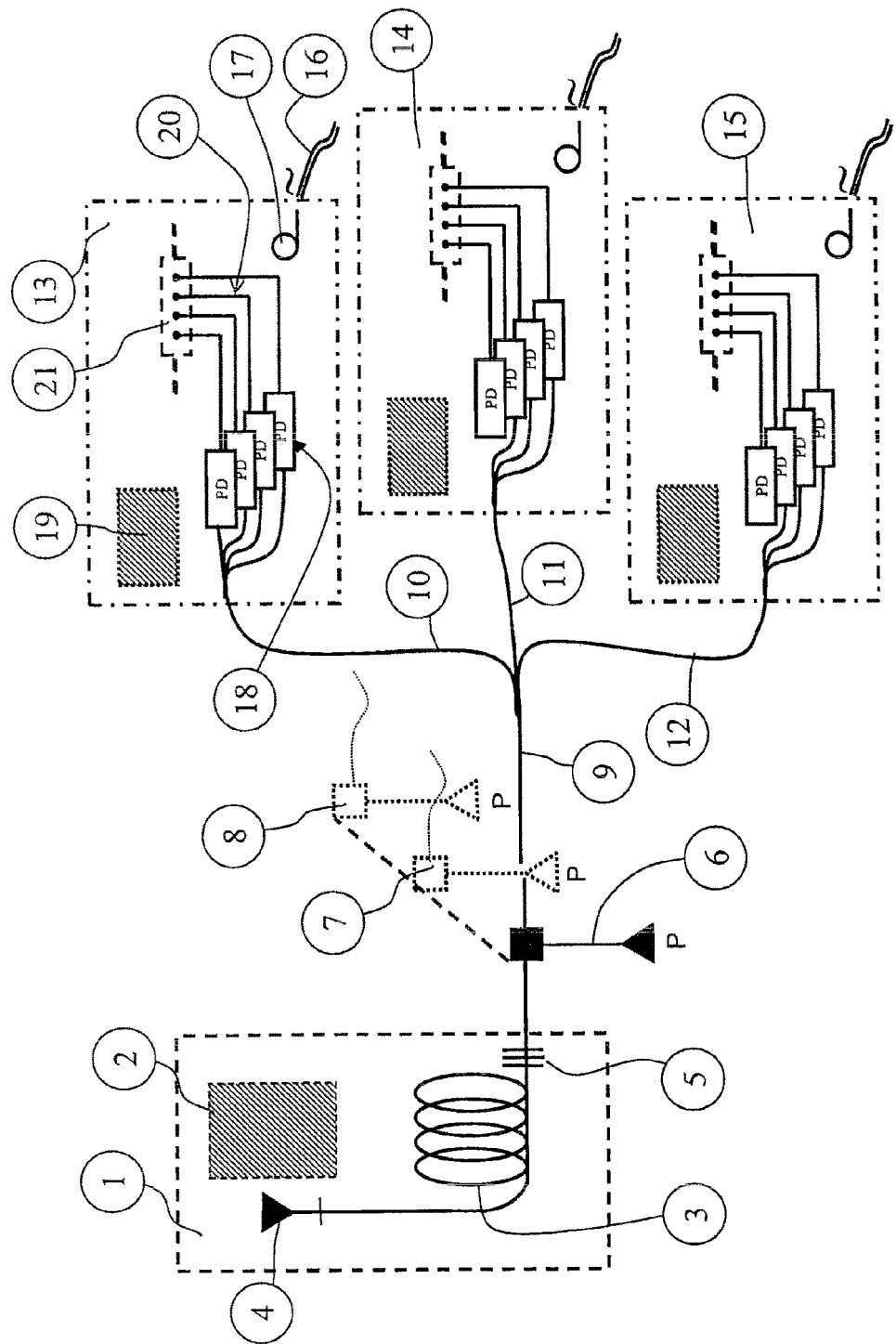

U.S. PATENT DOCUMENTS 6,033,741 A * 3/2000 Haruta et al. ............... 427/596
6,312,768 B1 * 11/2001 Rode et al. ................. 427/596
6,372,103 B1 4/2002 Perry et al.

FOREIGN PATENT DOCUMENTS

| WO | 2006011608 | 2/2006 |
| WO | WO-2007/006850 A2 | 1/2007 |
| WO | WO-2007/096464 A2 | 8/2007 |

* cited by examiner

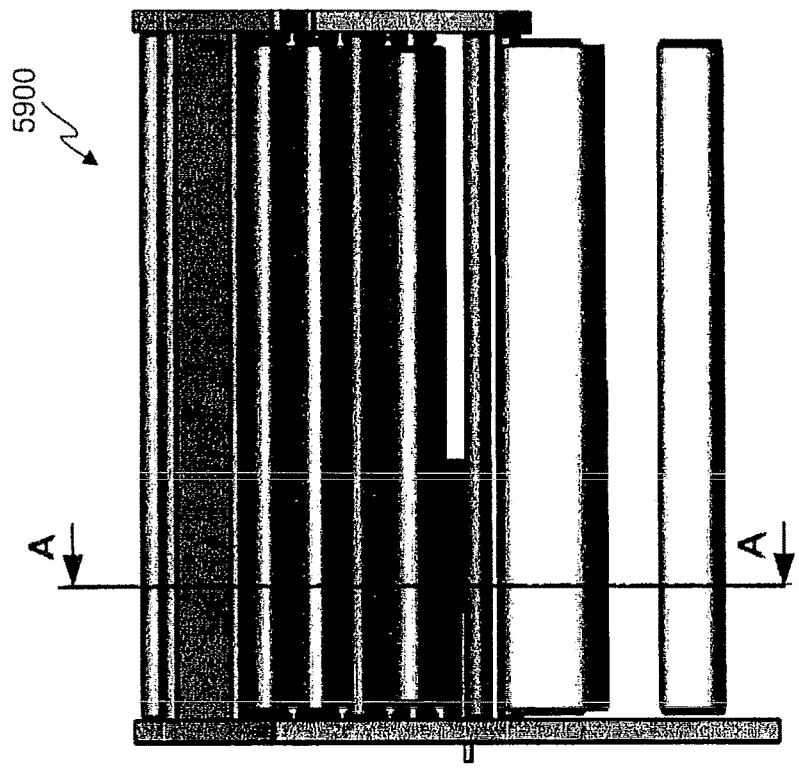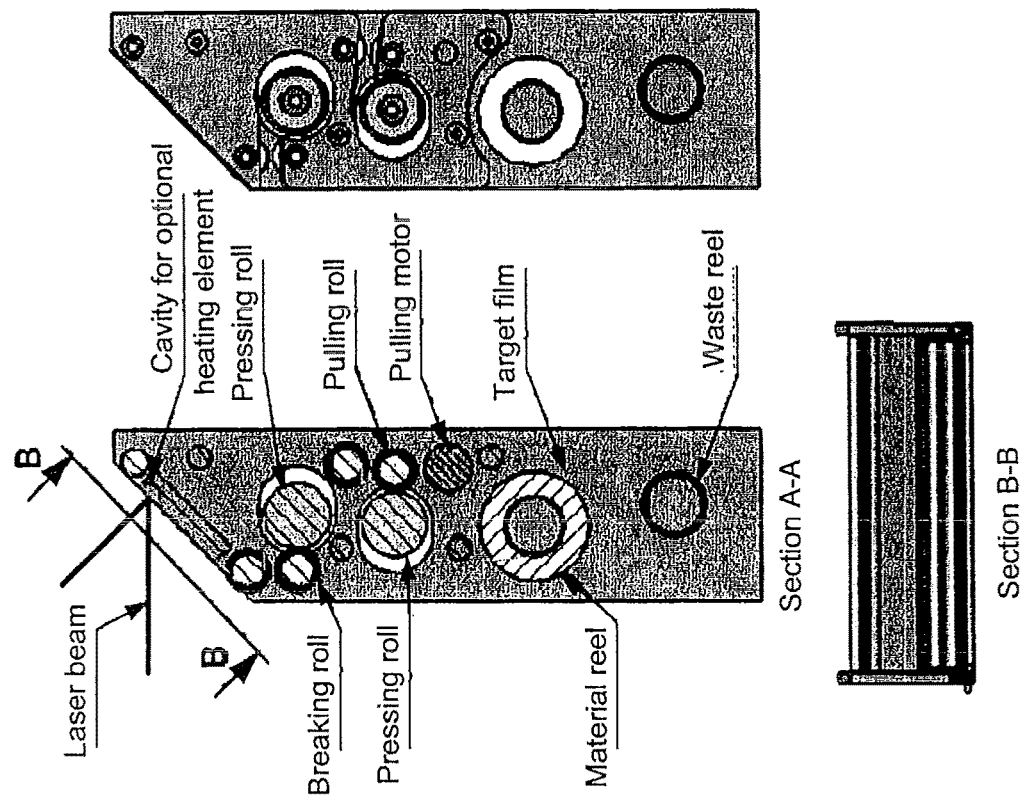
FIG 17

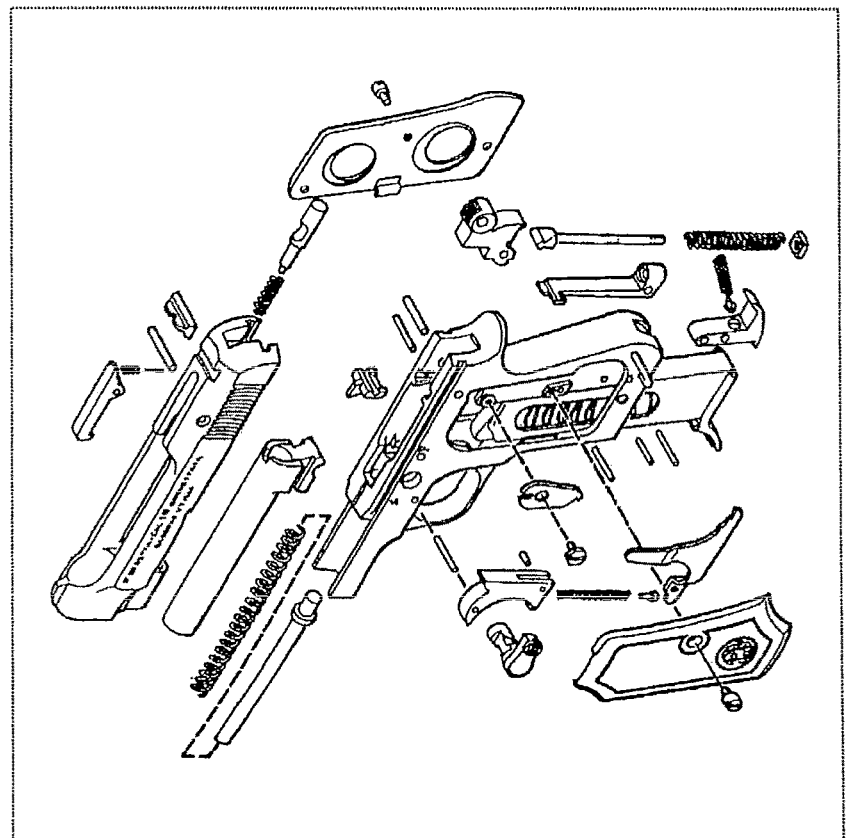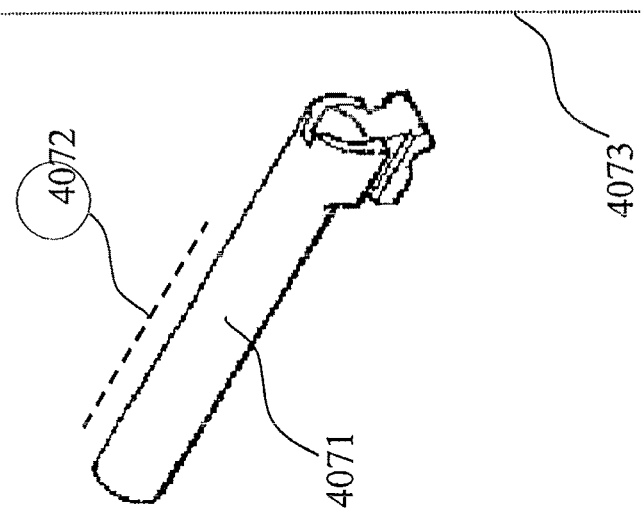
Fig. 40

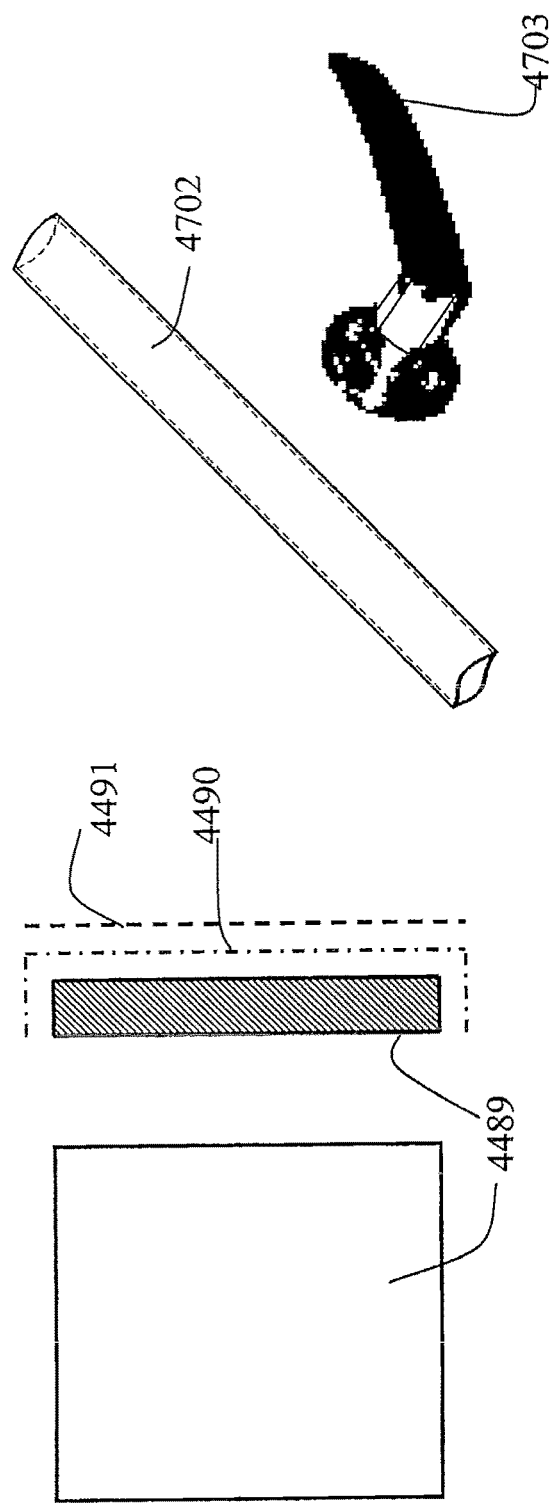
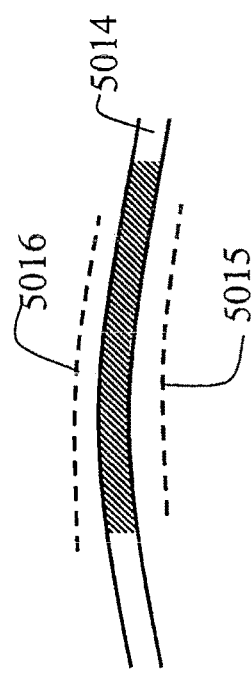
Fig. 47
Fig. 44
Fig. 50

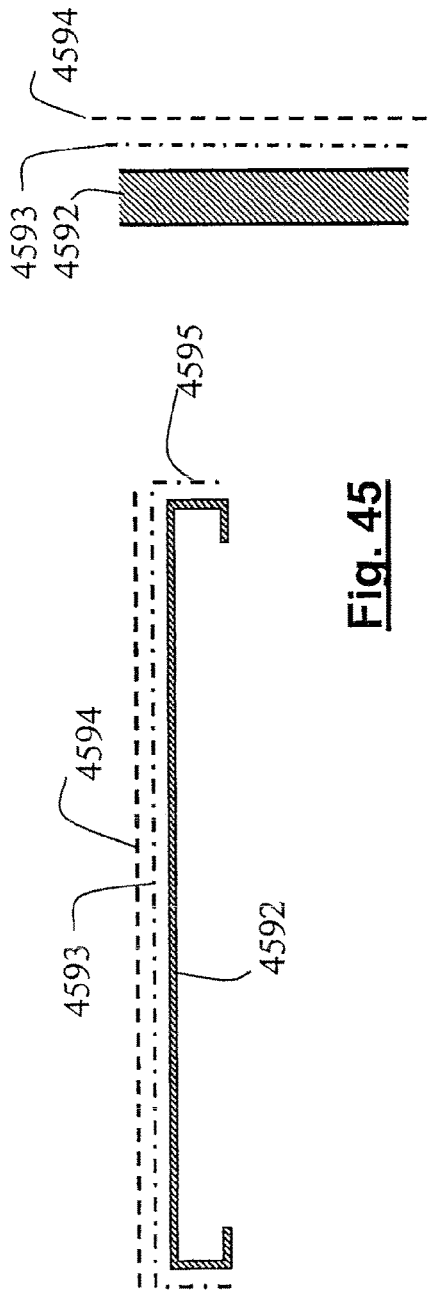
Fig. 45
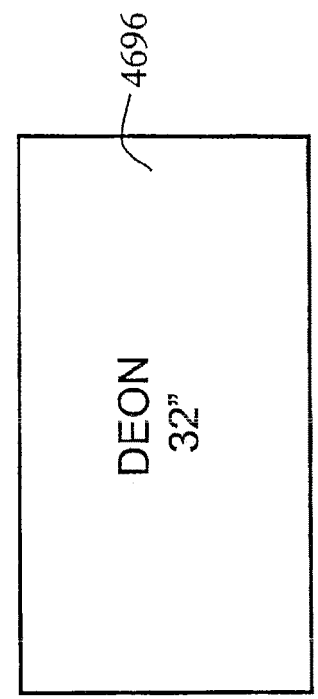
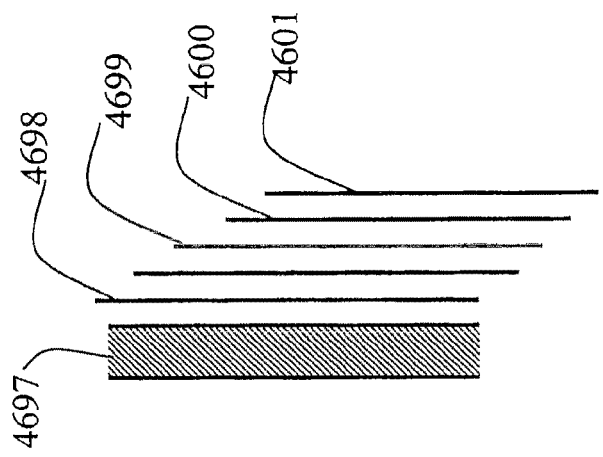
Fig. 46

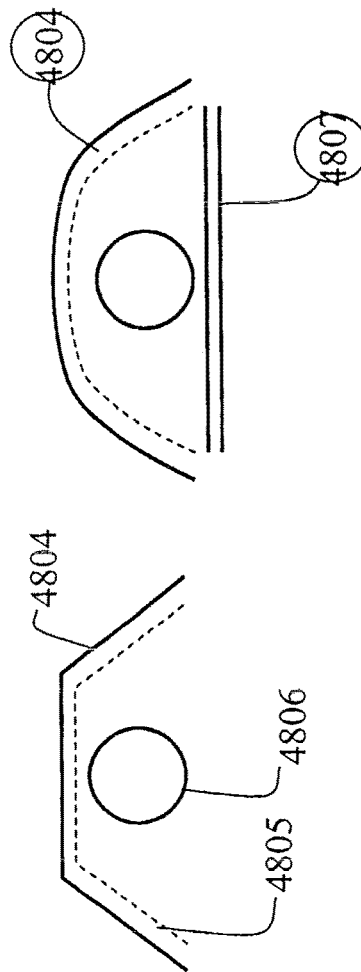
Fig. 48
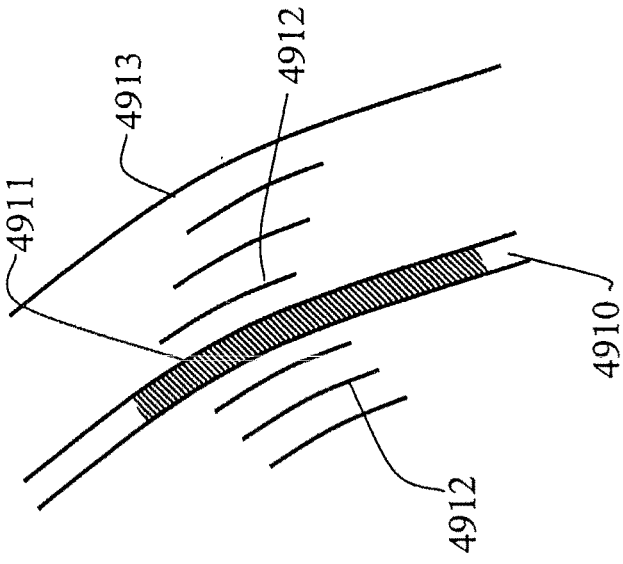
Fig. 49
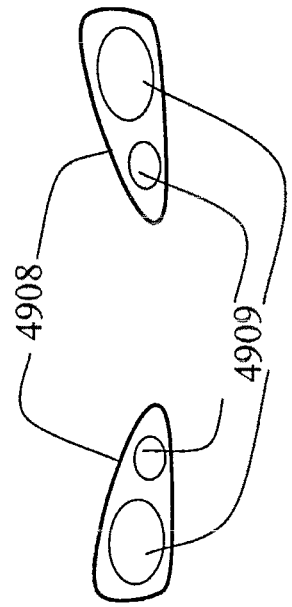

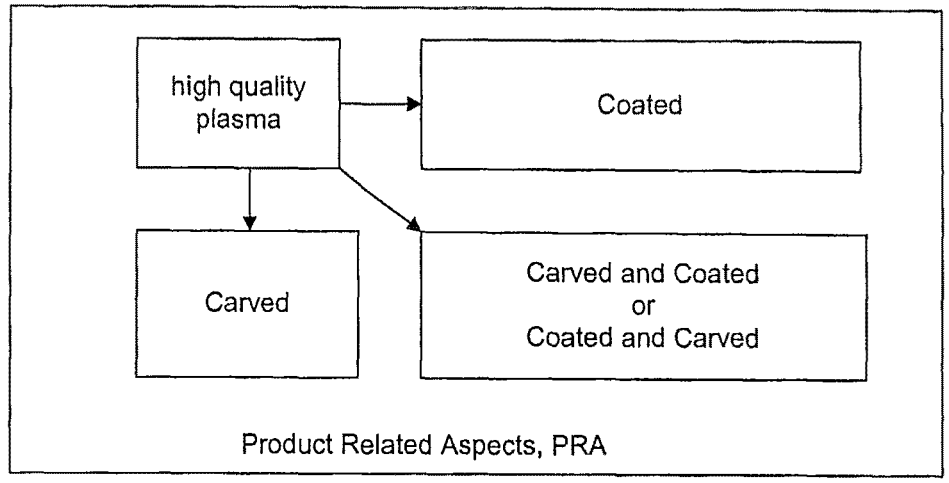
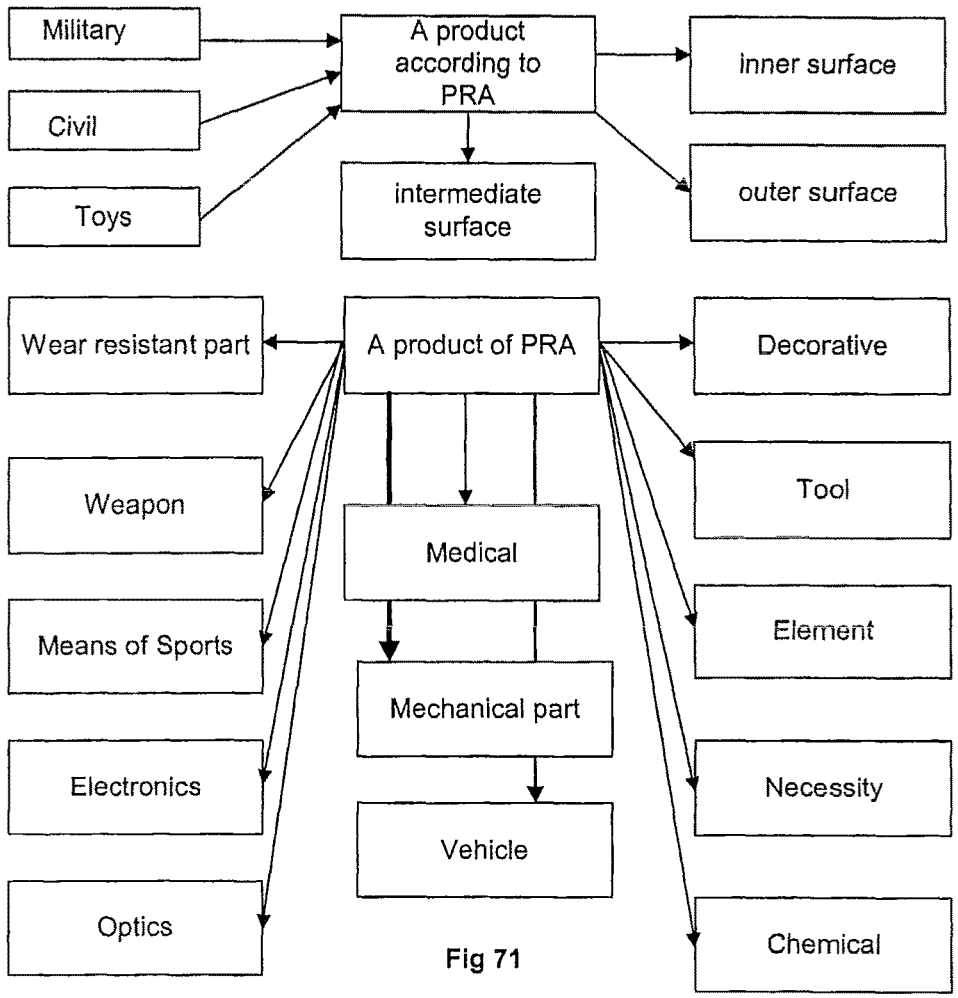
Fig 71

ARRANGEMENT

FIELD OF INVENTION

The invention relates in a very general level to radiation transference techniques as applied for utilisation of material handling.

The invention relates more particularly to a method to produce fine plasma according to what has been said in the preamble part of an independent method claim directed to a method to produce fine plasma. The invention relates also to a cold-work method in according to what has been stated in the pre-amble part of an independent method claim directed to a cold-work method. The invention relates also to a coating method according to what has been stated in the preamble part of an independent method claim directed to a coating method. The invention relates also to a vacuum vaporization/ablation arrangement according to what has been stated in the preamble part of an independent claim directed to a vacuum vaporization/ablation arrangement. The invention relates also to a surface processing method according to what has been stated in the preamble part of an independent method claim directed to a surface processing method. The invention relates also to a particular use of a coating method according to what is stated in an independent use claim directed to a use of a coating method.

BACKGROUND

Laser technology has advanced significantly in the recent years and now it is possible to produce fiber based semiconductor laser systems with a tolerable efficiency which can be used in cold ablation, for example.

The optical fibers in fiber lasers for transmitting the laser beam are not, however, suitable for transmitting high-power, pulse-compressed laser beams to the work spot. The fibers simply cannot withstand the transmission of the high-power pulse. One reason as to why optical fibers have been introduced in laser beam transmission is that the transmission of a laser beam from one place to another through free air space by means of mirrors to the work spot is in itself extremely difficult and fairly impossible to accomplish with precision on an industrial scale. Furthermore, impurities in the air and, on the other hand, scattering and absorption mechanisms in the component parts of the air may bring about losses in the laser power which will affect the beam power at the target in a manner difficult to predict. Naturally, laser beams propagating in free air space also pose a significant safety risk.

Competing with the fully fiber based diode pumped semiconductor laser is the lamp pumped laser source in which the laser beam is first conducted into the fiber and thence further to the work spot. According to the information available to the applicant on the priority date of the present application these fiber based laser systems are at the moment the only way to bring about laser ablation based production on an industrial scale.

The fibers of present-day fiber lasers and, hence, the limited beam power impose limitations as to which materials can be vaporized. Aluminum as such can be vaporized using a reasonable pulse power, whereas materials more difficult to vaporize, such as copper, tungsten etc., require a pulse power considerably higher.

The same applies into situation in which new compounds were in the interest to be brought up with the same conventional techniques. Examples to be mentioned are for instance manufacturing diamond directly from carbon or alumina production straight from aluminium and oxygen via the appropriate reaction in the vapour-phase in post-laser-ablation conditions.

There are other problems, too, associated with the fiber laser technology. For example, large amounts of energy cannot be transmitted through optical fiber without the fiber melting and/or breaking or without substantial degradation of the laser beam quality as the fiber becomes deformed due to the high power transmitted. Already a pulse power of 10 µJ may damage the fiber if it has even the slightest structural or qualitative weaknesses. In fiber technology, especially prone to damage are the fiber optic couplers, which, for example, connect together a plurality of power sources, such as diode pumps.

The shorter the pulse, the bigger the amount of energy in it, so therefore this problem becomes more aggravated as the laser pulse gets shorter. The problem manifests itself already in nanosecond pulse lasers.

When employing novel cold-ablation, both qualitative and production rate related problems associated with coating, thin film production as well as cutting/grooving/carving etc. has been approached by focusing on increasing laser power and reducing the spot size of the laser beam on the target. However, most of the power increase was consumed to noise. The qualitative and production rate related problems were still remaining although some laser manufacturers resolved the laser power related problem. Representative samples for both coating/thin film as well as cutting/grooving/carving etc could be produced only with low with repetition rates, narrow scanning widths and with long working time beyond industrial feasibility as such, highlighted especially for large bodies.

The pulse duration decrease further to femto or even to atto-second scale makes the problem almost irresolvable. For example, in a pico-second laser system with a pulse duration of 10-15 ps the pulse energy should be 5 µJ for a 10-30 µm spot, when the total power of the laser is 100 W and the repetition rate 20 MHz. Such a fibre to withstand such a pulse is not available at the priority date of the current application according to the knowledge of the writer at the very date.

In laser ablation, which is an important field of application for the fiber laser, it is, however, quite important to achieve a maximal and optimal pulse power and pulse energy. Considering a situation where the pulse length is 15 ps and the pulse power is 5 µJ and the total power 1000 W, the energy level of the pulse is about 400,000 W (400 kW). According to the information available to the applicant on the priority date of the application, no-one has succeeded in manufacturing a fiber which would transmit even a 200-kW pulse with a 15-ps pulse length and with the pulse shape remaining optimal.

Nevertheless, if unlimited facilities are desired for plasma production from any substance available, the power level of the pulse should be freely selectable, for instance between 200 kW and 80 MW.

The problems associated with present-day fiber lasers are not, however, solely limited to the fiber, but also to the coupling of separate diode pumps by means of optical couplers in order to achieve a desired total power, the resulting beam being conducted through one single fiber to the work spot.

The applicable optical couplers also should withstand as much power as the optical fiber which carries the high power pulse to the work spot. Furthermore, the pulse shape should remain optimal in all stages of transmission of the laser beam. Optical couplers that withstand even the current power values are extremely expensive to manufacture, they have rather a poor reliability, and they constitute a part susceptible to wear, so they require periodic replacing.

The production rate is directly proportional to the repetition rate or repetition frequency. On one hand the known mirror-film scanners (galvano-scanners or back and worth moving type of scanners), which do their duty cycle in way characterized by their back and forth movement, the stopping of the mirror at the both ends of the duty cycle is somewhat problematic as well as the accelerating and decelerating related to the turning point and the related momentary stop, which all limit the utilizability of the mirror as scanner, but especially also to the scanning width. If the production rate were tried to be scaled up, by increasing the repetition rate, the acceleration and deceleration cause either a narrow scanning range or uneven distribution of the radiation and thus the plasma at the target when radiation hit the target via accelerating and/or decelerating mirror.

If trying to increase the coating/thin film production rate by simply increasing the pulse repetition rate, the present above mentioned known scanners direct the pulses to overlapping spot of the target area already at the low pulse repetition rates in kHz-range, in an uncontrolled way.

The same problem applies to nano-second range lasers, the problem being naturally even more severe because of the long lasting pulse with high energy. Thus, even one single nano-second range pulse erodes the target material drastically.

Prior art hardware solutions based on laser beams and ablation involve problems relating to power and quality, for example and especially in association with scanners, whereby, from the point of view of ablation, the repetition frequency cannot be raised to a level that would enable a large-scale mass production of a product of good and uniform quality. Furthermore, prior art scanners are located outside the vaporizer unit (vacuum chamber) so that the laser beam has to be directed into the vacuum chamber through an optical window which will always reduce the power to some extent.

According to the information available to the applicant, the effective power in ablation, when using equipment known at the priority date of the present application, is around 10 W. Then the repetition frequency, for instance, may be limited to only a 4-MHz chopping frequency with laser. If one attempts to increase the pulse frequency further, the scanners according to the prior art will cause a significant part of the pulses of the laser beam being directed uncontrollably onto the wall structures of the laser apparatus, and also into the ablated material in the form of plasma, having the net effect that the quality of the surface to be produced will suffer as will also the production rate and, furthermore, the radiation flux hitting the target will not be uniform enough, which may affect the structure of the plasma, which thus may, upon hitting the surface to be coated, produce a surface of uneven quality.

Then, in machining, working, too, where the target is a piece and/or part thereof to be machined worked, the surface of which is to be shaped, it easily happens that both the cutting efficiency and the quality of the cut are affected. Furthermore, there is a significant risk of spatters landing on the surfaces around the point of cut as well as on the very surface to be coated. In addition, with prior art technology, it takes time to achieve several layers with repeated surface treatment, and the quality of the end result is not necessarily uniform enough. For example, the applicant is not aware of any technology published by the priority date of the application which could be used to produce strong three-dimensional objects on a printer.

With known scanners of which the applicant is aware at the priority date of the present application the scanning speeds remain at about 3 m/s, and even then, the scanning speed is not really constant but varies during the scanning. This is because scanners according to the prior art are based on fixed turning mirrors which stop when the scanning distance has been traveled, and then move in the opposite direction, repeating the scanning procedure. Mirrors are also known which move back and forth, but these have the same problem with the non-uniformity of the movement. An ablation technique implemented with planar mirrors is disclosed in patent publications U.S. Pat. No. 6,372,103 and U.S. Pat. No. 6,063,455. Since the scanning speed is not constant, due to the acceleration, deceleration and stopping of the scanning speed, also the yield of plasma generated through vaporization at the work spot is different at different points of the target, especially at the extremities of the scanning area, because the yield and also the quality of the plasma completely depend on the scanning speed. In a sense, one could consider it as a main rule that the higher the energy level and the number of pulses per time unit, the bigger this drawback when using prior art devices. In successful ablation, matter is vaporized into atomic particles. But when there is some disturbance, target material will be released/become detached in fragments which may be several micrometers in size, which naturally affects the quality of the surface to be produced by ablation.

Since the present-day scanner speeds are low, increasing the pulse frequency would result in energy levels so high being directed onto the mirror structures that present-day mirror structures would melt/burn if the laser beam were not expanded prior to its arrival at the scanner. Therefore, a separate collecting lens arrangement is additionally needed between the scanner and the ablation target.

The operating principle of present-day scanners dictates that they have to be light. This also means that they have a relatively small mass to absorb the energy of the laser beam. This fact further adds to the melting/burning risk in present ablation applications.

In the prior art techniques, the target may not only ware out unevenly, but may also fragment easily and degrade the plasma quality. Thus, the surface to be coated with such a plasma can also suffers the detrimental effects of the plasma, as well as the fragments-flying-through-the-plasma originating anomalies in it. The surfaces as well as the cut lines may comprise fragments, plasma may be not evenly distributed to form such a coating etc. which are problematic in accuracy demanding application, but may be not experienced severely problematic, with coatings like ink, paint or decorative pigments, for instance, provided that the defects keep below the detection limit of the very application.

The present methods ware out the target in a single use so that same target is not available for a further use from the same surface again. The problem has been tackled by utilising only a virgin surface of the target, by moving target material and/or the beam spot accordingly.

In machining or work-related applications the left-overs or the debris comprising some fragments also can make the cut-line un even and thus inappropriate, as the case could for instance in flow-control drillings. Also the surface could be formed to have a random bumpy appearance caused by the released fragments, which may be not appropriate in certain semiconductor manufacturing, for instance.

In addition, the mirror-film scanners moving back and forth generate inertial forces that load the structure it self, but also to the bearings to which the mirror is attached and/or which cause the mirror movement. Such inertia little by little may loosen the attachment of the mirror, especially if such mirror were working nearly at the extreme range of the possible operational settings, and may lead to roaming of the settings in long time scale, which may be seen from uneven repeatability of the product quality. Because of the stoppings, as well as the direction and the related velocity changes of the movement, such a mirror-film scanner has a very limited scanning width so to be used for ablation and plasma production. The effective duty cycle is relatively short to the whole cycle, although the operation is anyway quite slow. In the point of view of increasing the productivity of a system utilising mirror-film scanners, the plasma making rate is in prerequisite slow, scanning width narrow, operation unstable for long time period scales, but yield also a very high probability to get involved with unwanted particle emission in to the plasma, and consequently to the products that are involved with the plasma via the machinery and/or coating.

One problem in prior-art solutions is the scanning width. These solutions use line scanning in mirror film scanners whereby, theoretically, one could think that it is possible to achieve a nominal scan line width of about 70 mm, but in practice the scanning width may problematically remain even around 30 mm, whereby the fringe regions of the scanning area may be left non-uniform in quality and/or different from the central regions. Scanning widths this small also contribute to the fact that the use of present-day laser equipment in surface treatment applications for large and wide objects is industrially unfeasible or technically impossible to implement.

Figure 67:
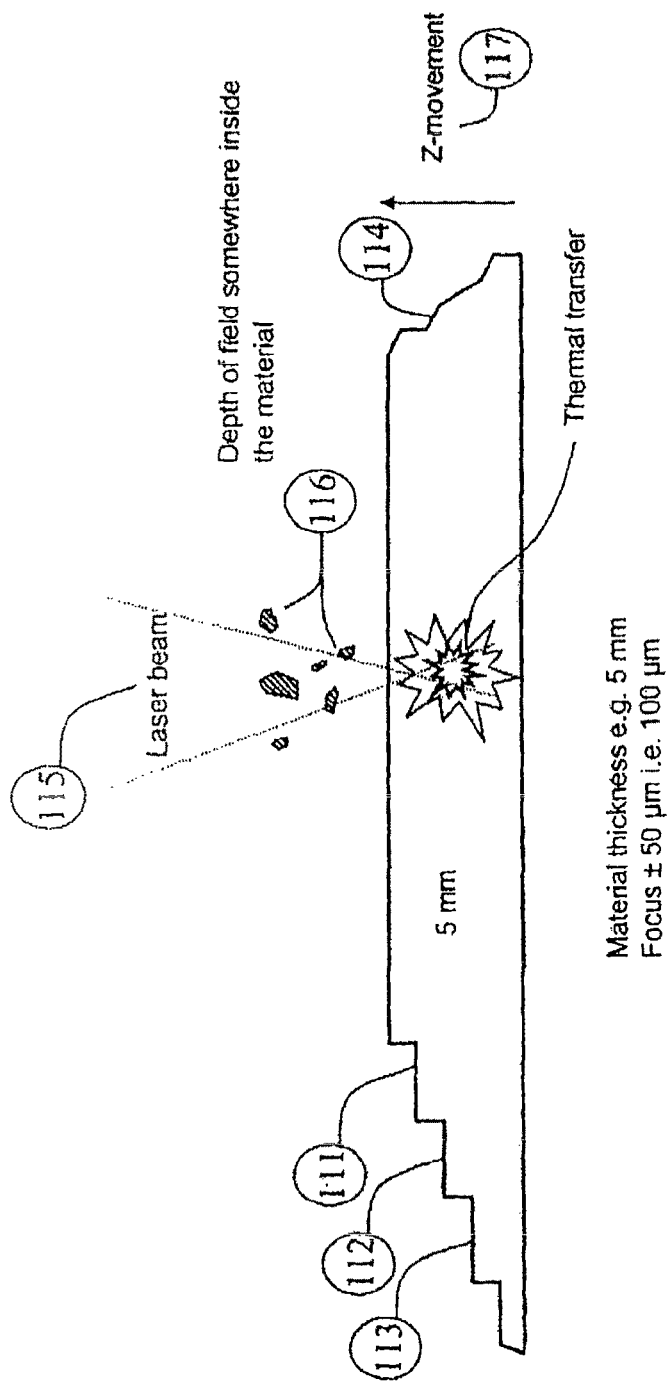

FIG. 67 illustrates a situation in accordance with the prior art, with the own marking and reference numbers locally used for referring the prior art references in the figure, and where the laser beam is out of focus and the resulting plasma thus has rather a low quality. The plasma which is released may also contain fragments 116 of the target. At the same time, the target material to be vaporized may be damaged to such an extent that it cannot be used anymore. This situation is typical in the prior art when using a material preform 114, a target, which is too thick. In order to keep the focus optimal, the material preform 114 should move 117, z movement, in the direction of incidence of the laser beam 111 for a distance equivalent to the extent to which the material preform 114 is consumed. Unsolved is, however, the problem that even if the material preform 114 could be brought into focus, the surface structure and composition of the material preform 114 already will have changed, the extent of the change being proportional to the amount of material vaporized off the target 114. The surface structure of a thick target according to the prior art will also change as it wears. For instance, if the target is a compound or an alloy, it is easy to see the problem.

In arrangements according to the prior art, a change in the focus of the laser beam in the middle of ablation, relative to the material to be vaporized, will immediately affect the quality of the plasma, because the energy density of the pulse on the surface of the material will (normally) decrease, whereby vaporization/generation of plasma is no longer complete. This results in low-energy plasma and unnecessarily large amounts of fragments/particles as well as a change in the surface morphology, and possible changes in the adhesion of the coating and/or coating thickness.

Attempts have been made to alleviate the problem by adjusting the focus. When in equipment according to the prior art the repetition frequency of the laser pulses is low, say below 200 kHz, and the scanning speed only 3 m/s or less, the speed of change of the intensity of plasma is low, whereby the equipment has time to react to the change of the intensity of plasma by adjusting the focus. A so-called realtime plasma intensity measurement system can be used when a) the quality of the surface and its uniformity are of no importance or b) when the scanning speed is low.

Then, according to the information available to the applicant at the priority date of the present application, it is not possible to produce high-quality plasma using prior-art technology. Thus quite many coatings cannot be manufactured as high-quality products in accordance with the prior art.

Systems according to the prior art include complex adjustment systems which must be used in them. In current known methods the material preform is usually in the form of a thick bar or sheet. A zoom focusing lens must be used or the material preform must be moved toward the laser beam as the material preform gets consumed. Even an attempt to implement this is already extremely difficult and expensive, if at all possible in a manner sufficiently reliable, and even then the quality varies greatly, whereby precise control is almost impossible, the manufacture of a thick preform is expensive and so on.

As publication U.S. Pat. No. 6,372,103 B1 teaches, current technology can direct the laser pulse to the ablation target only as either predominately S polarized or, alternatively, predominately P polarized or circularly polarized light, and not as random polarized light.

GENERAL DESCRIPTION OF EMBODIMENTS OF INVENTION

An object of the invention is to introduce a surface treatment apparatus by means of which it is possible to solve the problems associated with the prior art or at least to alleviate them. Another object of the invention is to introduce a method, an apparatus and/or an arrangement for coating an object more efficiently and with a better-quality surface than can be done using prior-art technology known at the priority date of the application. Another object of the invention is to produce high quality plasma from a target by turning the target material into plasma-phase, from an ablation area to a controlled ablation depth of the target, by the photon radiation used in the ablation. Yet another object of the invention is further to introduce a three-dimensional printing unit implementable through the technology of the surface treatment apparatus for coating an object repeatedly more efficiently and with a better-quality surface than can be done using prior-art technology known at the priority date of the application. The objects relate to the objectives in the following:

A first objective of the invention is to provide at least a new method and/or related means to solve a problem how to provide available such high quality, fine plasma practically from any target, so that the target material do not form into the plasma any particulate fragments either at all, i.e. the plasma is pure plasma, or the fragments, if exist, are rare and at least smaller in size than the ablation depth to which the plasma is generated by ablation from said target.

A second objective of the invention is to provide at least a new method and/or related means to solve a problem how, by releasing such a high quality fine plasma, to produce a fine cut-path in for such a cold-work method, that removes material from the target to said ablation depth, so that the target to be cold-worked accordingly keeps without any particulate fragments either at all, or the fragments if exist, are rare and at least smaller in size than the ablation depth to which the plasma is generated by ablation from said target.

A third objective of the invention is to provide at least a new method and/or related means to solve how to coat a substrate area to be coated with the fine plasma without particulate fragments larger in size than the ablation depth to which the plasma is generated by ablation from said target, i.e. to coat substrates with pure plasma originating to practically any material.

A fourth objective of the invention is to provide a good adhesion of the coating to the substrate by said fine plasma, so that wasting the kinetic energy to particulate fragments is suppressed by limiting the existence of the particulate fragments or their size smaller than said ablation depth. Simultaneously, the particulate fragments because of their lacking existence in significant manner, they do not form cool surfaces that could influence on the homogeneity of the plasma plume via nucleation and condensation related phenomena. In addition, in accordance with the fourth objective, the radiation energy in the ablation event is transformed to the kinetic energy of the plasma effectively by minimizing the heat affected zone by using preferably short pulses of the radiation pulses, i.e. in the picosecond range or shorter pulses in time duration, with a pitch between two successive pulses.

A fifth objective of the invention is to provide at least a new method and/or related means to solve a problem how to provide a broad scanning width simultaneously with fine plasma quality and broad coating width even for large bodies in industrial manner.

A sixth objective of the invention is to provide at least a new method and/or related means to solve a problem how to provide a high repetition rate to be used to provide industrial scale applications in accordance with at least one of the objectives of the invention mentioned above.

A seventh objective of the invention is to provide at least a new method and/or related means to solve a problem how to provide fine plasma for coating of surfaces to manufacture products according to at least one of the objectives, first to sixth, but still save target material to be used in the coating phases producing same quality coatings/thin films where needed.

An further objective of the invention is to use such method and means according to at least one of the objectives said first, second, third, fourth and/or fifth objectives to solve a problem how to cold-work and/or coat surfaces for such products of each type in accordance with the objects.

A method, to produce fine plasma according to an embodiment of the invention in accordance of the above mentioned objectives of the fine plasma, is characterized in that what has been said in the characterizing part of an independent method claim directed to a method to produce fine plasma. A cold-work method, according to an embodiment of the invention in accordance of the above mentioned objectives of the fine plasma, is characterized in that what has been stated in the characterizing part of an independent method claim directed to a cold-work method. A coating method, according to an embodiment of the invention in accordance of the above mentioned objectives of the fine plasma, is characterized in that what has been stated in the characterizing part of an independent method claim directed to a coating method. A vacuum vaporization/ablation arrangement, according to an embodiment of the invention in accordance of the above mentioned objectives of the fine plasma, is characterized in that the what has been stated in an independent claim directed to a vacuum vaporization/ablation arrangement. A surface processing method, according to an embodiment of the invention in accordance of the above mentioned objectives of the fine plasma, is characterized in that what has been stated in the characterizing part of an independent method claim directed to a surface processing method. Use of a coating method according to an embodiment of the invention in accordance of the above mentioned objectives is characterized by that what has been said in an independent use claim directed to a use of a coating method.

Other embodiments of the invention are shown in the dependent claims.

According to an embodiment of the invention in alignment of the objects and the objectives, the controlling of the ablation depth is achieved by adjusting the spot size of the photon radiation on the ablation area to correspond the desired ablation depth with photon radiation fluence that exceeds the ablation threshold to the ablation depth.

According to an embodiment of the invention, such a fine plasma generation leaves the target smooth and clean of fragments in the cold-work method according to an embodiment of the invention, which is advantageous especially when the product to be manufactured is directly the target piece with the so cold-worked surface features. When used for coatings such generation of the fine plasma produces smooth and clean coated surface on the substrate from the plasma phase.

According to an embodiment of the invention, such a photon radiation is used that is directed in pulsed form from its source to the ablation target via an optical path that comprises a turbine scanner which is arranged to scan said photon radiation pulses on to a spot in the ablation area on the target body. According to an embodiment of the invention the ablation depth is smaller than the spot size from which the ablation is about occur within such pulses that have duration which is essentially the same or smaller than the relaxation time of the dominating thermal energy transference mechanism of the target material, in the layer of the target area to be ablated to the ablation depth. According to an embodiment of the invention the pulse duration can be alternatively longer than said relaxation time, provided that there is another mechanism and/or an effect present in the ablation area that prevents the heat affected zone below the ablation depth to form large.

According to an embodiment of the invention, the objectives can be used to define a plasma quality classification for a fine plasma concept.

According to an embodiment of the invention, selecting the radiation pulses short, and the intermediate pitch longer than the relaxation time of the thermal energy transference by the local mechanism in the spot, the surface material composition and/or structure specific energy transference mechanism is so at least partly kept disabled, to conduct the thermal energy deeper into the substrate body so minimizing the heat affected zone (HAZ) beneath the ablation depth in such application that the working depth is the ablation depth. Thus the thermal energy of the radiation used in the ablation is significantly concentrated on the layer on the substrate to the ablation depth effectively, consequently so preserving the structures of the substrate from thermal shocks and/or tension to form and so also disables an important phenomena of fragmentation.

As the fragmentation on the substrate surface due to the thermal tensions were making the surface bumpy or uneven in a more or less randomly or otherwise in an uncontrolled way in a known techniques, the fine plasma production made according to objects of the invention once from a first substrate spot leaves quite smooth surface behind, without fragment originating bumps and/or recesses, so enables the use of the same spot again for a fine plasma production.

In relation to the embodiments of the invention spot has been used to refer to an area that is illuminated by the radiation to be used for the ablation, but without any intention to limit the shape of the spot to any conic section specifically. So, the spot can be in one embodiment round, circular, elliptic or conical, but in another embodiment a line shaped, or a rectangular. According to a further embodiment of the invention the spot can be considered as an ensemble of sub-spots that do not over lap. According to an embodiment of the invention the spot comprises a diffraction pattern to be used for ablation in such sub-spots on which the ablation threshold is exceeded.

In most cases psychedelic, ameba-shaped, star-like spots or sub-spots may be if not totally impossible, difficult to be obtained by one radiation beam or without combining several radiation beams having different shapes. However, in certain cases it may be advantageous to use shaplone or template to have the desired spot shape in certain embodiments, for instance in decorations etc., made according to the aspects of the invention. Of course, provided that the shaplone or template tolerate the radiation used in the ablation of the substrate longer than the time for the working time of the substrate to the desired depth and/or layer thickness.

According to an embodiment, template can be used so that the target material is layered onto a template substrate that is radiation transparent material wave guide, but arranged so that when the substrate to be coated is put onto the template substrate and the ablation radiation inputted into the template substrate, the ablation can be made essentially in contact with the substrate.

Thus, in macroscopic scale such an ablation lithography can be used, provided that the template substrate tolerates the radiation power feed through. Instead of a single flash techniques of total area of the template substrate, the template substrate can be illuminated in multiple spots in series and/or in parallel so to ablate the target onto the substrate to be coated. For instance hologram making can benefit from such techniques. According to an embodiment, holographic resists can be made to be further used as forms to formulate a piece that has the opposite morphology to be used as another kind of hologram, as a lattice hologram.

According to another embodiment of the invention single flash can be advantageous in micro- or nano-structure manufacturing. The target material can be layered onto a pin in the scale of the micro- or nano-structure, which pin is used as a template substrate with the target. When the pin gets the radiation to the ablation, the target ablates, and the resulting plume hits the target so that the substrate to be coated gets coated.

According to an embodiment of the invention such pins may be used in series and/or in parallel in a certain way as needles in needle matrix writer in several decades ago. According to an embodiment of the invention, the pins can be reused to be coated for a next target coat. If several pins are in use or groups in pins so to alter their coating and the substrate coating, a micro- or nano machining of surfaces can be achieved. Of course, some pins or a group can be left without target coating to be used for carving the micro-structure. The near contact conditions in micro- or nano-scale application may be preferred to the contact because of strong adhesive forces. However, the distances between a pin and the substrate can be monitored and/or adjusted by for instance an AFM-microscope, manually or according to an embodiment of the invention automatically, for an pre-defined lithographic routine.

According to an embodiment of the invention plasma is classified according to its quality.

The plasma quality for a particular coating application depends also on the plasma constituent and/or their properties as well as on the substrate on which the plasma is supposed to adhere.

According to an embodiment of the invention the plasma is classified to five classes according to the gained adhesion (a) relative to the best theoretical adhesion of the set plasma and substrate pair. For instance, into the first class plasma can be counted such plasma that yield on the substrate the adhesion from 100 to 80% of the maximum, to the second class such plasma that yield 80-60% of the maximum etc. so that in the fifth class there is plasma that yield 20-0% of the maximum adhesion between the coating and substrate. The division is only an example, and other division lines can be used for the adhesion classification of the plasma.

According to another embodiment of the invention the plasma itself can be classified according to its property of freedom from particles. For instance in the following exemplary way: The plasma is classified in to five classes according to the particle content (p) so that in class 1 there is pure plasma that do not comprise particles larger than the plasma constituents in plasma phase at all, in class 2 only such particle whose size ratio is $10^7$-$10^5$, in class 3 such particle that has the size ratio $10^5$-$10^3$, in class 4 such particle that has the size ratio $10^3$-10, in class 5 such particle that has the size ratio 10-$10^{-1}$. The size ratio means the ratio of the beam spot characteristic spot size to the particle characteristic size. The division to classes is only an example, and other division lines can be used in classification of the plasma.

According to another embodiment of the invention the target surface itself that remains after the ablation can be classified according to its smoothness ratio (s). Smoothness ratio means the beam spot characteristic spot size to the ratio of the surface formation characteristic height/depth. For instance in the following exemplary way: The target smoothness is classified in to five classes according to the heights/depths (s) so that in class 1 there is no measurable heights in the detection limit at all, in class 2 only such surface formations whose size ratio is $10^7$-$10^5$, in class 3 only such surface formations whose size ratio is $10^5$-$10^3$, in class 4 only such surface formations whose size ratio is $10^3$-10, in class 5 only such surface formations whose size ratio is 10-$10^{-1}$. The division is only an example, and other division category lining can be used for the adhesion classification of the plasma.

According to an embodiment, (a,p,s)-classification can be used for comparing several plasmas at least in fixed conditions, may be with a tolerable accuracy between two or more identical conditions. Such components as the a, p and s can be used to classify also the devices and/or the systems having involvement to the coating in accordance of the embodiments via the significance of the respective contribution to the plasma generation. According to the embodiments of the invention, the most desired plasma production according to the (a,p,s)-classification may be, in the light above examples, as (1,1-2,1) or (1,1-2,2) for a fine plasma, however, not limiting only to the mentioned.

According to another embodiment, the fine plasma is defined according to the coating/work thickness, that is, the expected smoothness of the surface for the purpose of utilization of the surface as treated in respect to the coating smoothness. The smoothness can be defined as indicated within the target-related classification, for example, so that the coated surface smoothness is classified in to five classes according to the heights/depths (s) so that in class 1 there is no measurable heights in the detection limit at all, in class 2 dominantly characterized by such surface formations whose size ratio is $10^7$-$10^5$, in class 3 dominantly characterized by such surface formations whose size ratio is $10^5$-$10^3$, in class 4 dominantly characterized by such surface formations whose size ratio is $10^3$-10, in class 5 dominantly characterized by such surface formations whose size ratio is 10-$10^{-1}$. Thus, as if used such a criteria alone, this would mean with the exemplified division, that the plasma could be classified to fine plasma according to an embodiment of the invention when the expected smoothness of the coating is same or better than the smoothness of the surface for the purpose as coated, i.e. in certain cases even class 5 would lead to fine plasma classification. Thus, in the (a,p,s)-classification as above, it is not shown with the surface smoothness classification parametrization. However, for the surface smoothness in a certain application, the classification can be application specific, so yielding a division that is better informative of the coating event as such for the surface for the particular use.

A skilled man in the art knows when read and understood the plasma classification concept as shown above, that for each of the class-parameter a, p and/or s, the components, that are shown in linear scale can be expressed in logarithmic scale, whose base can be 2, e, or 10 or another number. Although the scales for each scale parameter uses an order of magnitude, also an opposite kind of order of magnitude can be used. The order of the magnitude is not limited to mere logarithm or linear scale, for the class division to be achieved. Also inverted parameters may be used. a, p, and s that now can be divided in different ways. As in the example above, there is the linear scale. The example is five step classification, but even less classes or more classes can be used for certain coarser or finer classification of fine plasma concept for particular application related to surface processing.

According to an embodiment of the invention the target and the radiation source is moved in respect to each other. According to another embodiment there is a scanner to scan the beam of the radiation source to form an ablation spot on the target to move in respect on the target surface.

Radiation source arrangement as embodied according to the invention comprises a path of radiation transference, arranged to guide radiation beam as pulsed high-power radiation, with a turbine scanner in said path from the radiation source to the target.

According to an embodiment of the invention, the radiation source arrangement comprises a radiation source arranged to produce radiation and an optical path arranged to direct said radiation into the working target without transference through external optical fibres or external optical high-power connectors, so to achieve the aim of the invention.

Various embodiments of the invention are combinable in suitable part.

When read and understood the invention, the skilled men in the art may know many ways to modify the shown embodiments of the invention, however, without leaving the scope of the invention, which is not limited only to the shown embodiments which are shown as examples of the embodiments of the invention.

It is an astonishing observation, that a radiation beam can be actually directed to the working target without the transference fibre and/or optical high-power connectors. In this context "without" should be read so that for instance an optical expander is not so excluded where such a component is absolutely necessary in such embodiments, in which the expander is not integrated into the radiation source, but is needed at radiation-source end to modify the radiation beam geometry and/or to join various radiation sources for a joint beam.

According to an embodiment of the invention, the optical path, for radiation transference comprises a scanner, which comprises according to a preferred embodiment of the invention at least a turbine scanner. According to an embodiment of the invention the optical path for radiation transference comprises an optical expander at a radiation-source end of the optical path. According to an embodiment of the invention the optical path for radiation transference comprises an optical contractor at a working target end of the optical path.

According to an embodiment of the invention the radiation source comprises an optical expander as integrated into the radiation source. According to an embodiment of the invention the optical path comprises a focusing system at the radiation source end and/or at the working target end of the optical path. According to an embodiment of the invention the optical path comprises joining means arranged to join several beams of radiation-sources into a joint radiation beam. According to an embodiment of the invention the joining means is arranged to join radiation beams in pulses in a certain phase.

According to an embodiment of the invention the radiation source arrangement comprises a first radiation source that has a first repetition rate and a second radiation source that has a second repetition rate, said radiation sources being connected with a joining member according to an embodiment of the invention so that the pulses of said first and second radiation sources are interlaced according to one embodiment variation, but at least partially non-interlaced according to another embodiment variation. Interlacing of the pulses can thus influence on the received power of the target, and can be used for optimizing the preparation for the target material and/or the vaporization/ablation. According to an embodiment of the invention a joining member is arrange to comprise means for joining at least two or more radiation sources together.

According to an embodiment of the invention each radiation source has several aspects of the radiation source so that at least one mode of radiation to be emitted when energized, said radiation has a wave length, polarization and/or pulse length and pulse shape as well as inter-pulse length in time. Each radiation source has also repetition rate of the pulses as a further aspect. According to an embodiment of the invention such a joining member to group individual radiation sources is arranged so that all the radiation sources were equal in said aspects. According to an embodiment of the invention such a joining member is arranged to be such that all the radiation sources were different in at least one aspect of the radiation source, which is not necessary the same for each jointed radiation sources.

According to an embodiment of the invention the radiation source arrangement comprises different radiation sources, with different aspects, jointed together with a joining member in order to be used to shape up the pulses experienced at the working target, so to optimize the pulse shape, total energy at the working target and/or to prepare the working target at the hit spot. According to one embodiment, an individual laser source is arranged to act as a radiation source with a first aspect and another laser source as a radiation source with a second aspect. According to an embodiment said first aspect is optimized for preparing the target by heating it before and/or during the ablation by the radiation with said second aspect optimized for the ablation in the related conditions. According to an embodiment of the invention a radiation source is arranged to prepare the target material and/or a part of it for ablation.

According to an embodiment of the invention the radiation-sources of the radiation source arrangement are diversified so that the actual radiation beam is formed at the working target. According to an embodiment of the invention the each radiation source has its own optical path according to the embodiment of the invention, preferably comprising a turbine scanner in each path.

The joining member can be arranged to operate as an expander as a separate component to join the radiation sources, or the expander can be arranged to be integrated into one radiation source so that the other radiation sources can join into the joining member. According to an embodiment of the invention the joining member is partly diversified between the radiation sources so that certain parts of the joining member are integrated into the radiation source and some other parts are not.

According to an embodiment of the invention concerning the radiation source arrangement radiation sources of the arrangement are arranged into a radiation source device. According to an embodiment the optical path according to an embodiment of the invention or parts of it are comprised by the device. According to an embodiment of the invention the in-vacuum-vaporization/ablation device comprises a radiation source arrangement according to an embodiment of the invention and/or optical path according to an embodiment of the invention.

A path of radiation transference for guiding electromagnetic radiation according to an embodiment of the invention comprises a turbine scanner arranged to guide said electromagnetic radiation, in a radiation geometry, from the radiation source to the target of the radiation transferred as pulsed high-power radiation, for example laser beam pulses.

A radiation source arrangement according to an embodiment of the invention, comprises at least one or several diode-pumped radiation sources and that each radiation source has an optical path according to an embodiment of the invention. A radiation source arrangement according to an embodiment of the invention comprises a first feature and/or a second feature, which is at least one of the following:
(i) the wavelength characteristic to the radiation source,
(ii) on-duty pulse length,
(iii) length of off-duty period between two successive pulses,
(iv) repetition rate of the on-duty occurrences,
(v) radiation intensity,
(vi) energy and/or power per pulse,
(vii) polarization of the radiation, and
a combination of at least two or more of the features (i)-(vii).

According to an embodiment of the invention said first feature is different than said second feature. According to an embodiment said feature is considered as an aspect of a radiation source.

A radiation source arrangement according to an embodiment of the invention has at least one radiation source which is arranged to produce radiation having a wave length in range which wave length is at least one of the following:
wavelength between a radio wavelength and an infrared wavelength,
wavelength in infrared,
wavelength of visible light,
wavelength of ultraviolet, and
wave length of X-rays According to one embodiment of the invention the optical path is arranged to comprise at least one path for plurality of radiation sources comprising at least one radiation source arranged to direct at least one radiation beam to a plurality of targets comprising at least one target.

According to an embodiment of the invention the radiation is laser-radiation. According to an embodiment of the invention, the laser is diode pumped. According to an embodiment of the invention the laser is light bulb pumped. According to an embodiment of the invention the laser is pumped by another laser. According to an embodiment of the invention the laser is pumped by pulsed radiation. According to an embodiment of the invention the laser is pumped by a techniques that is known as such, form another use for instance. A target material according to an embodiment of the invention is arranged to be vaporizable and/or ablatable by a radiation of a radiation source according to an embodiment of the invention.

a vacuum vaporization/ablation arrangement according to an embodiment of the invention comprises a radiation source arrangement according to an embodiment of the invention, said arrangement arranged to vaporize/ablate material from a target to be used in coating of a substrate.

A target material unit according to an embodiment of the invention comprises a first reel arranged to release target material in one end of the film path and a second reel arranged to roll the released target material in the opposite end of the film path.

A target material unit according to an embodiment of the invention comprises means to handle target material as sheets. In such an embodiment of the invention the target material unit has means to select a sheet of target material from a target material stack and/or from a plurality of stacks comprising at least one type of target material. In such an embodiment of the invention the target material unit has means to remove a used sheet of target material from a feeder of the target material unit into a stack of used sheets according to its type into a plurality of stacks arranged to comprise at least one type of target material.

In accordance of at least one of the objectives mentioned above, the first aspect of the invention defines an ensemble of embodiments of the invention comprising at least an embodiment of the invention, but so that the embodiment is utilised for a coating-like actions, wherein material from a target is vaporized/ablated as a directable plume onto a substrate to be coated, so that it is the substrate or a derivable from that which forms the product. Also method related to the product, use of the product and/or use of the precursor for manufacturing such a product are considered to be comprised into the first aspect.

In accordance of at least one of the objectives mentioned above, the second aspect of the invention defines an ensemble of embodiments of the invention comprising at least an embodiment of the invention, but so that the embodiment is utilised for a carving-like actions, wherein material from a target is vaporized/ablated as a directable plume, so that it is the target or a derivable from that which forms the product. Also method related to the product, use of the product and/or use of the precursor for manufacturing such a product are considered to be comprised into the second aspect. In to the scope of second aspect belongs thus such embodiments, in which a particular target material is not available, but a surface of a body is exposed to the carving like action.

In accordance of at least one of the objectives mentioned above, the third aspect of the invention defines an ensemble of embodiments of the invention comprising at least an embodiment of the invention, but as a combination of the first aspect and/or the second aspect, in suitable part.

In theory, utilisation of embodiments of the invention so facilitates increasing the radiation power at the target without limitations, but provide also means to adjust several aspects of the radiation at the working target to match to the appropriate aspect of the invention. Thus this can be made by using one or several diode-pumped radiation sources as a radiation source for the radiation to be guided by an optical path, comprising a turbine scanner, to the working target, essentially without fibre-caused losses in an external optical path.

Embodiments of the invention according to the first aspect, second aspect or third aspect of the invention can be used to produce textured surface with coating to make catalytic surfaces, and/or biological or medical applications.

When read and understood the invention, the skilled men in the art may know many ways to modify the shown embodiments of the invention, however, without leaving the scope of the invention, which is not limited only to the shown embodiments, which are however shown as examples of the embodiments of the invention in a non-restrictive manner.

FIGURES

Figure 62:
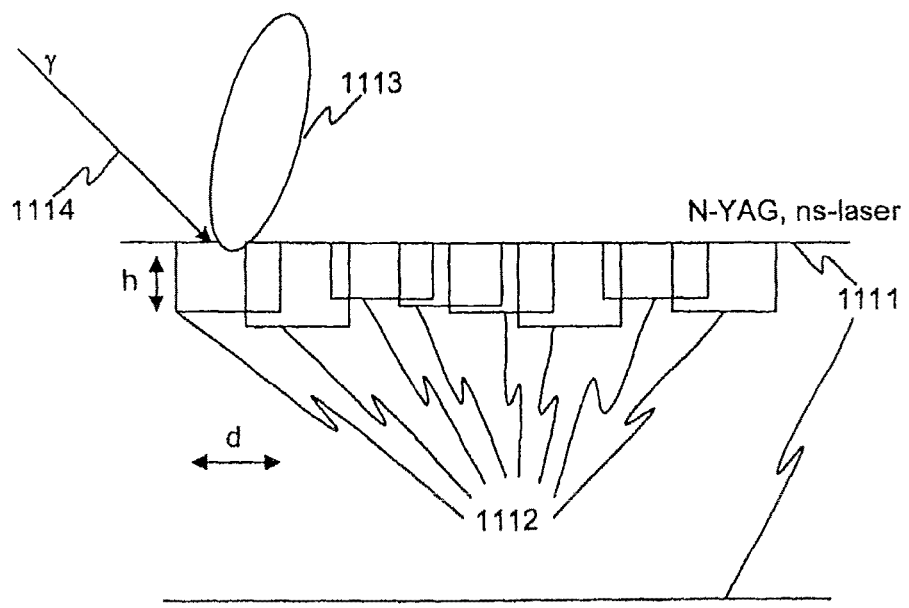
Figure 63:
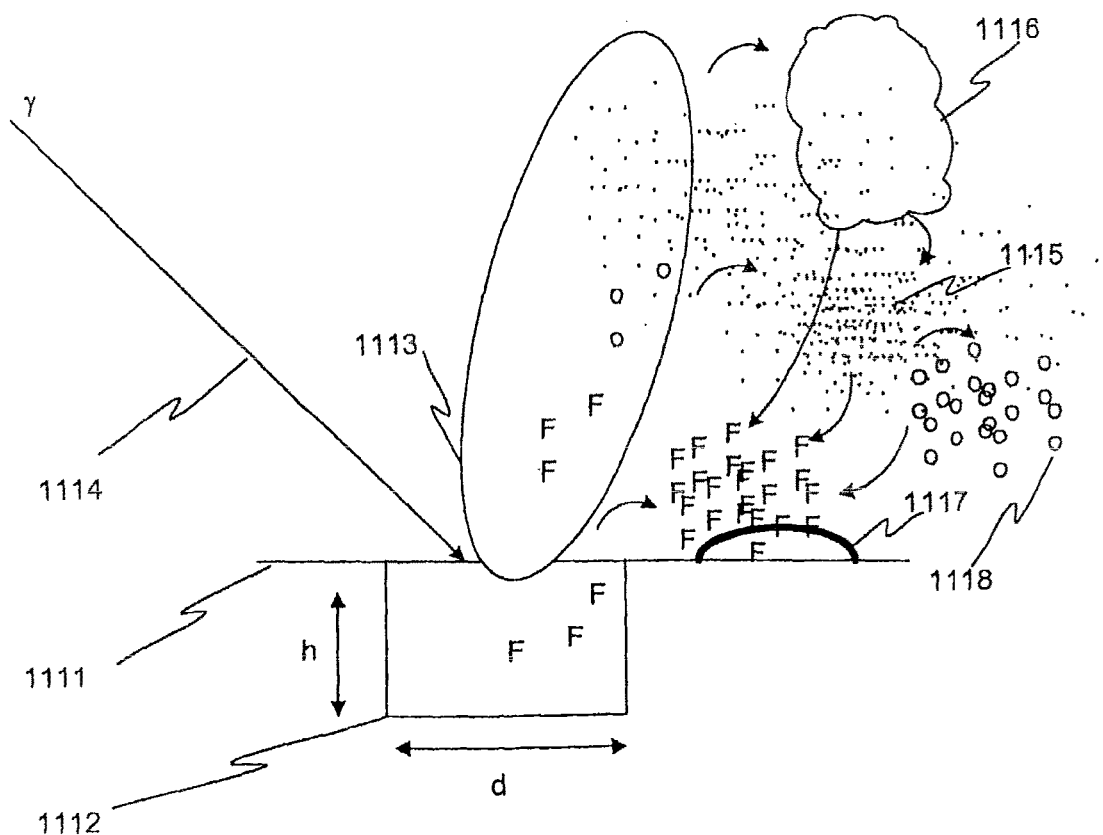
Figure 64:
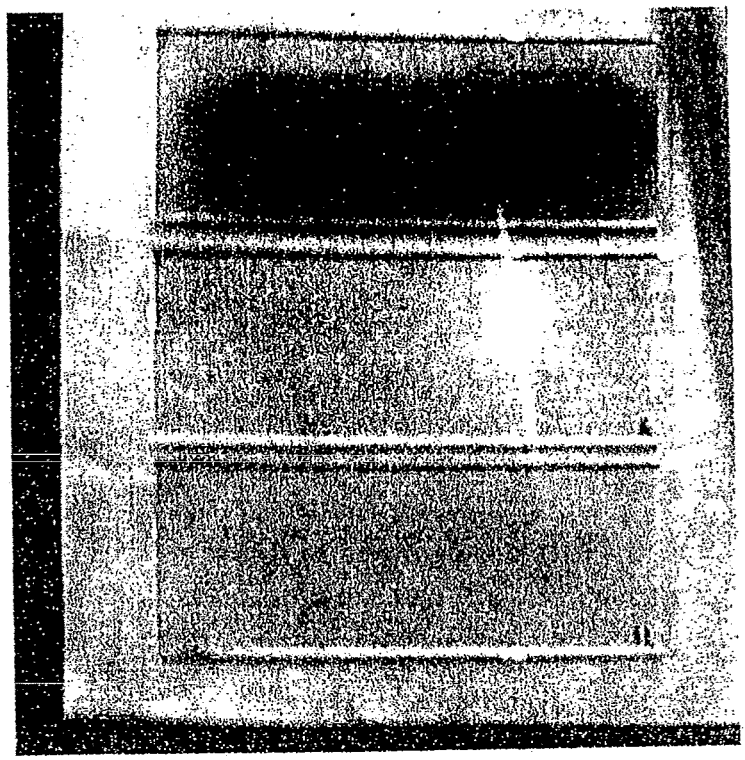
Figure 65:
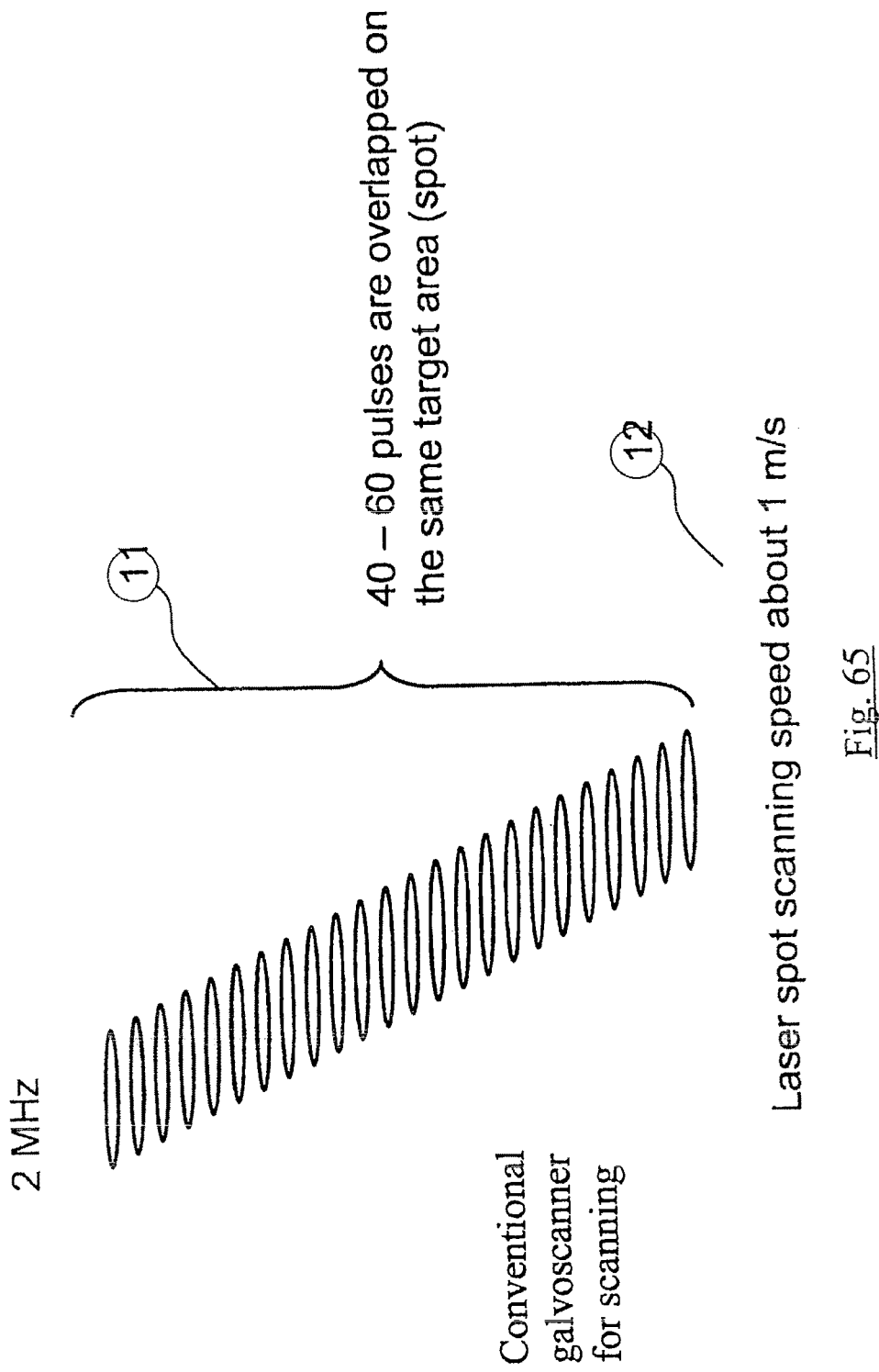
Figure 66:
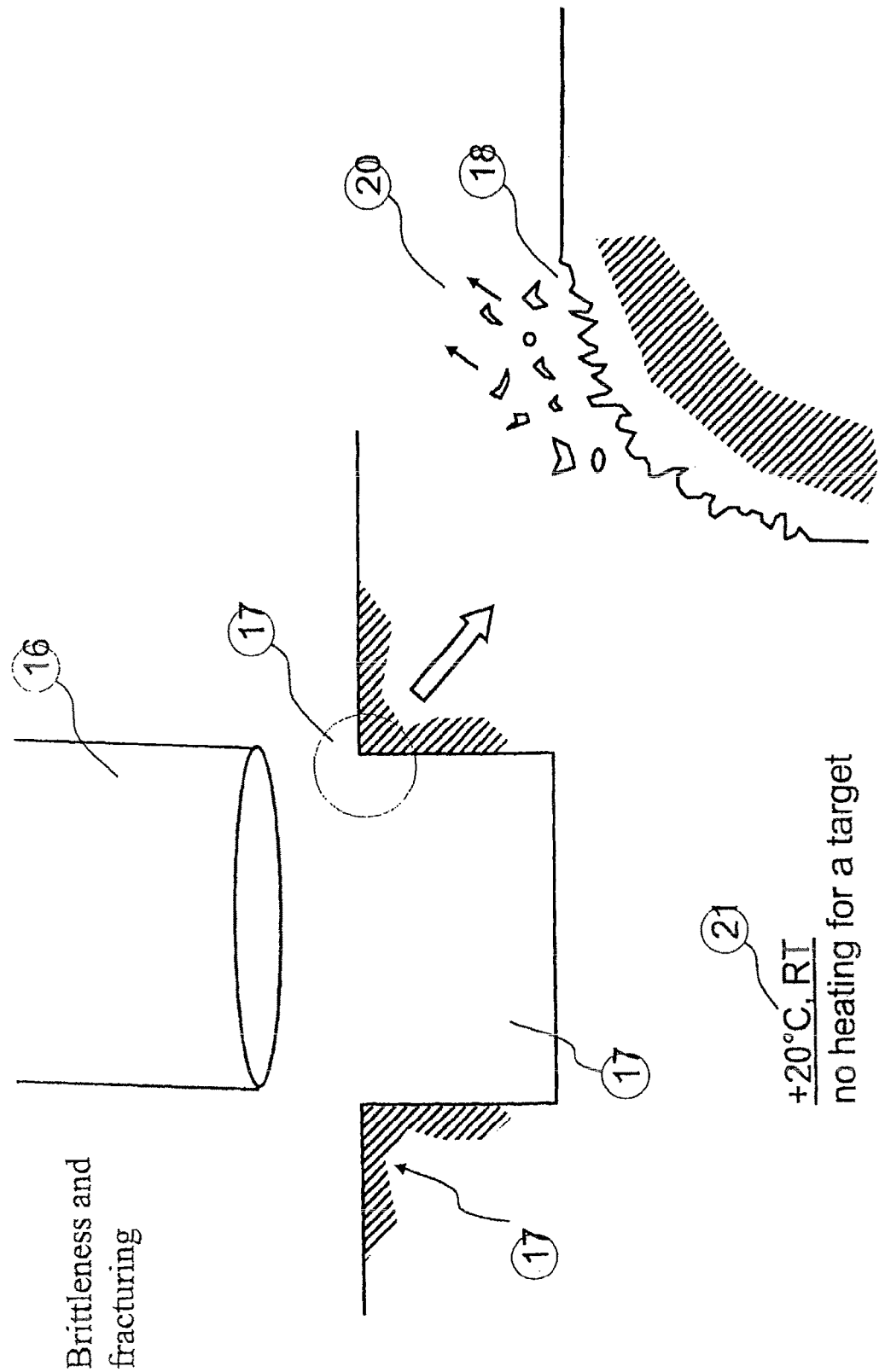

FIG. 62, Illustrate known art problems
FIG. 63 Illustrate known art problems FIG. 64 Illustrate known art problems, FIG. 65 Illustrates a problem in a known art, FIG. 66 Illustrates a problem in a known art, FIG. 67 Illustrates a situation that can occur in accordance with the prior art Because the FIGS. 62-67 illustrate known art, embodiments of the invention are described in the following via reference to the following figures (Fig) so giving examples on the embodiments of the invention. The figures are appended to the application to comprise a part of the description. The term comprise has been used in an open manner, if otherwise is not specifically indicated.

Figure 2:
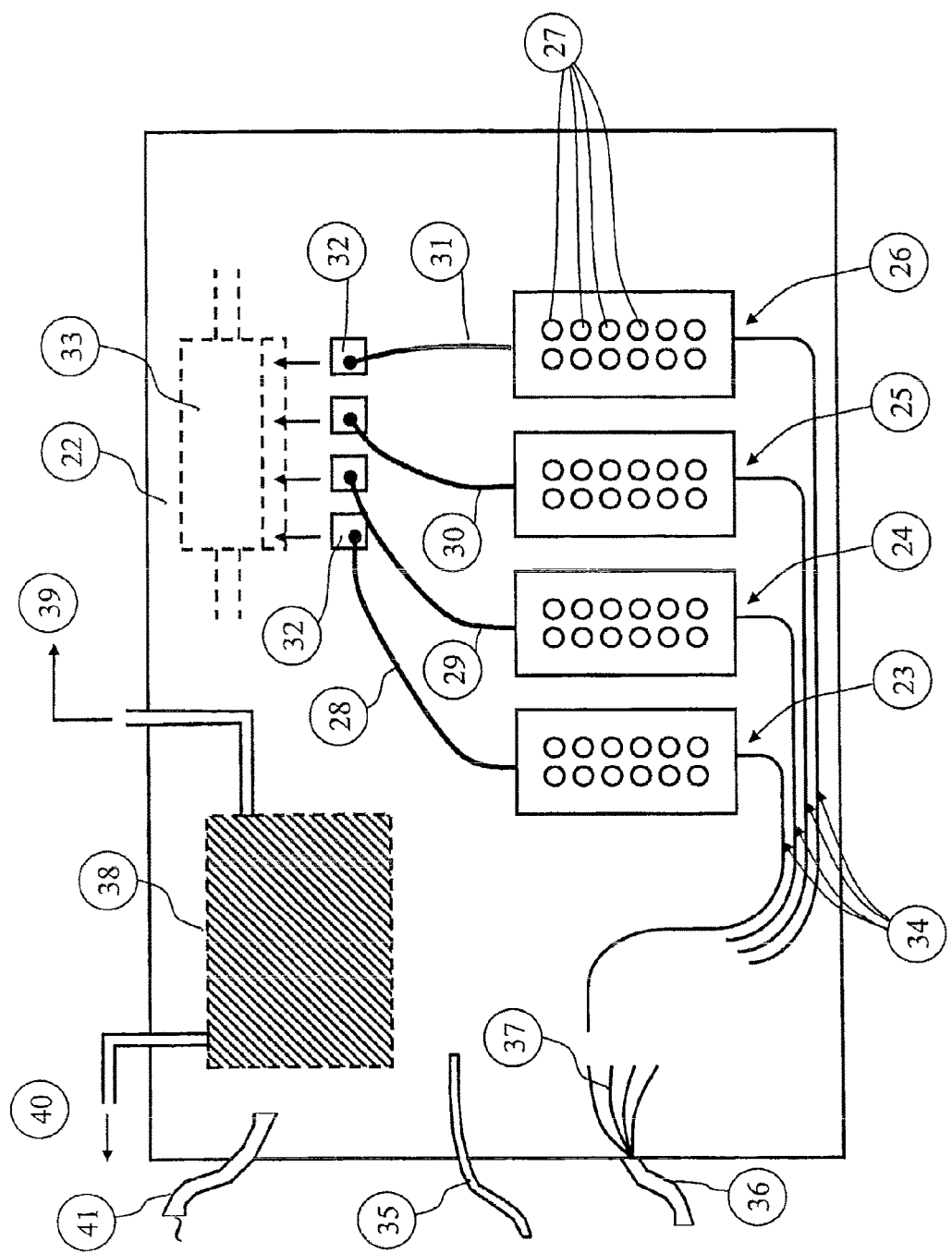
Figure 3:
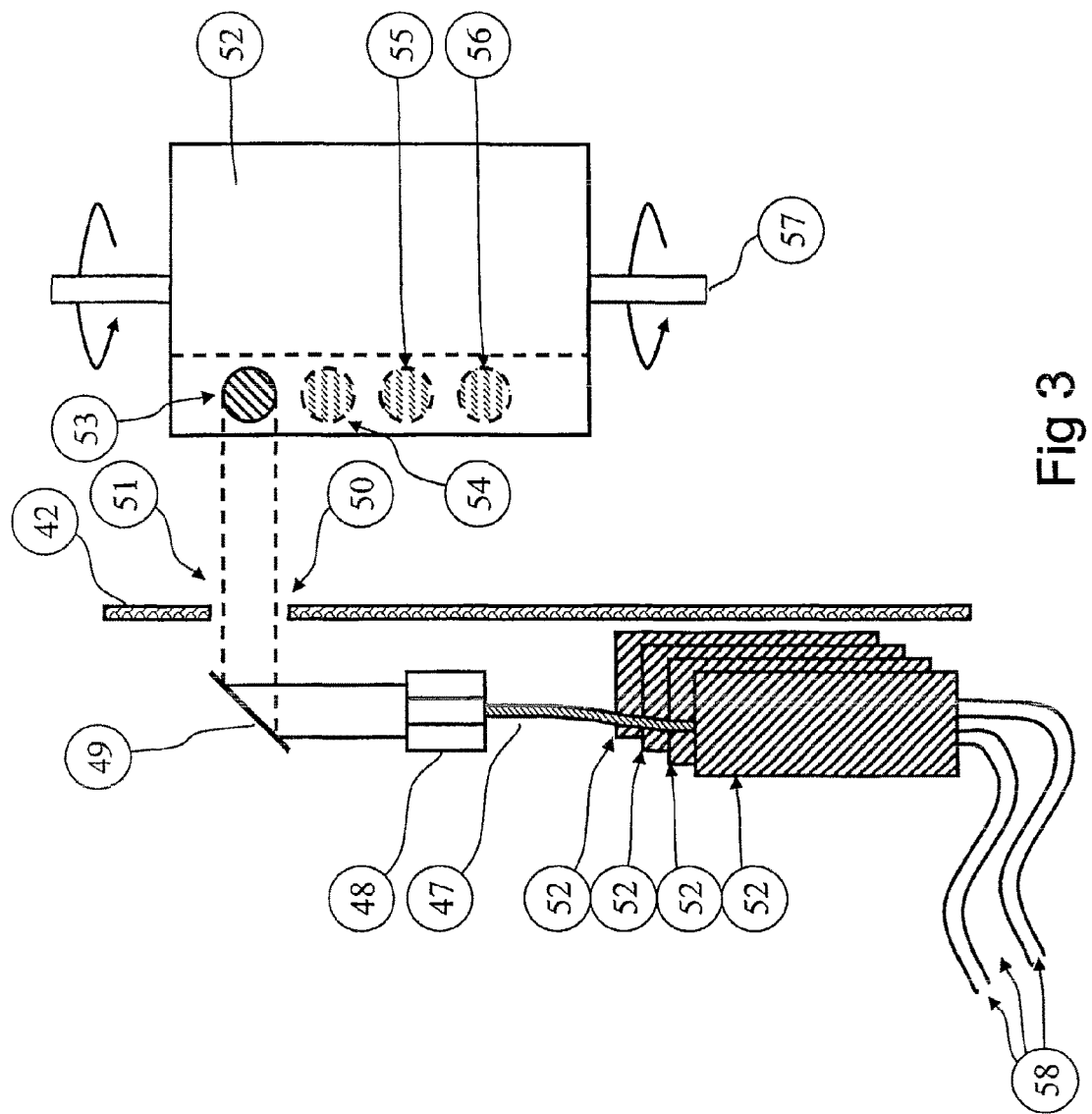
Figure 4:
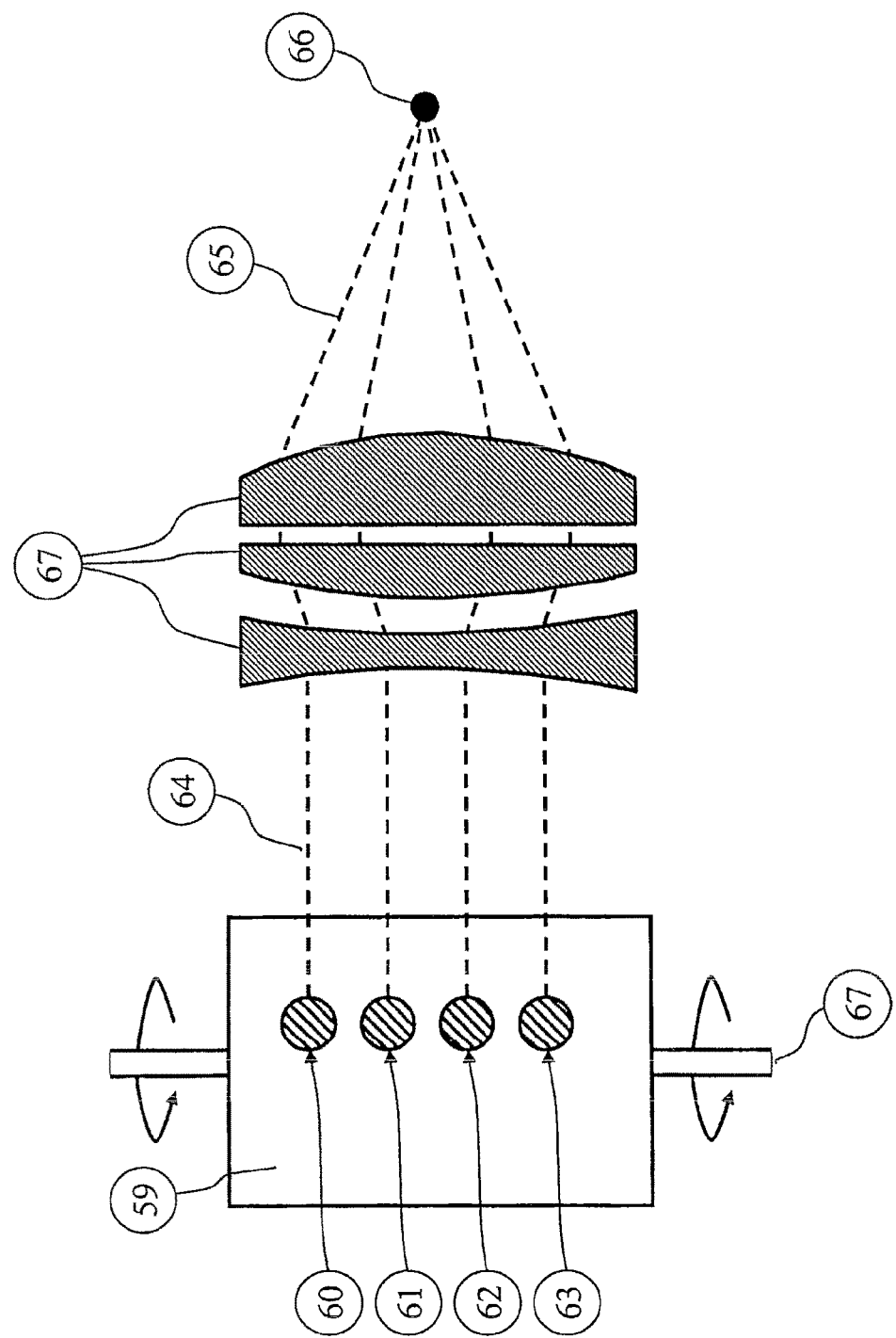
Figure 5:
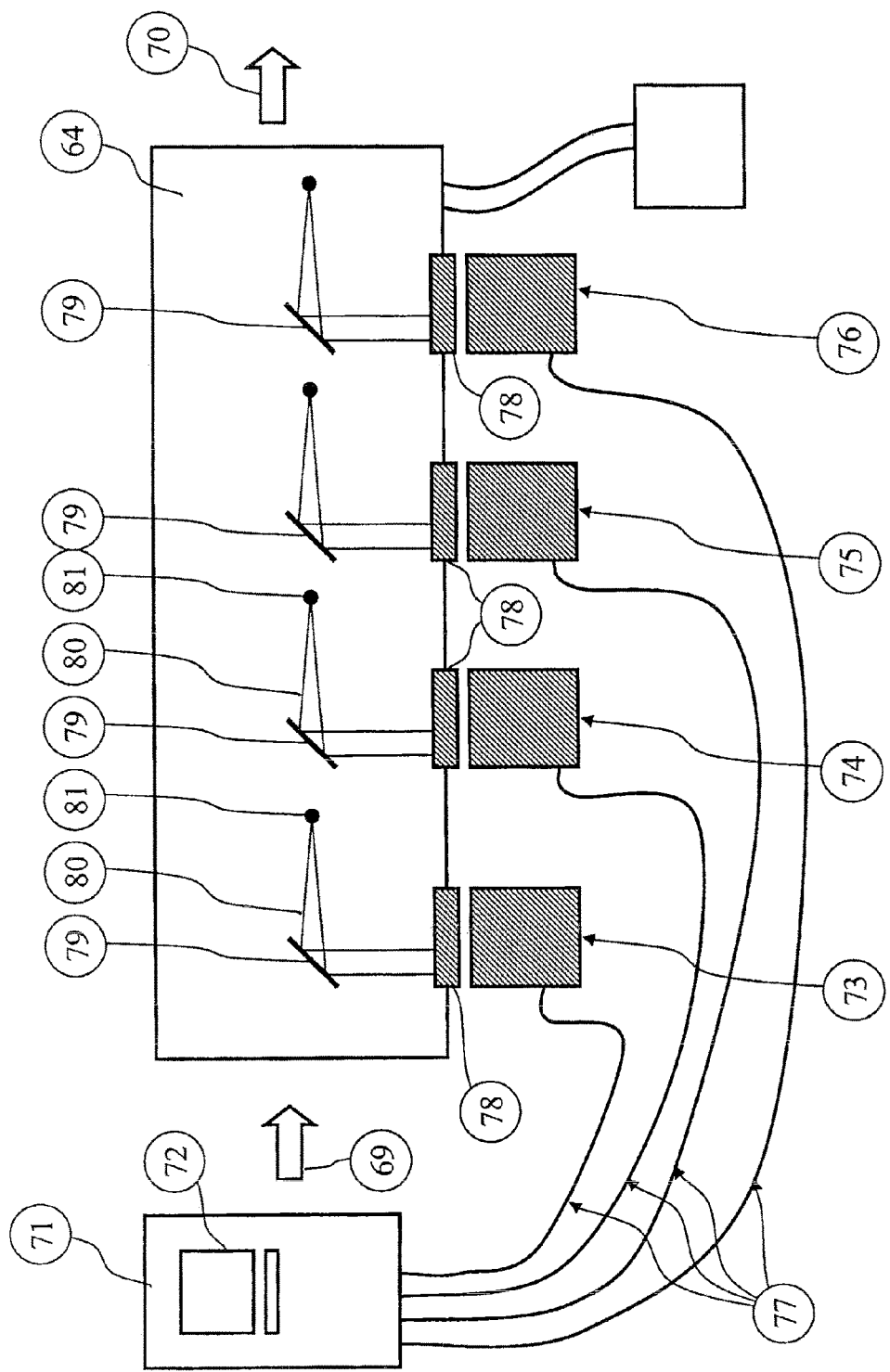
Figure 6:
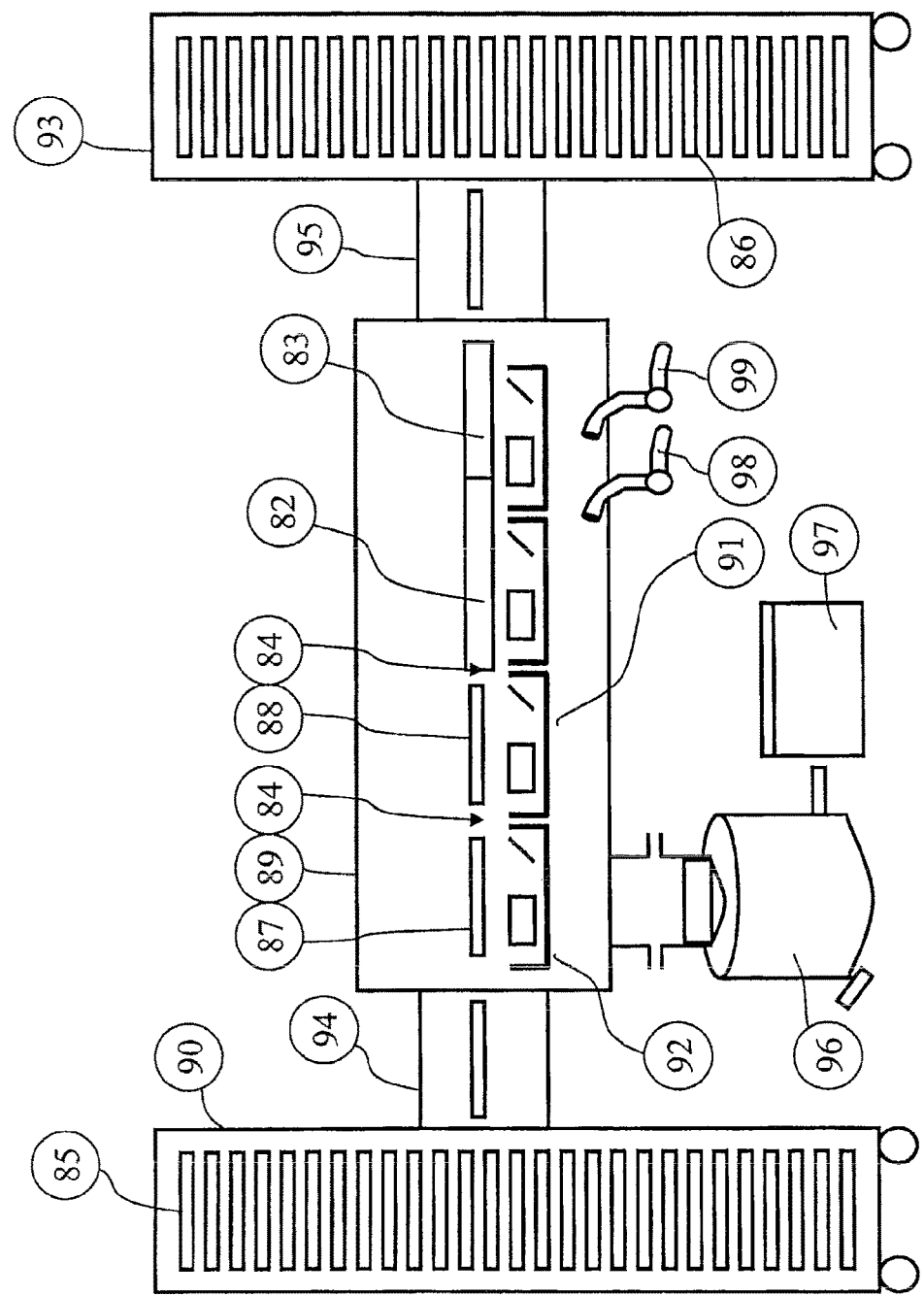
Figure 7:
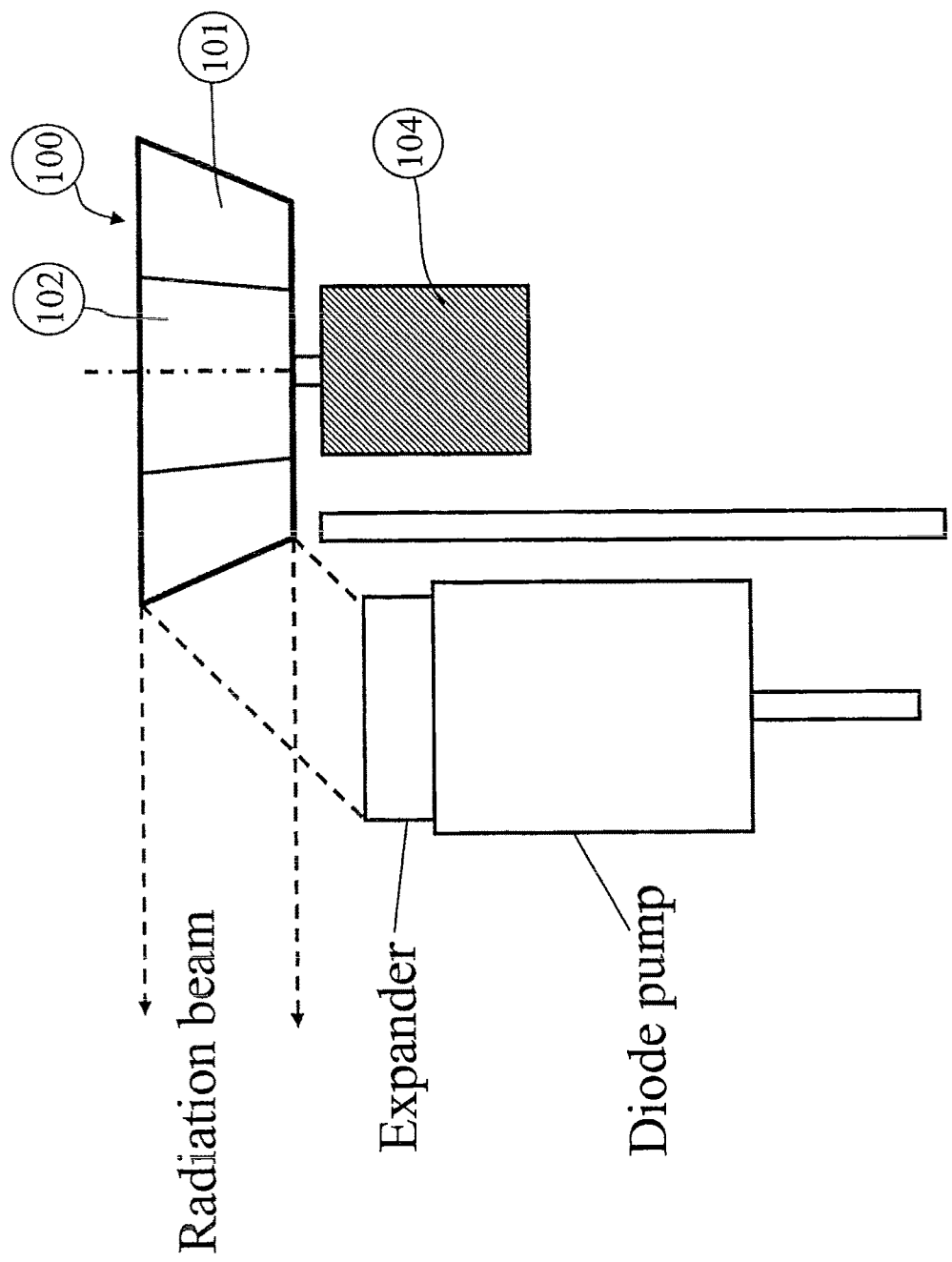
Figure 8:
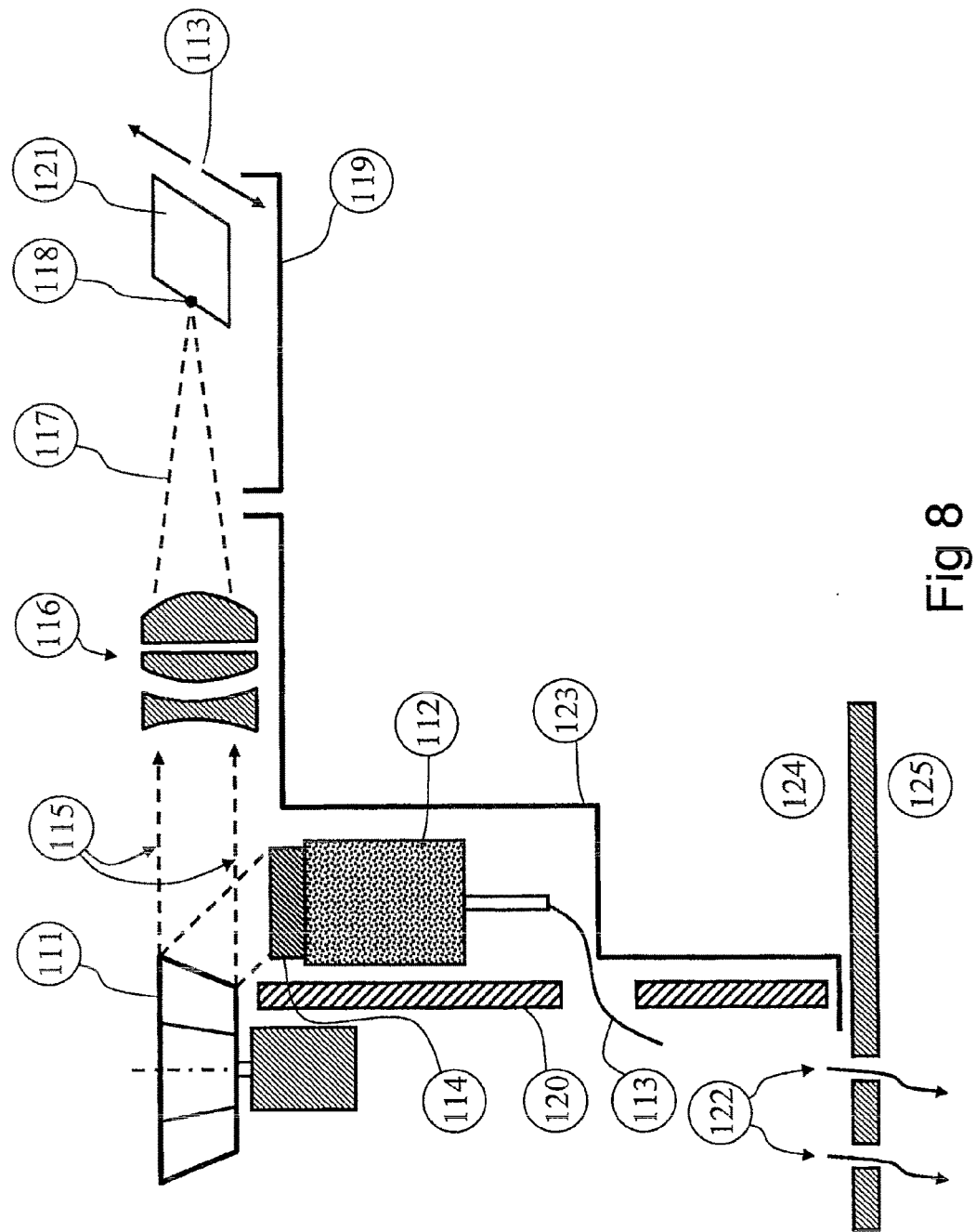
Figure 9:
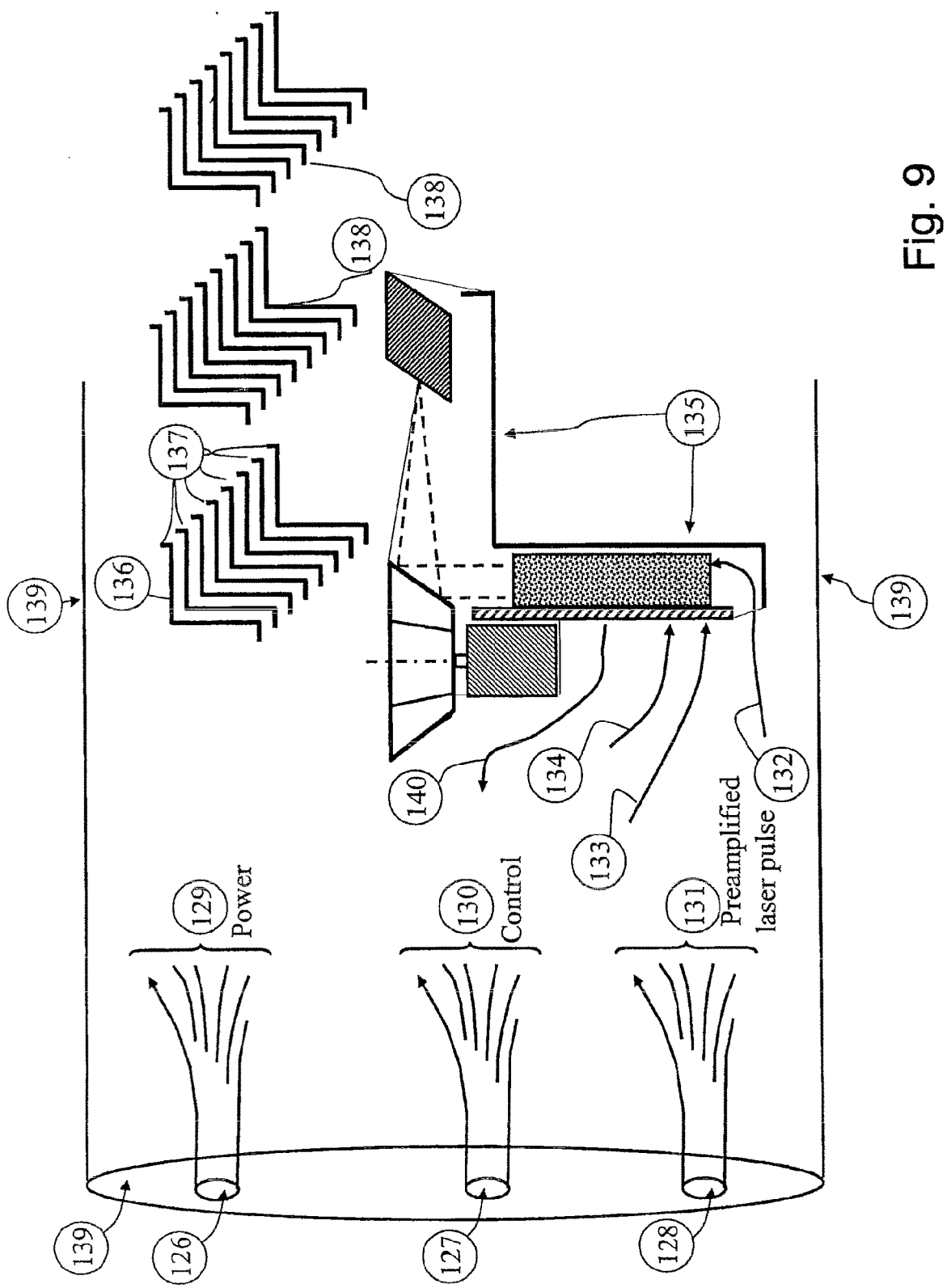
Figure 10:
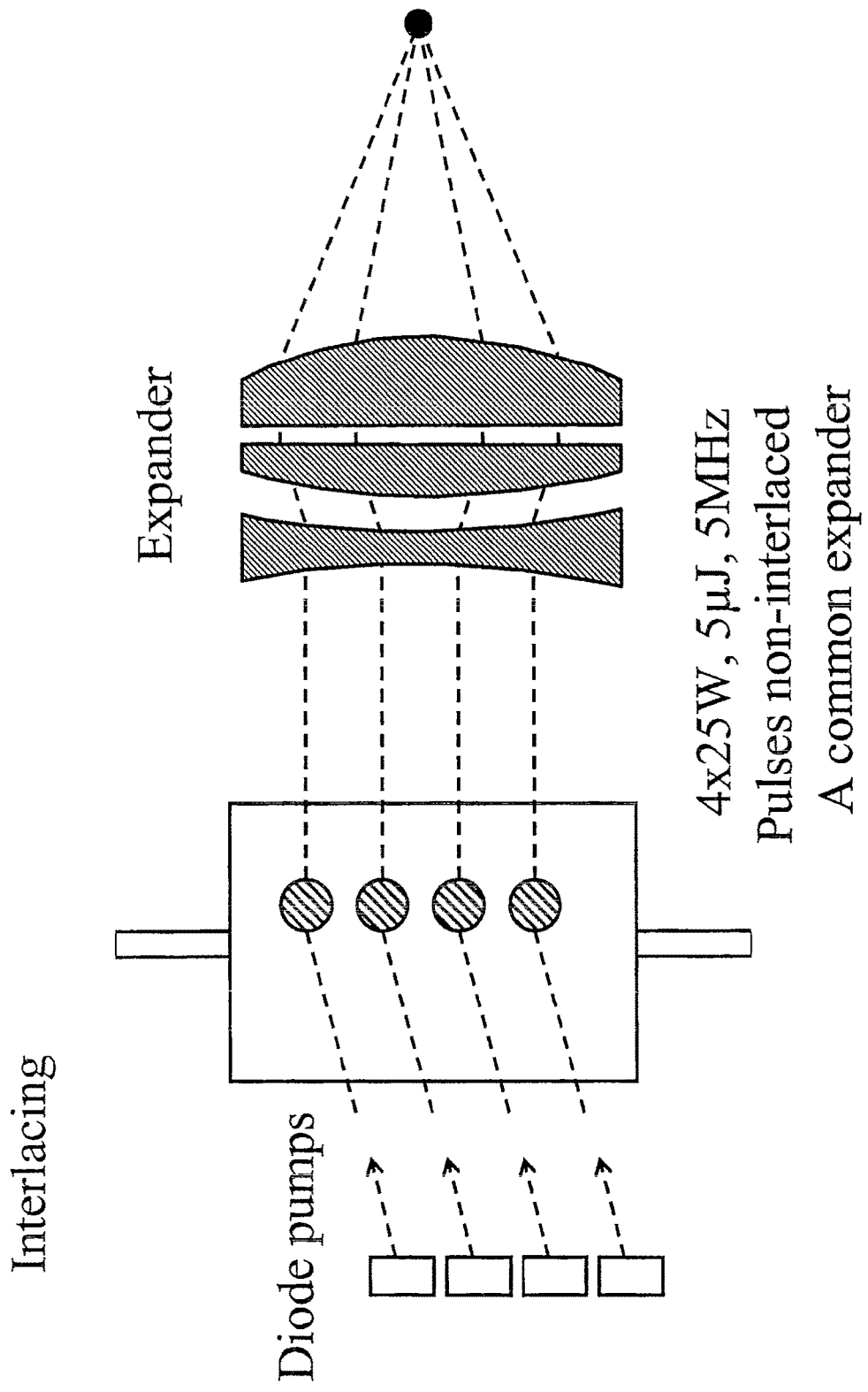
Figure 11:
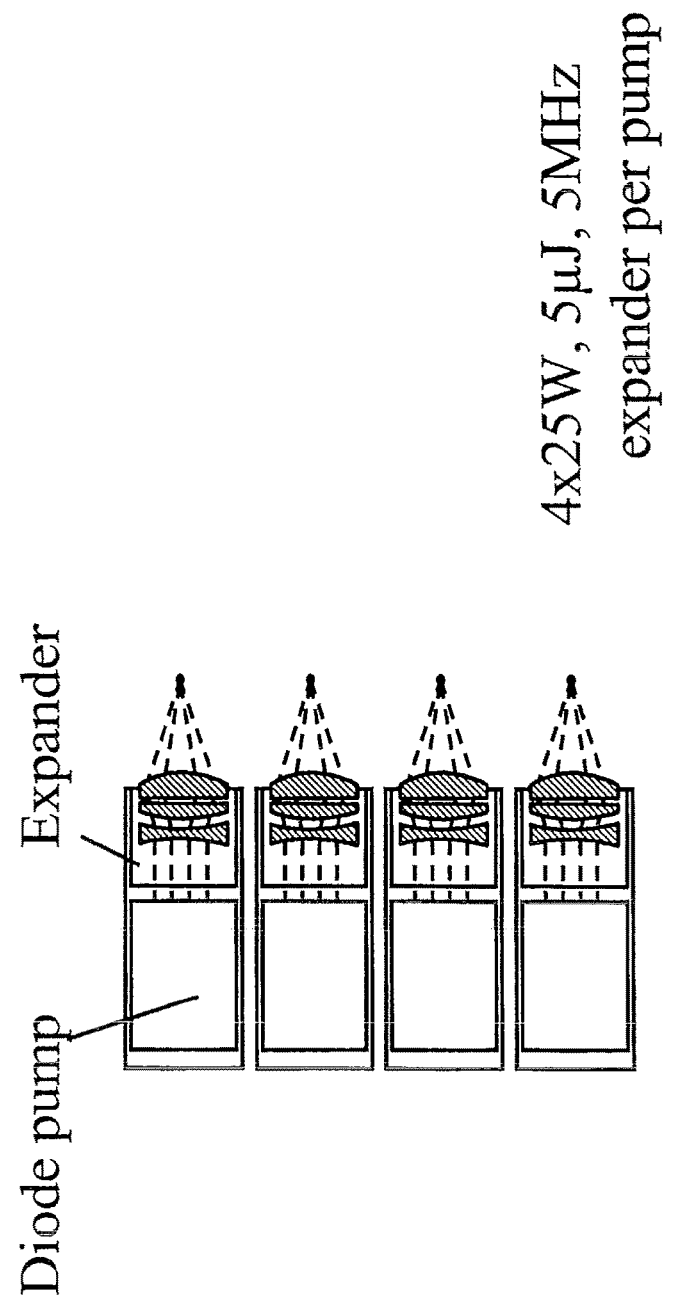
Figure 12:
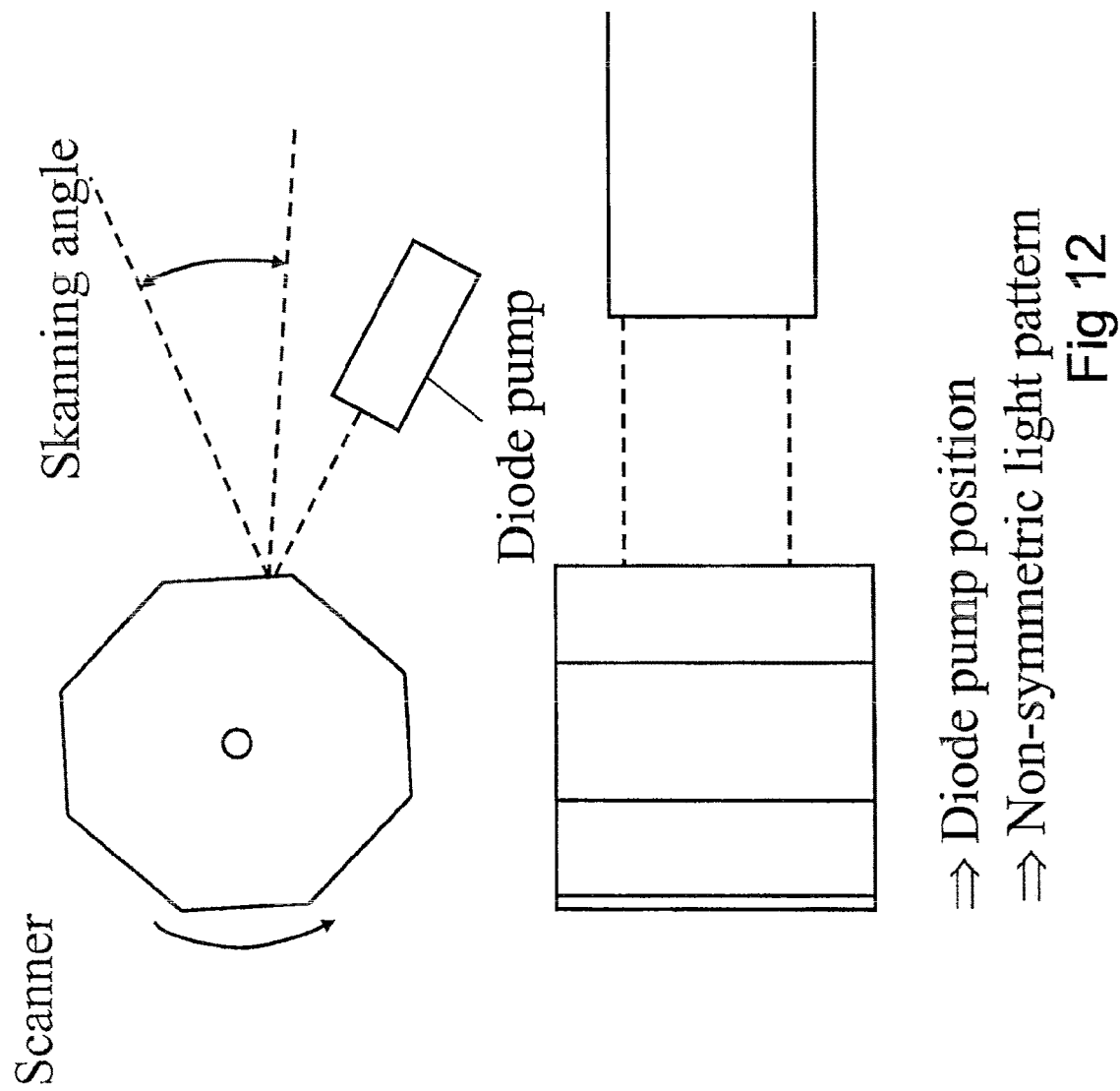
Figure 13:
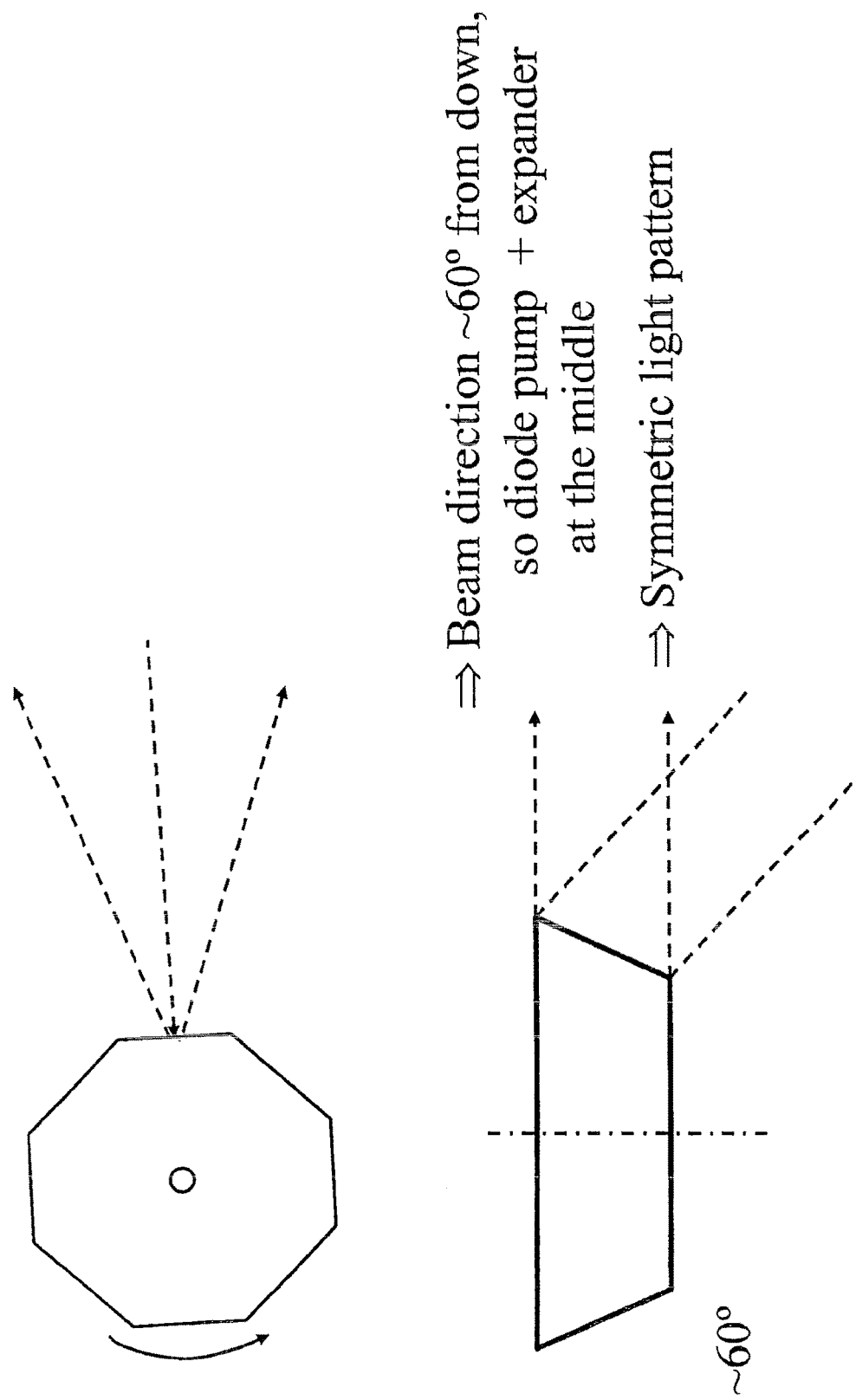
Figure 14:
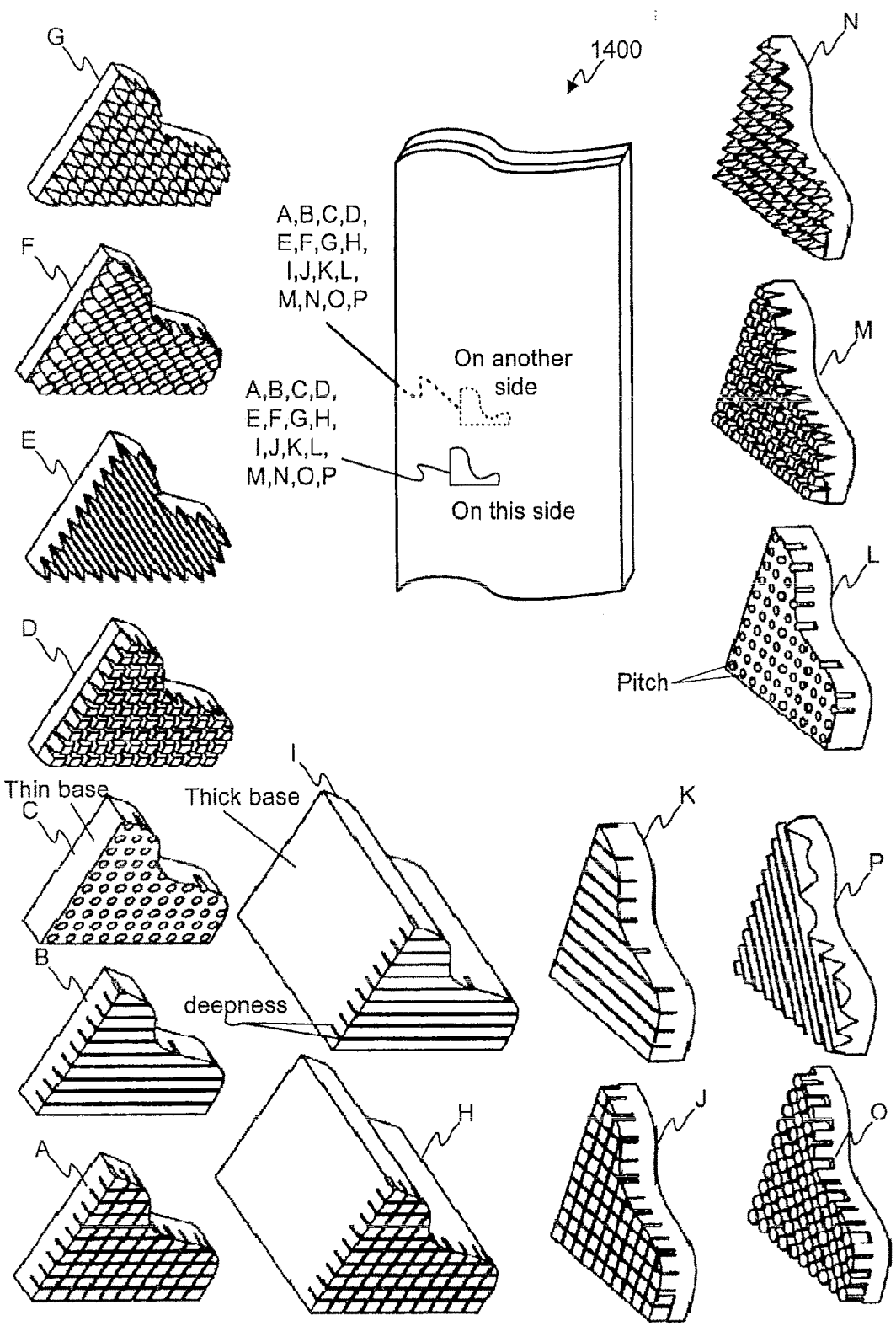
Figure 15:
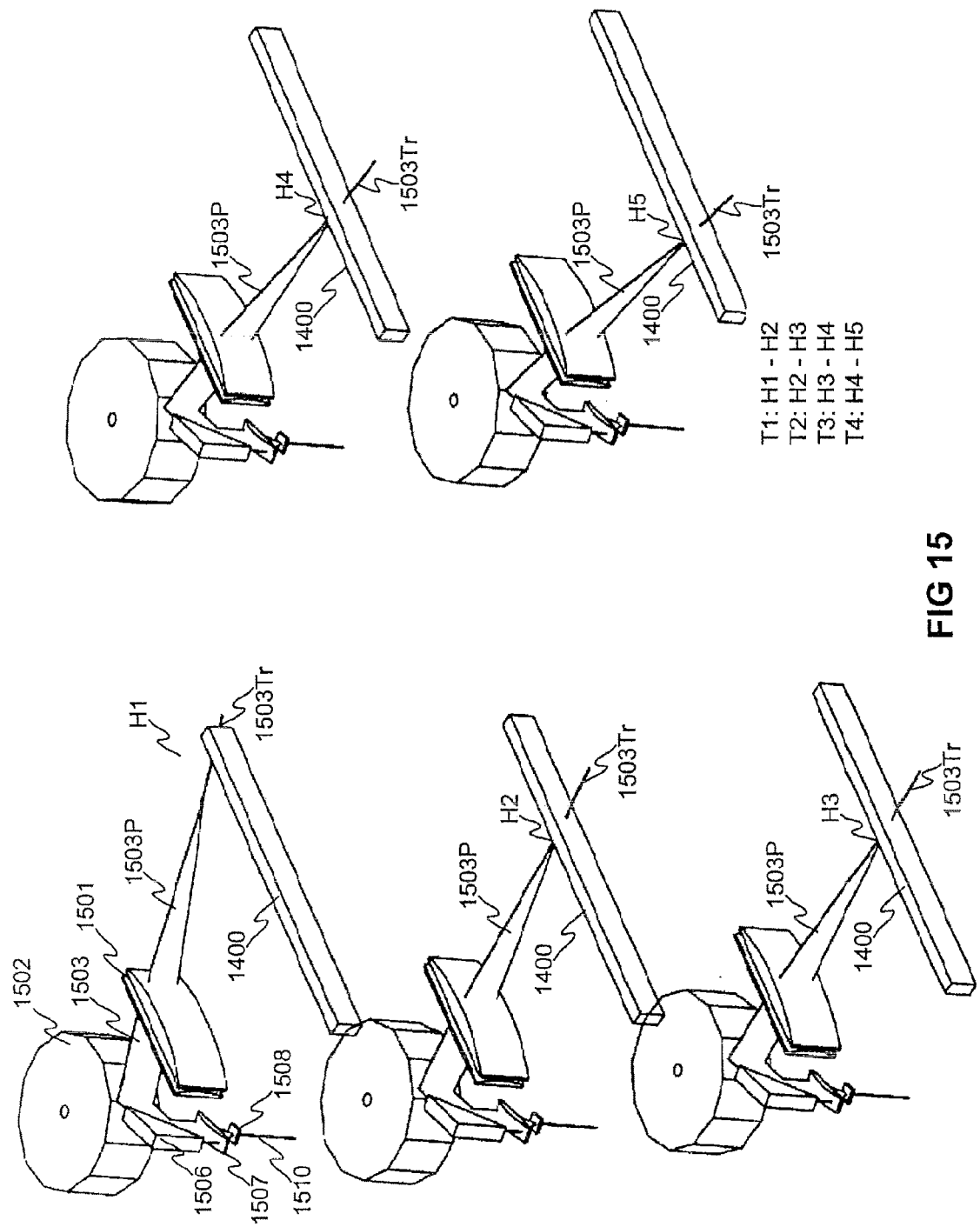
Figure 16:
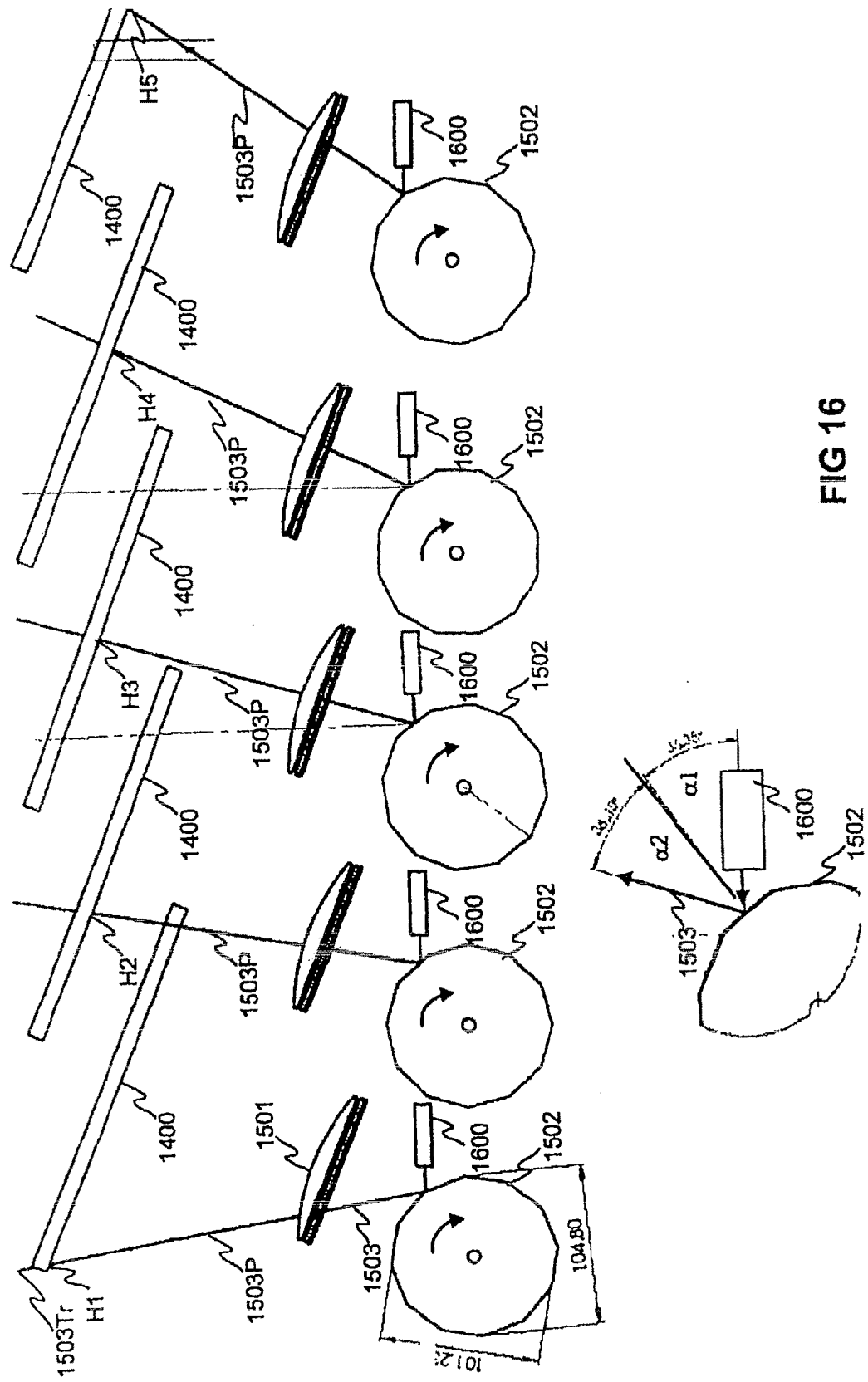
Figure 18:
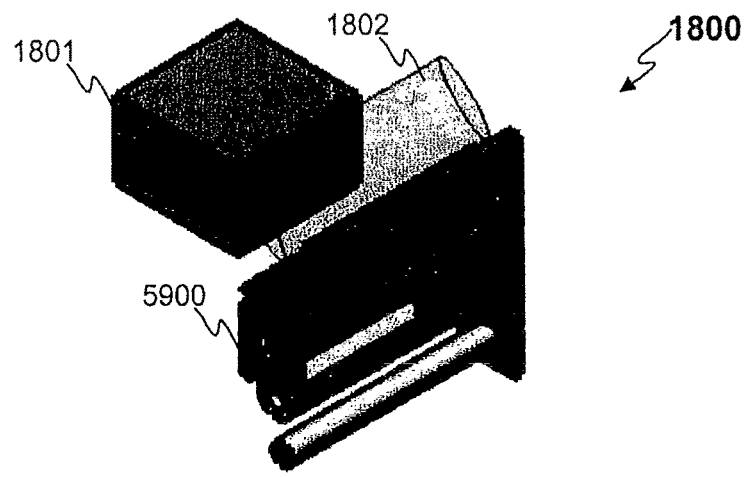
Figure 19:
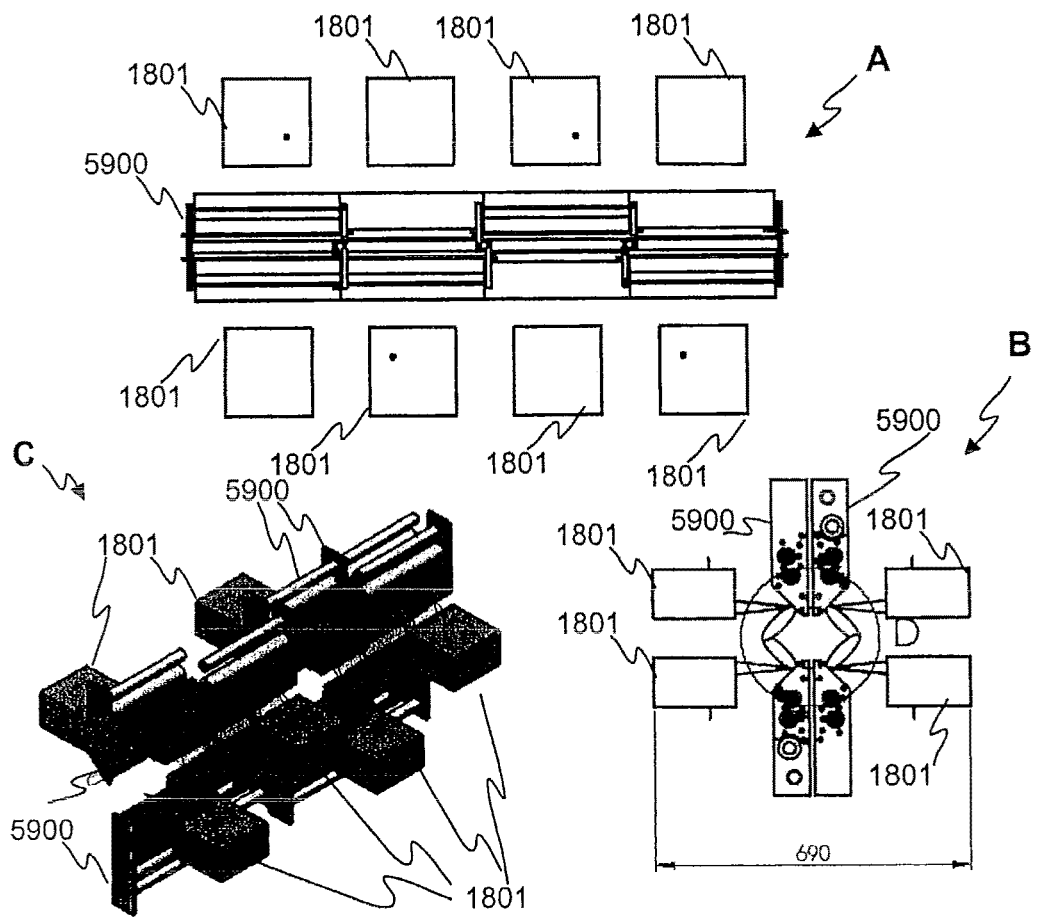
Figure 20:
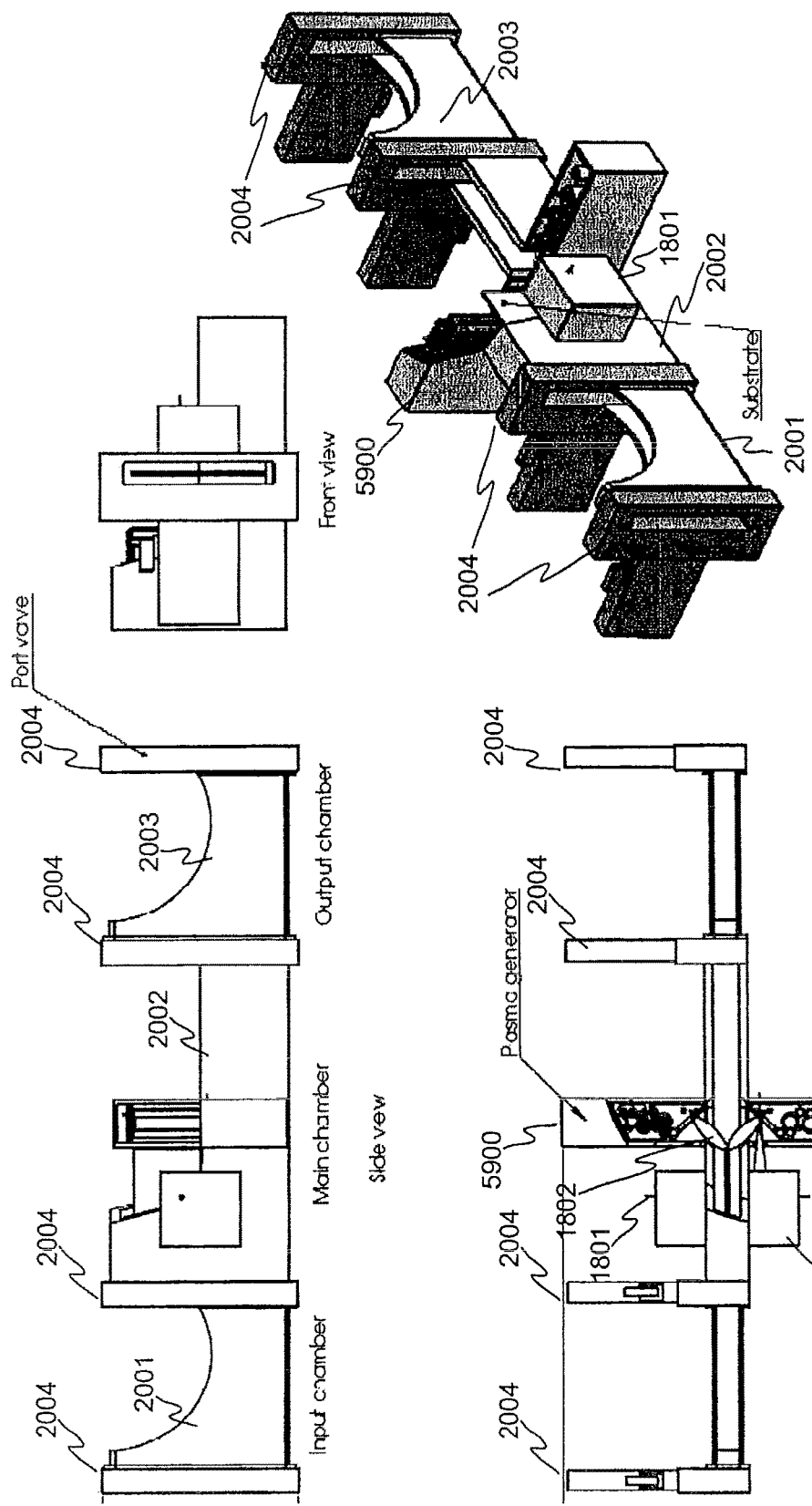
Figure 21:
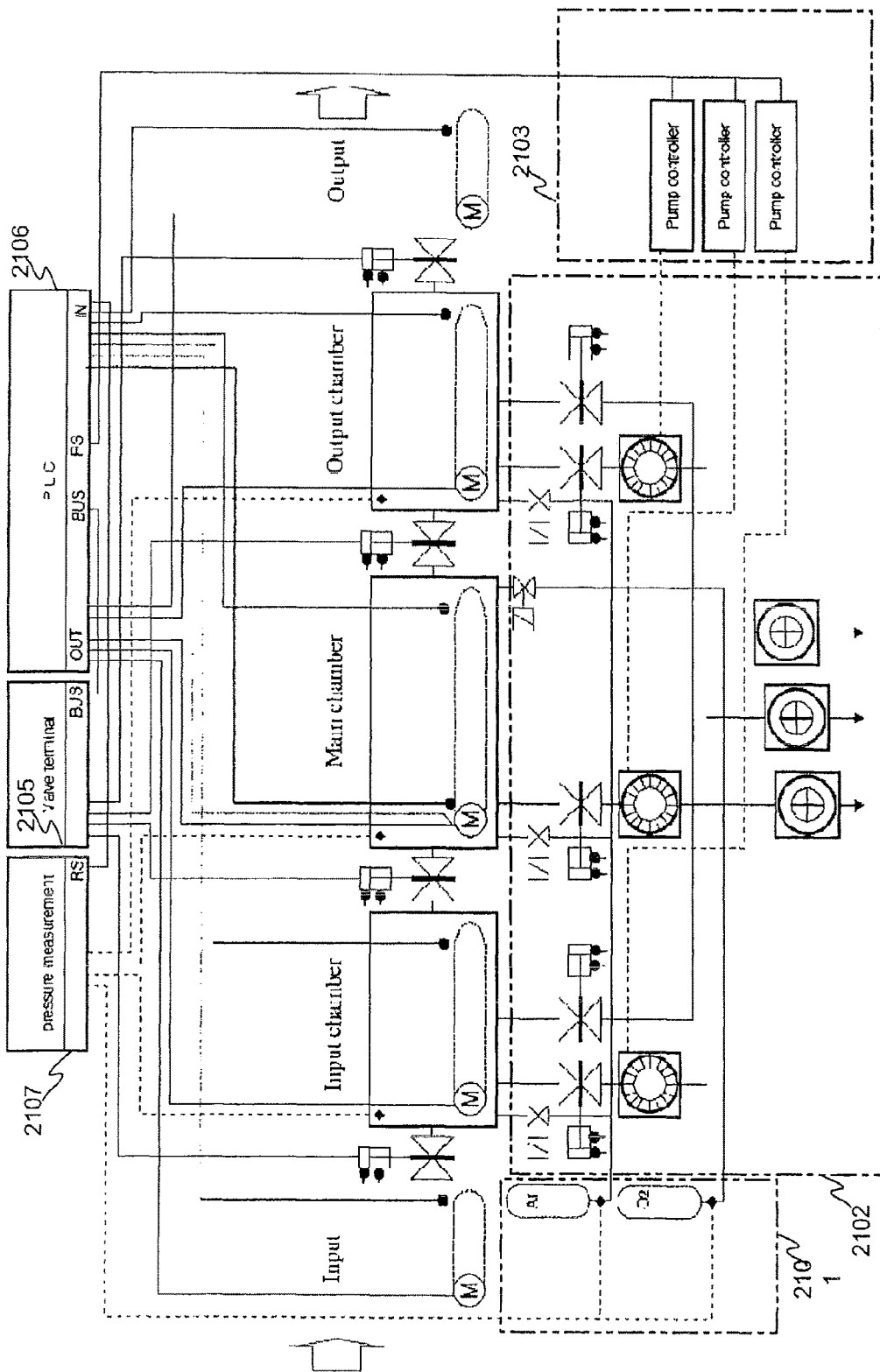
Figure 22:
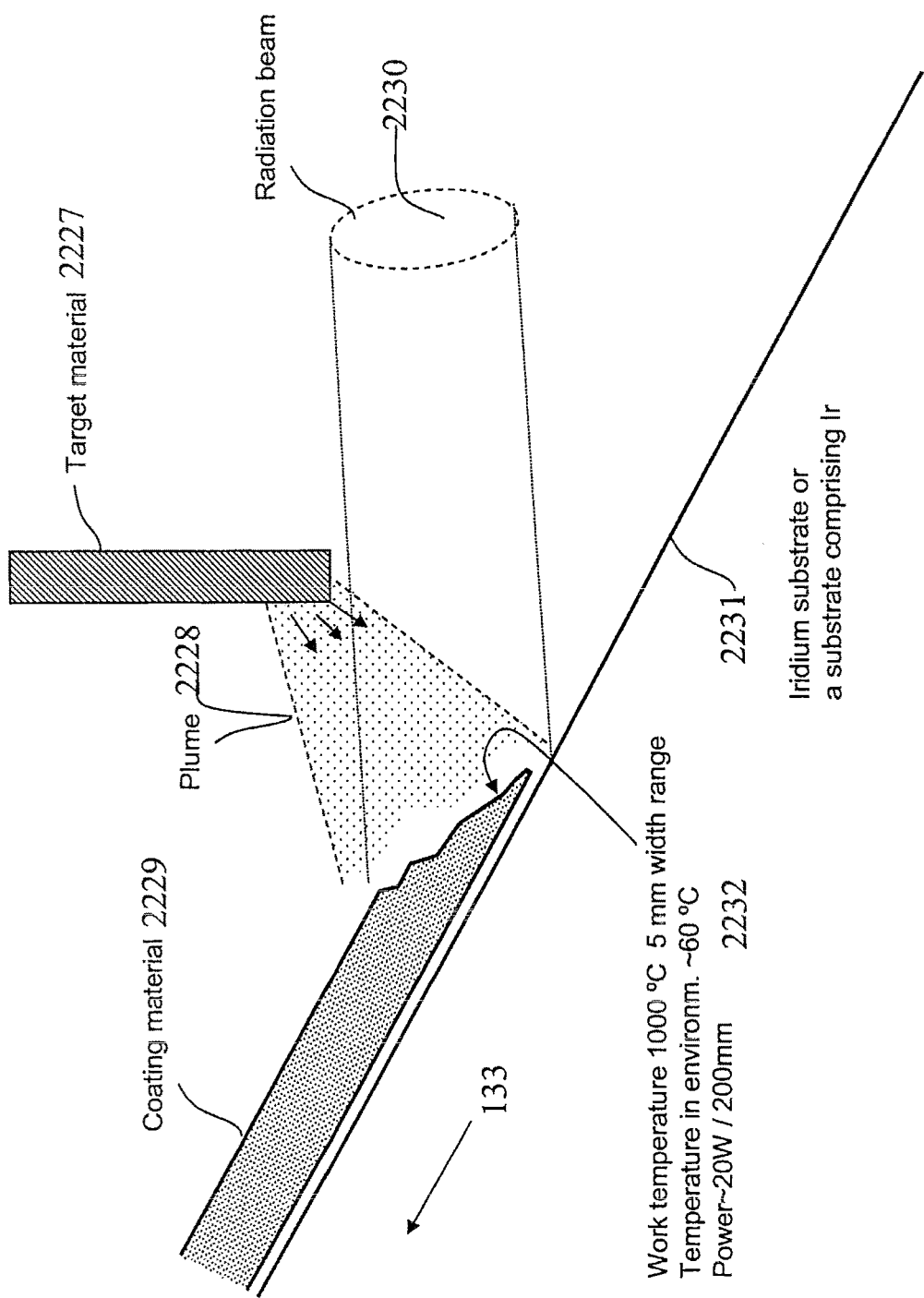
Figure 23:
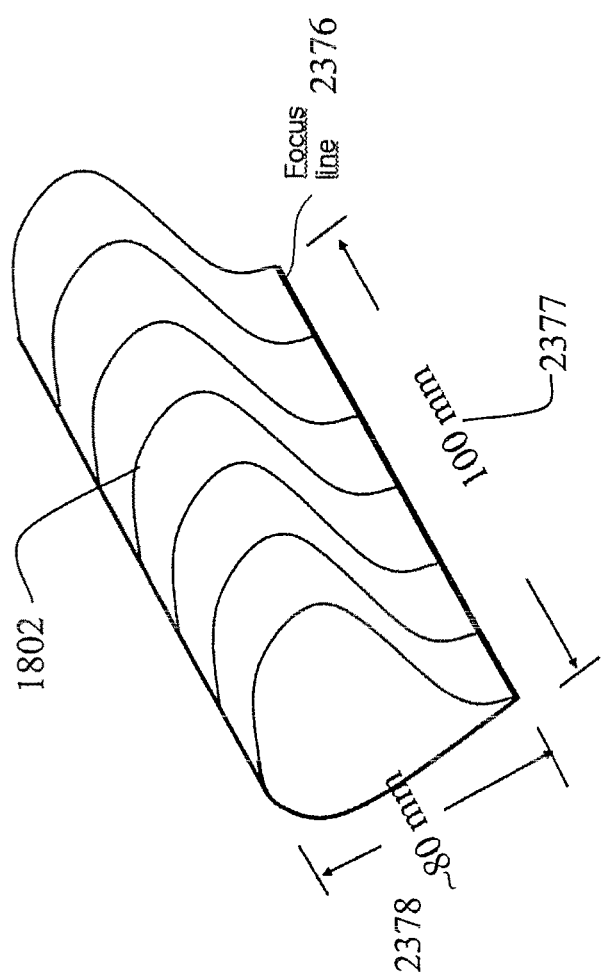
Figure 24:
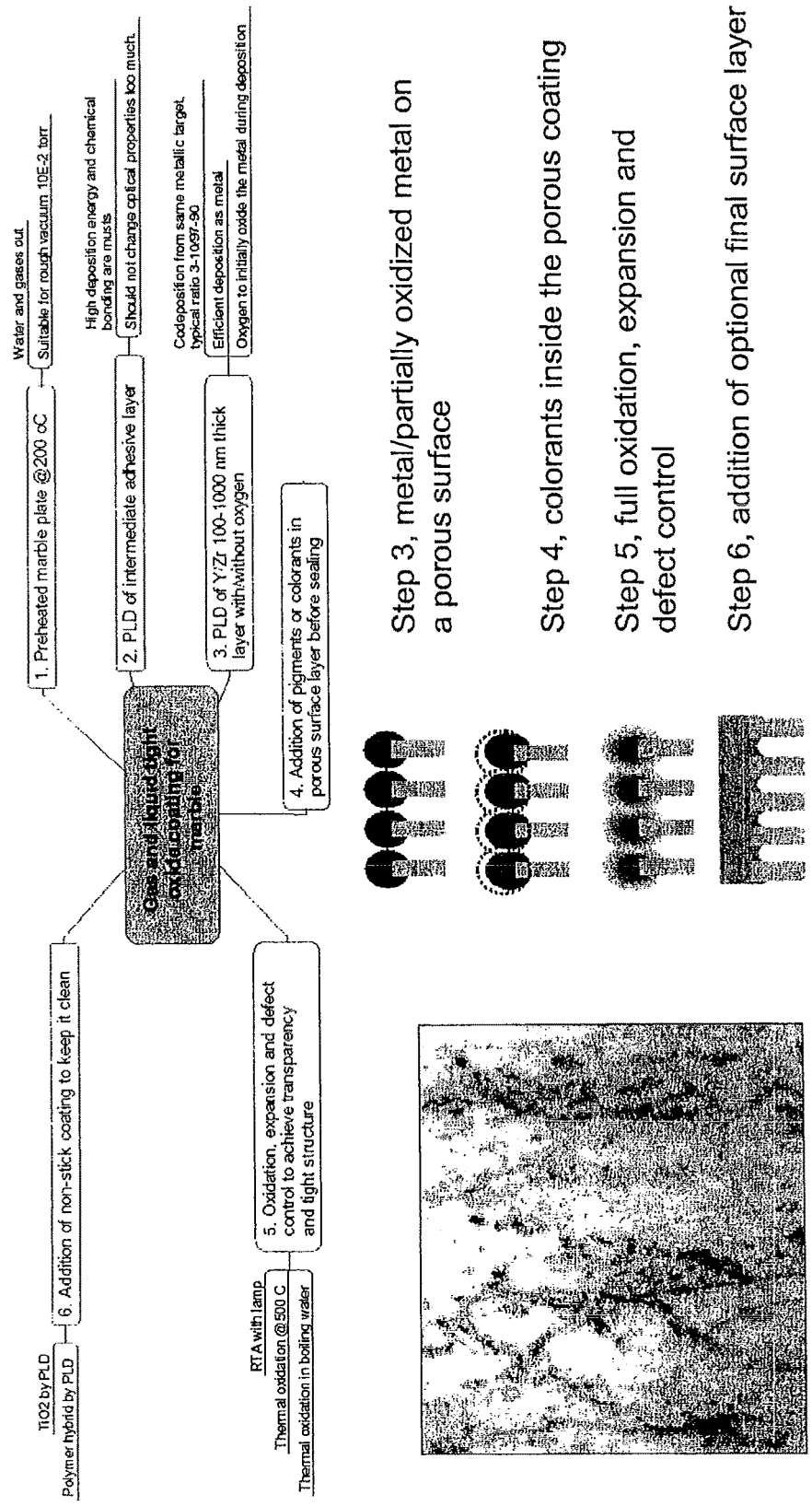
Figure 25:
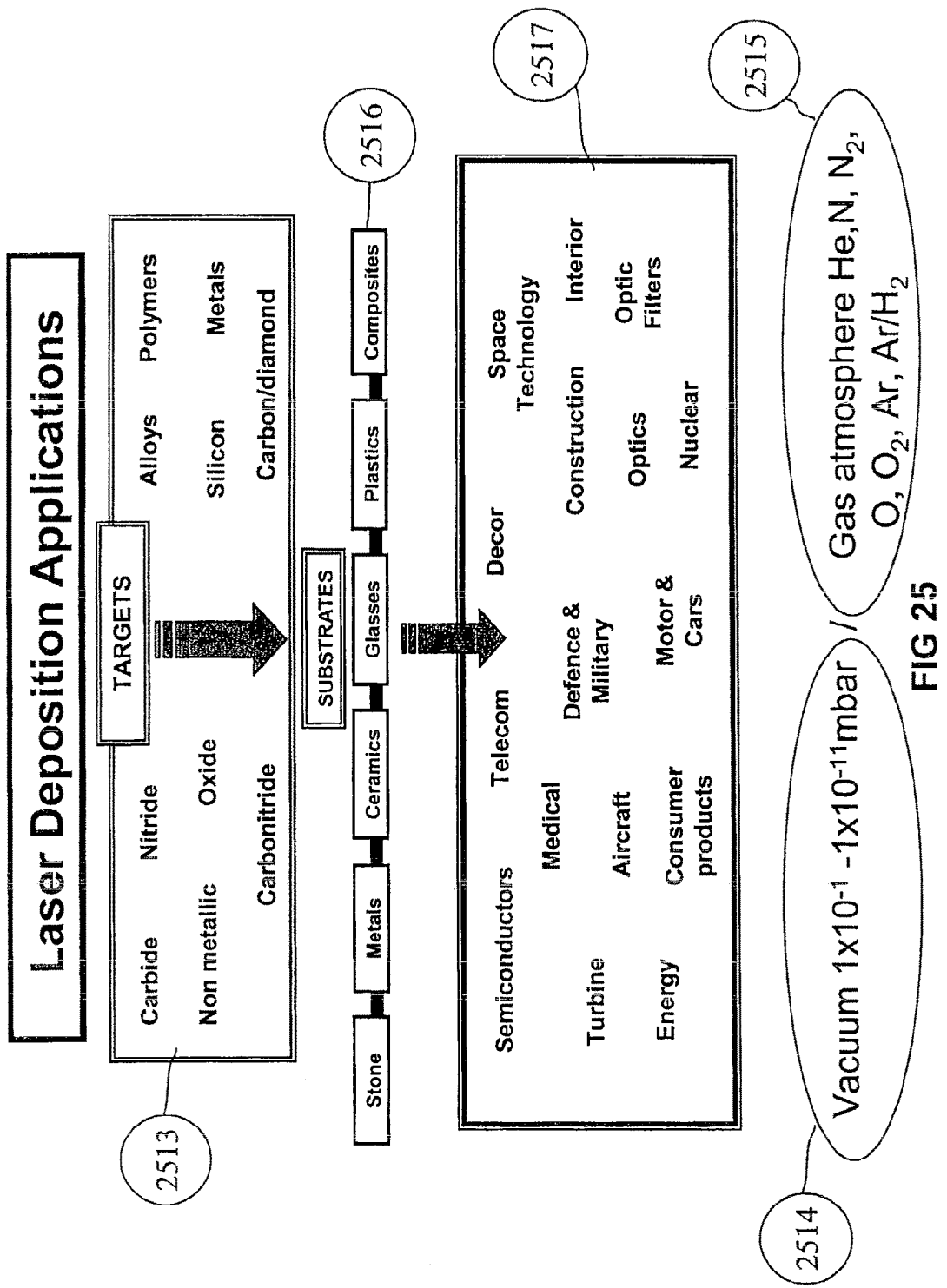
Figure 26:
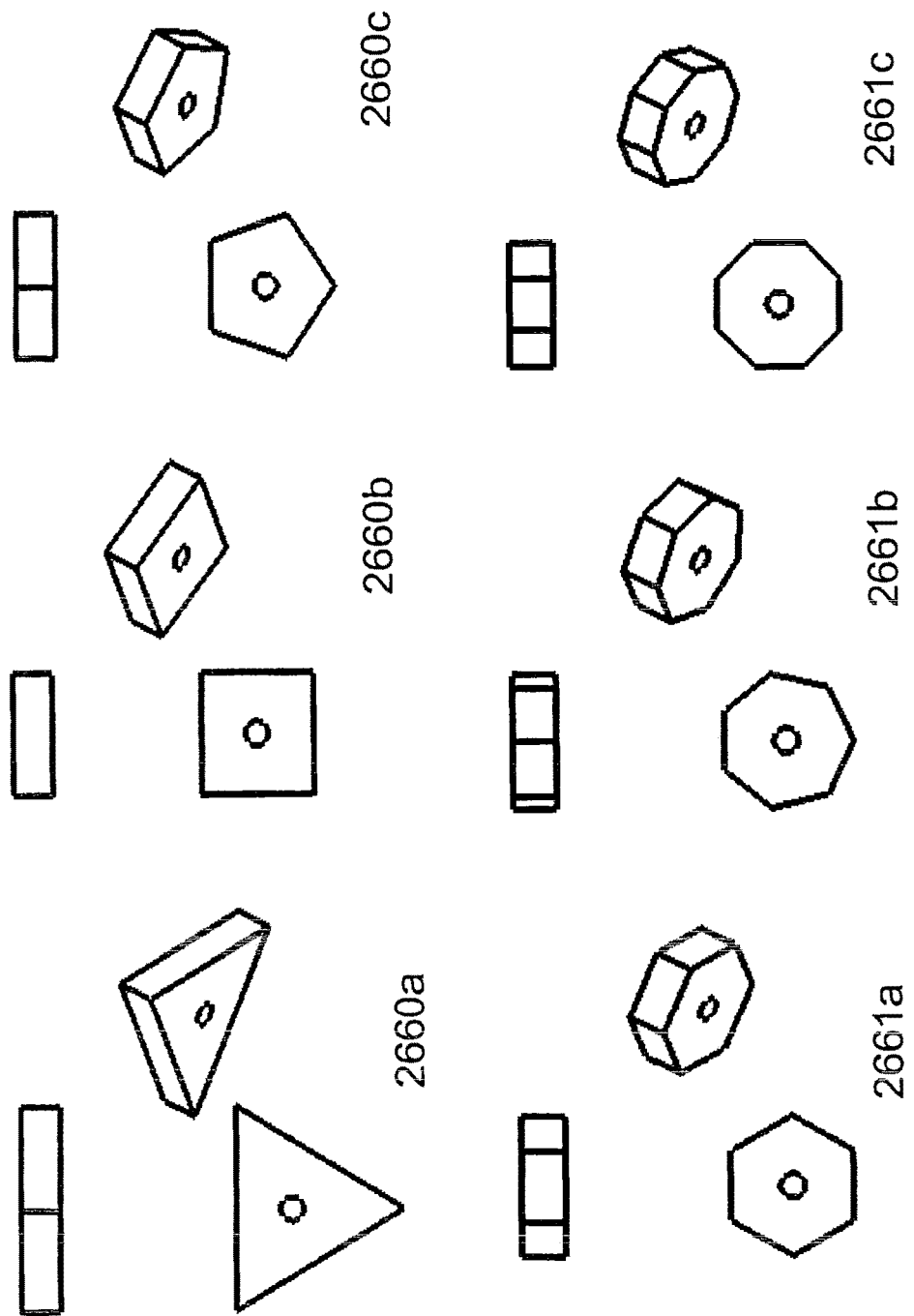
Figure 27:
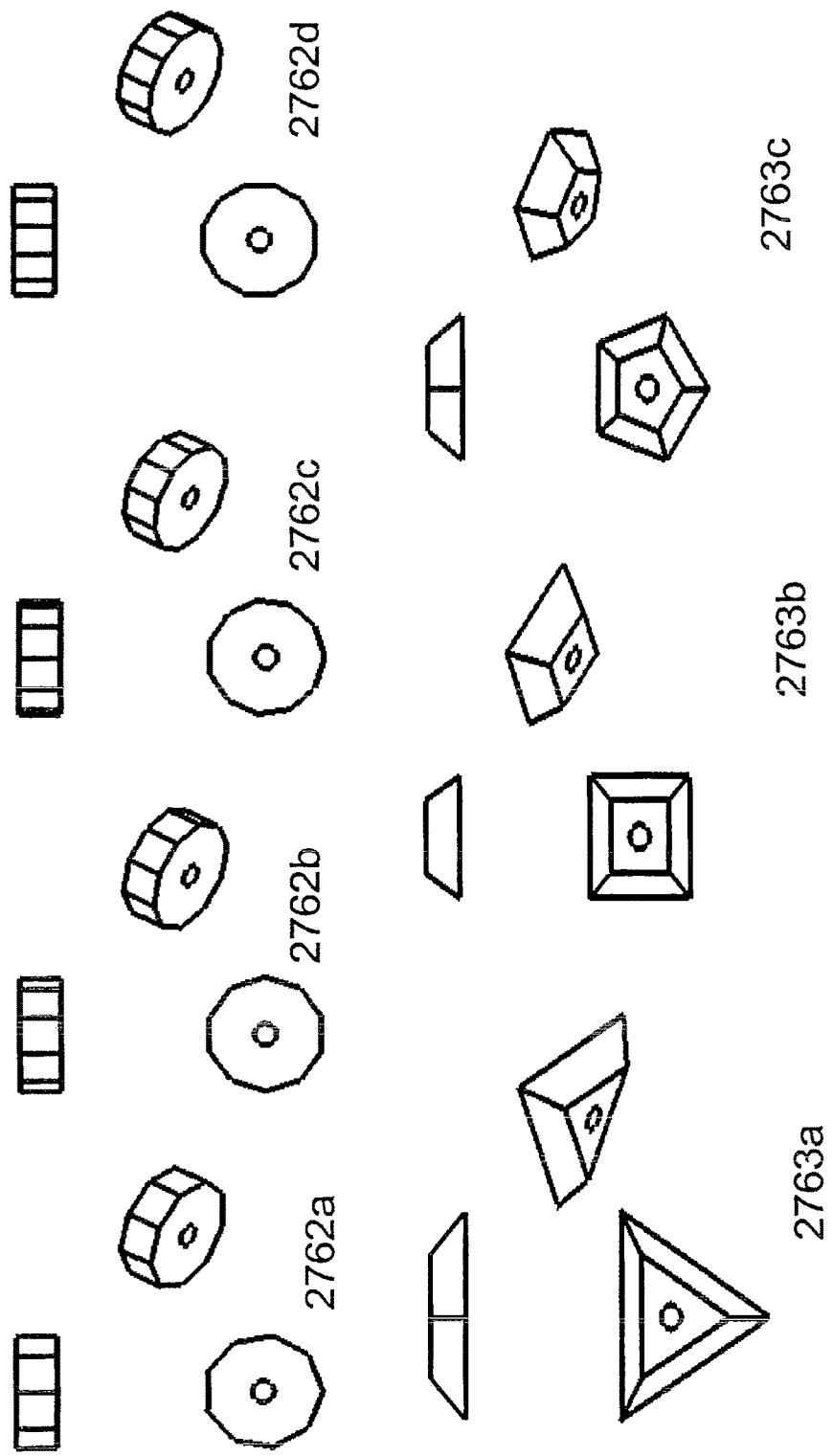
Figure 28:
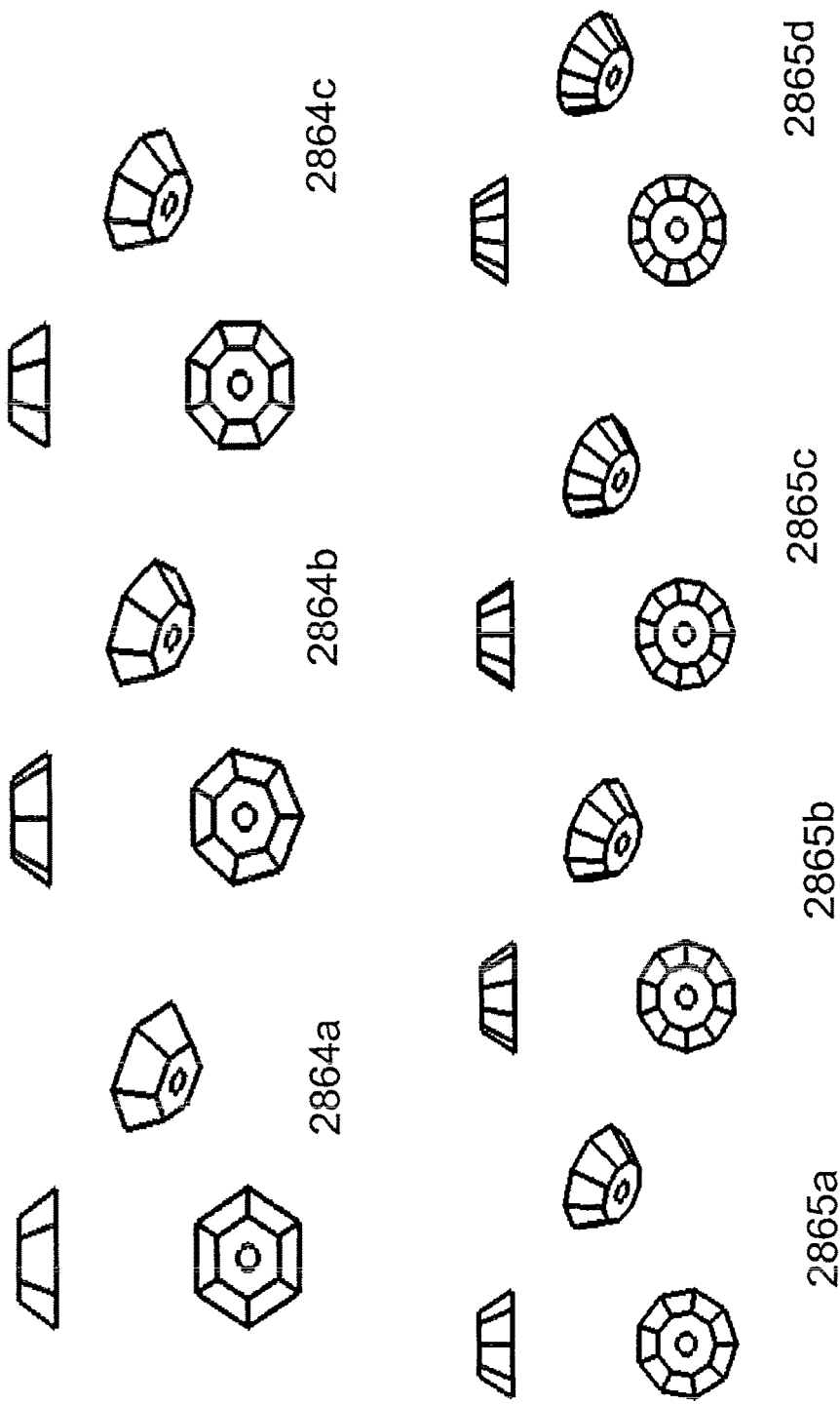
Figure 29:
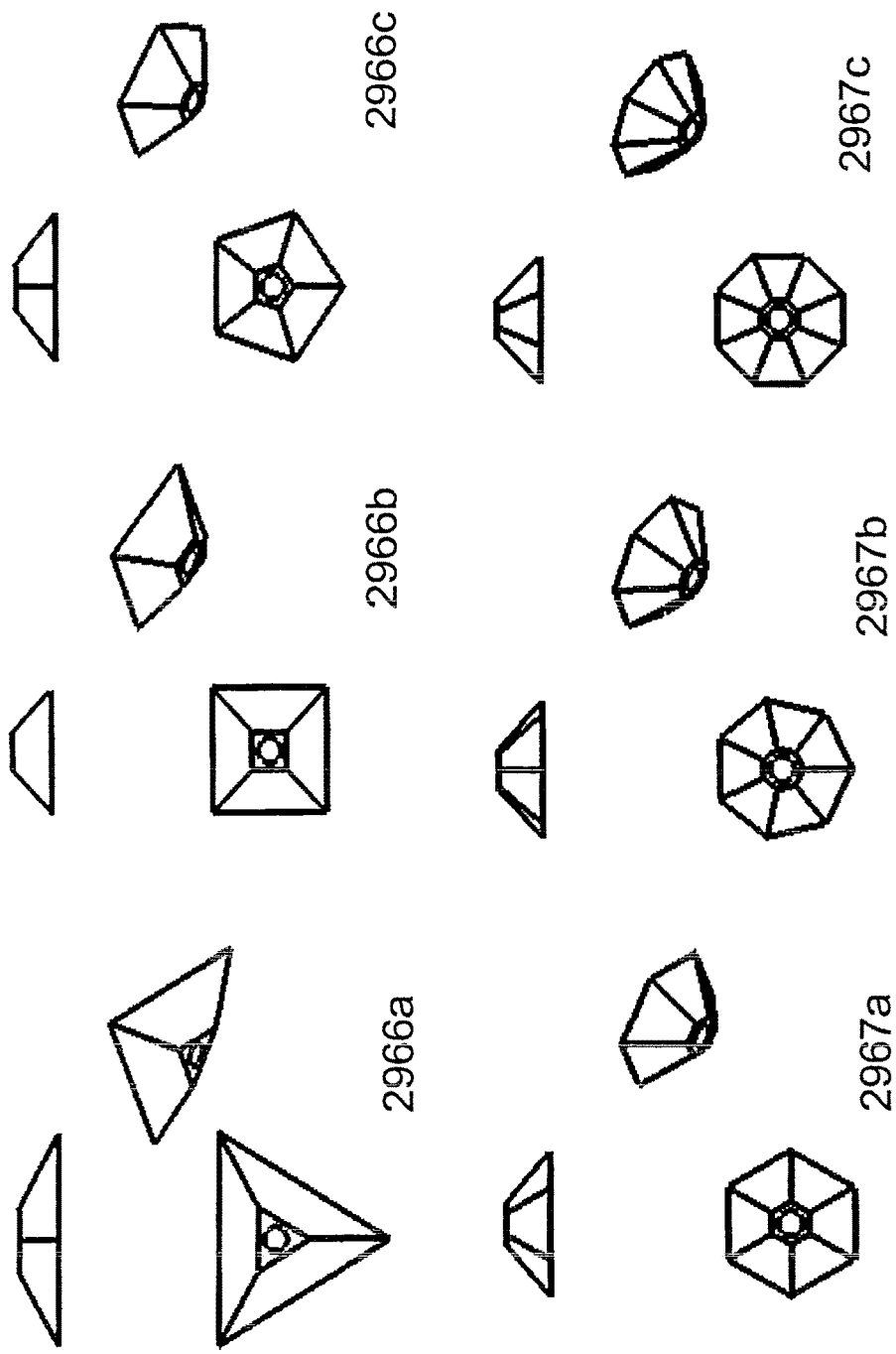
Figure 30:
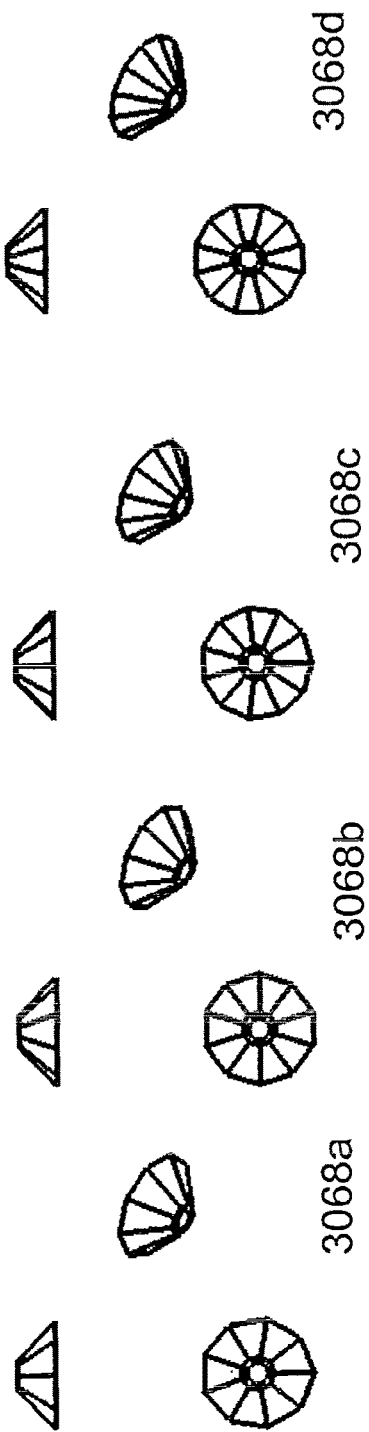
Figure 31:
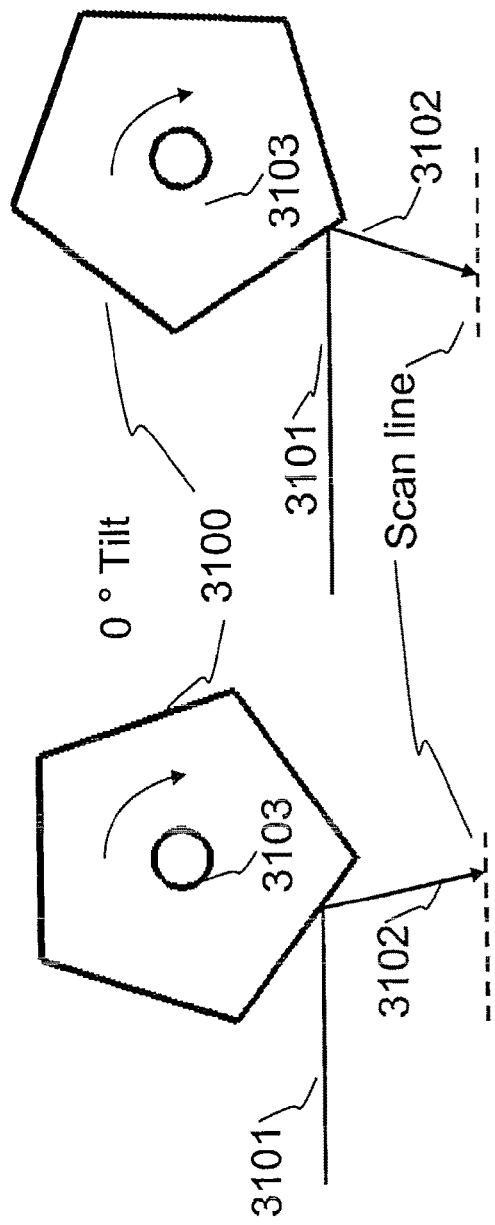
Figure 32:
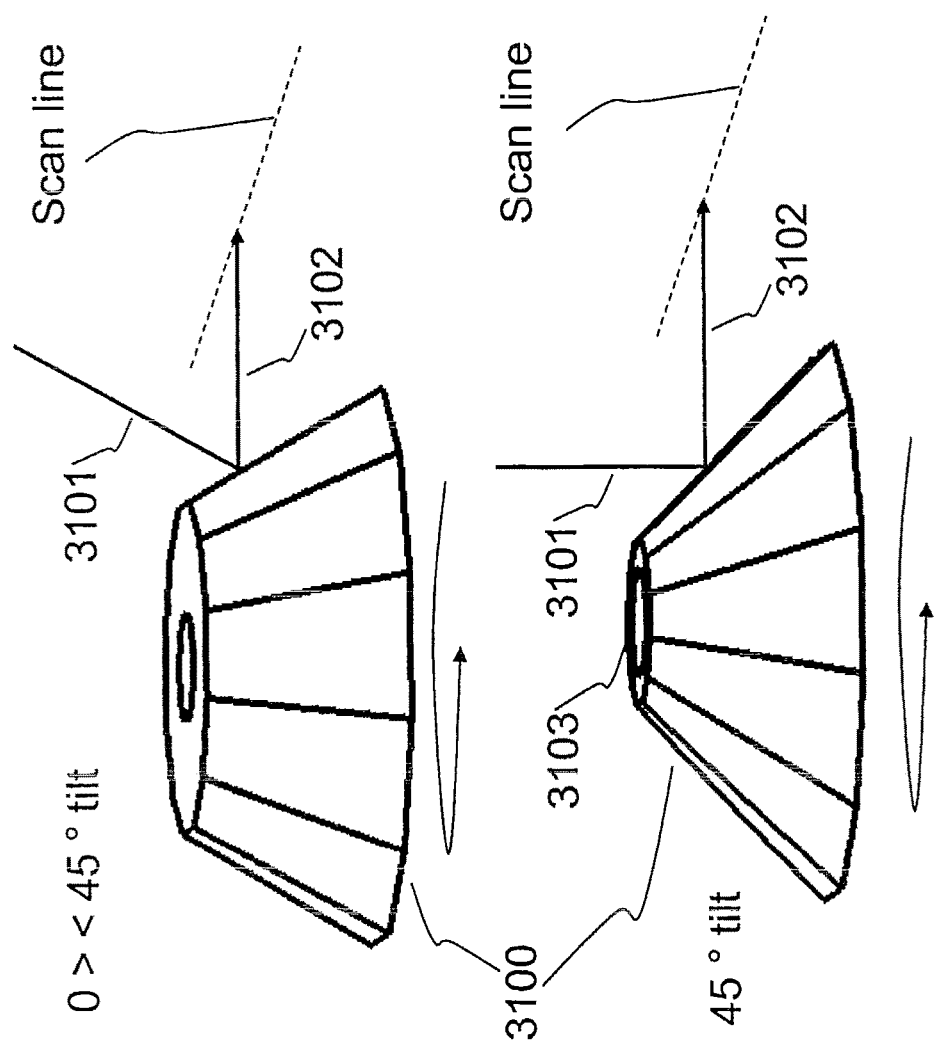
Figure 33:
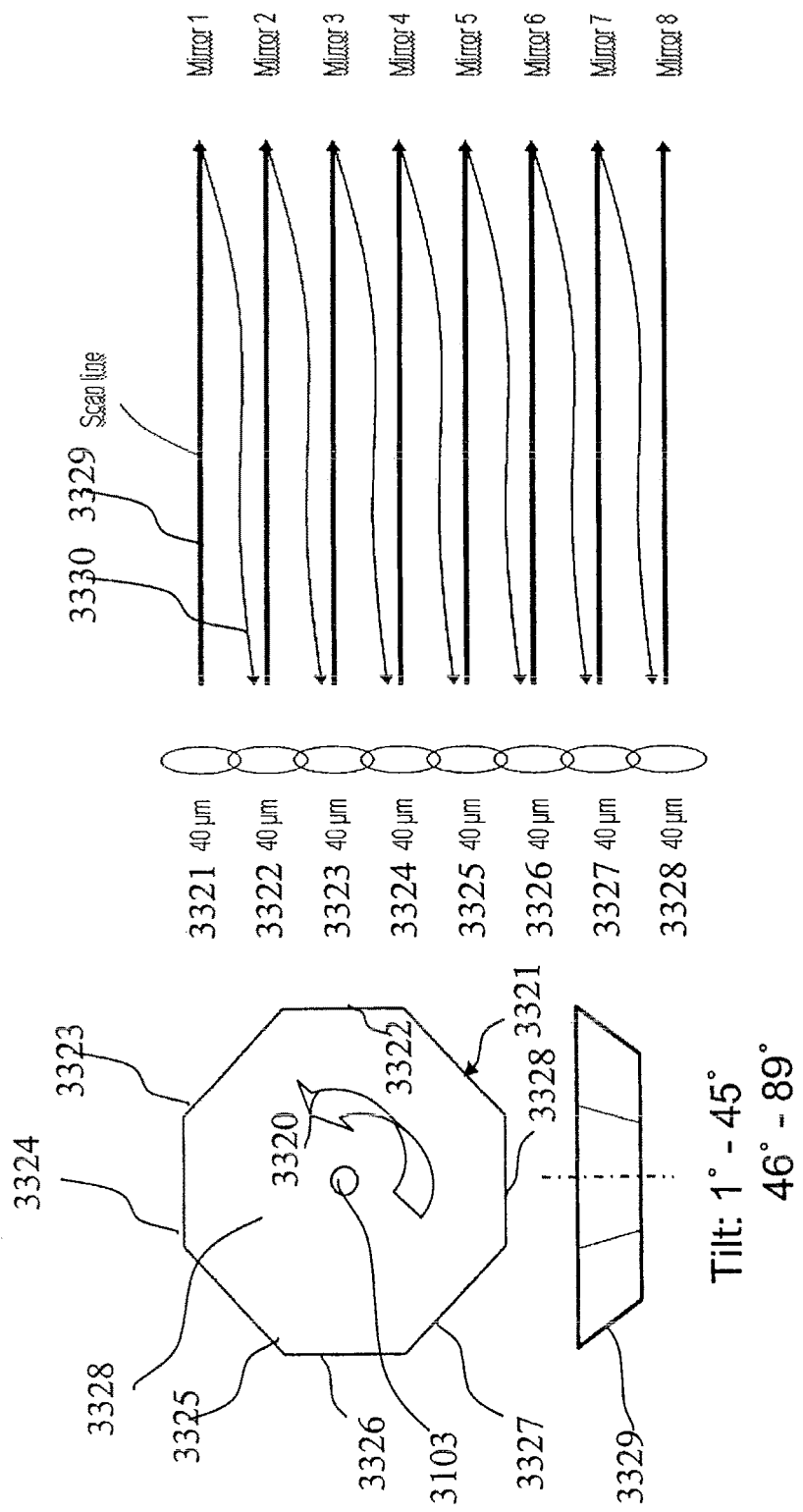
Figure 34:
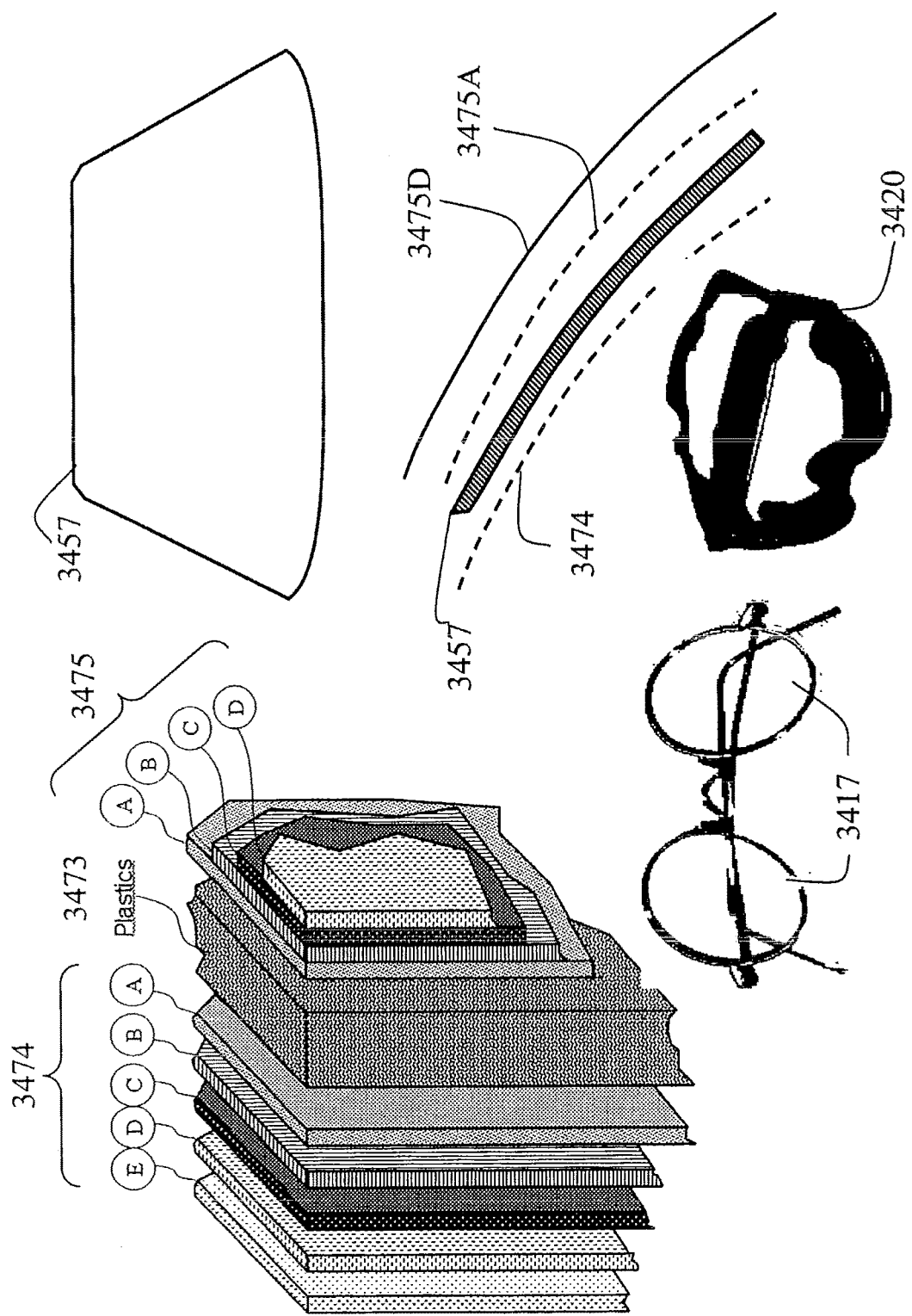
Figure 56:
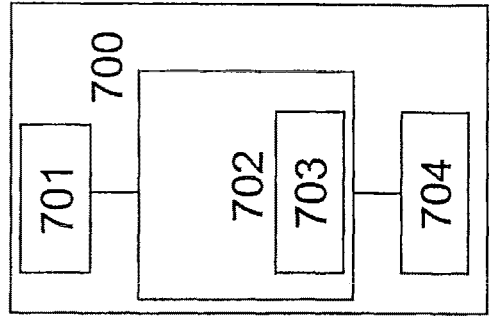
Figure 54:
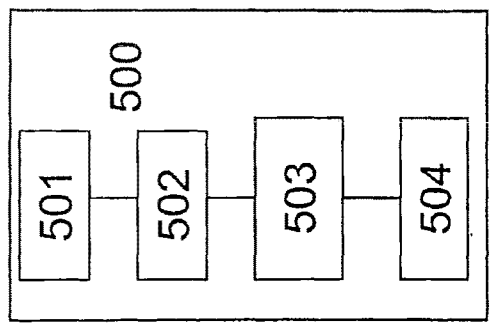
Figure 53:
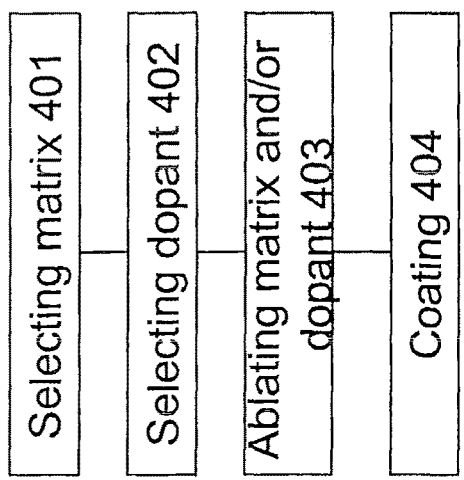
Figure 55:
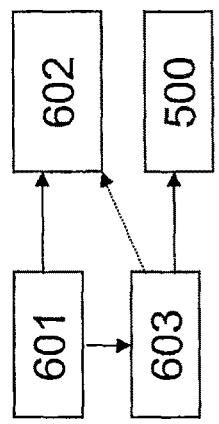
Figure 57:
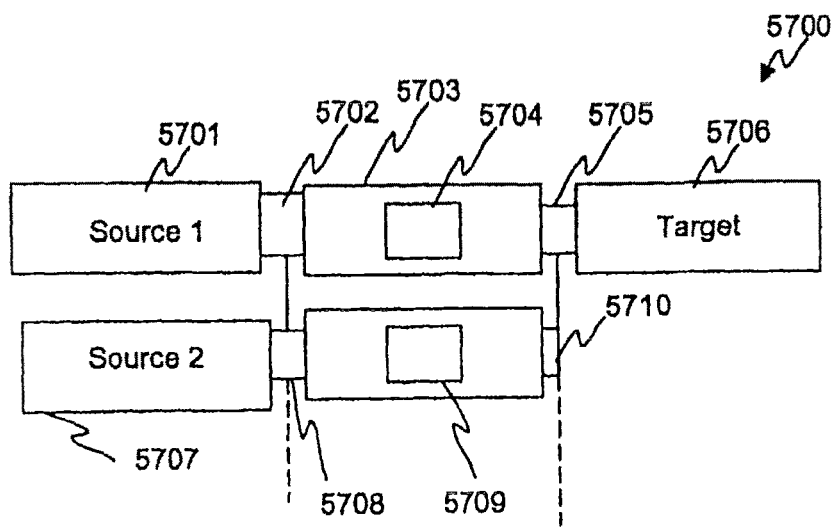
Figure 58:
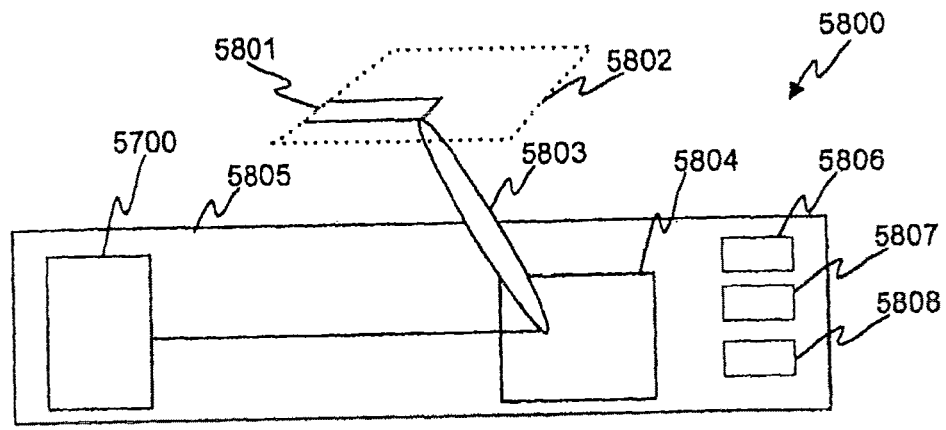
Figure 59:
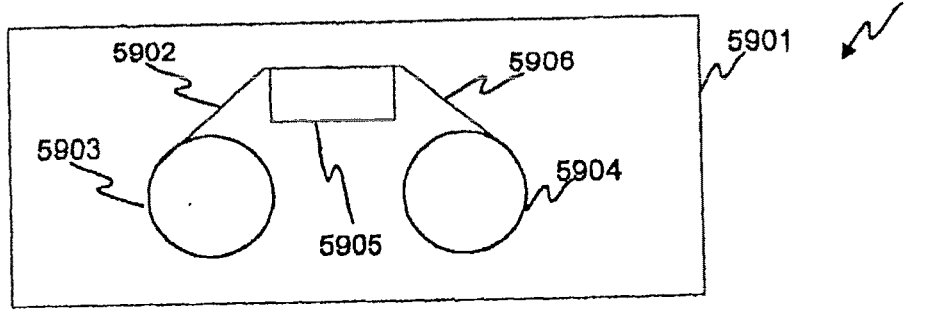
Figure 60:
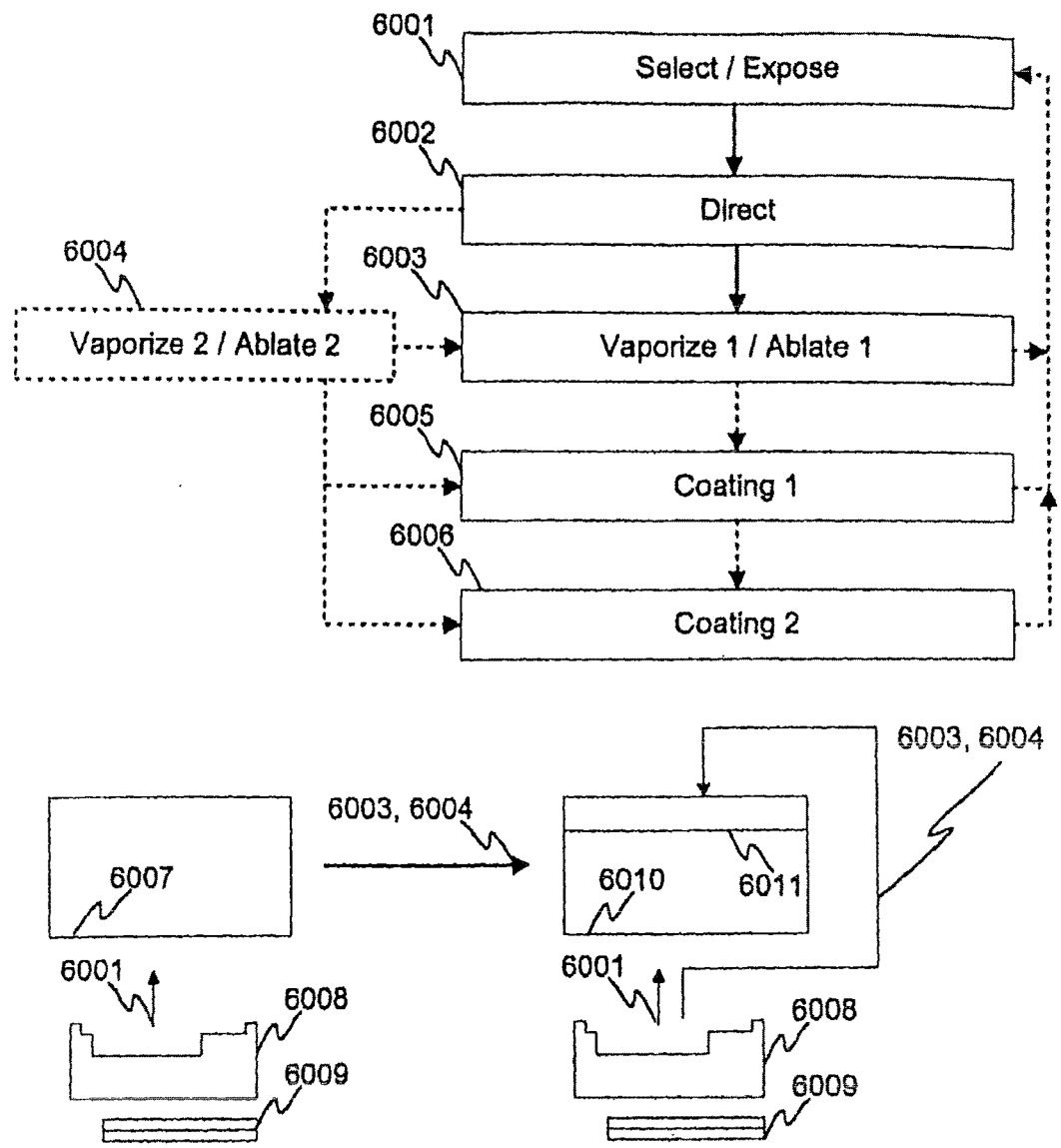
Figure 61:
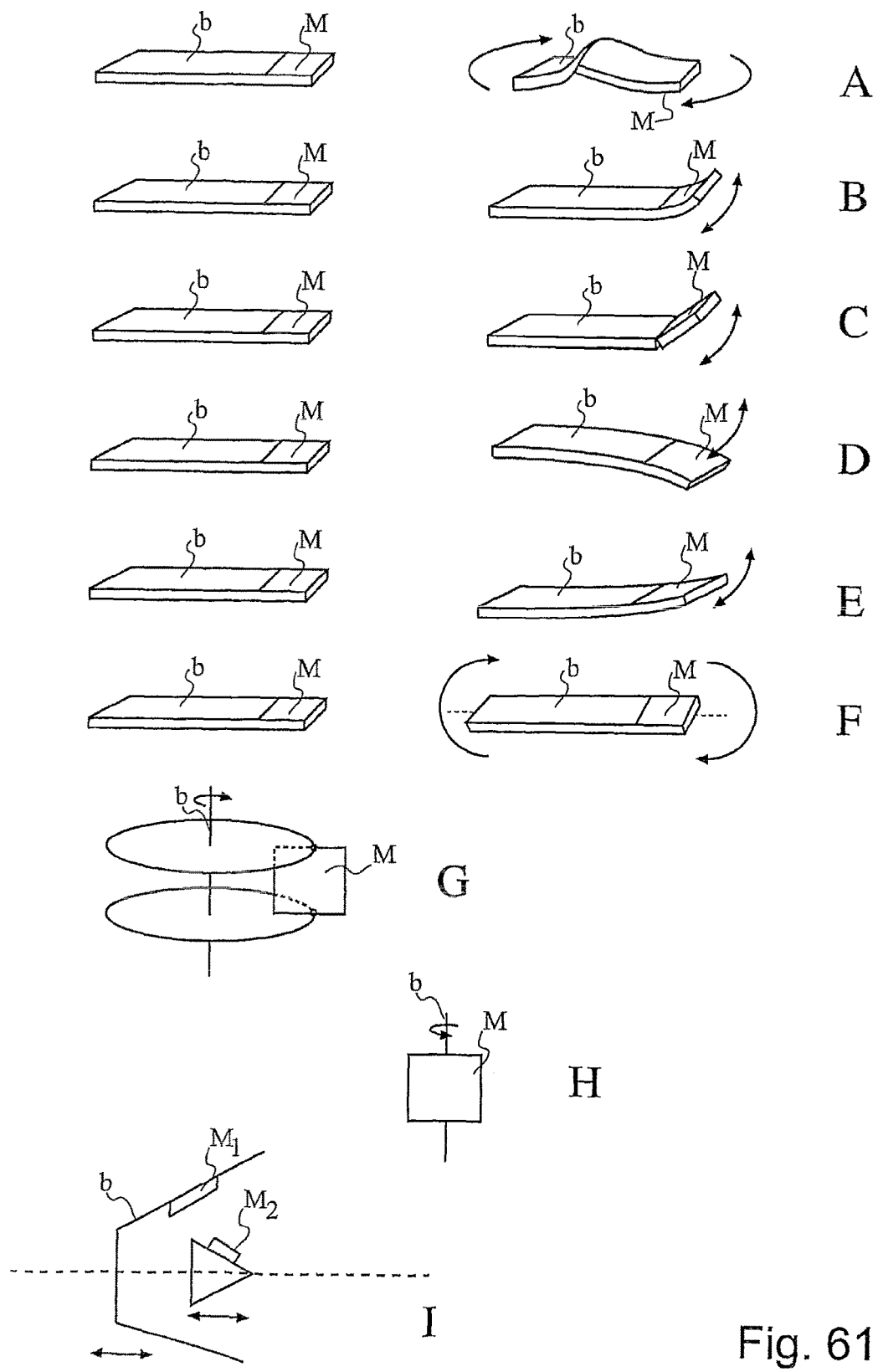
Figure 68:
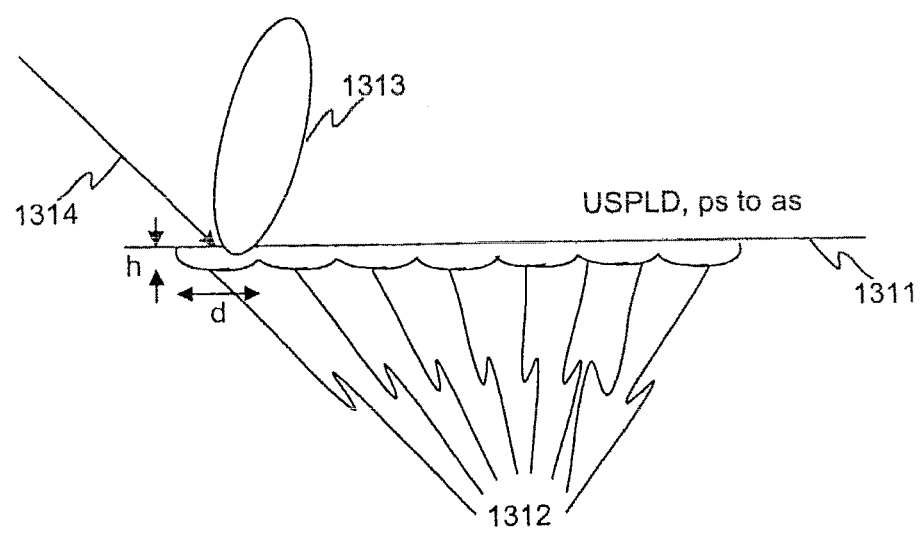
Figure 69:
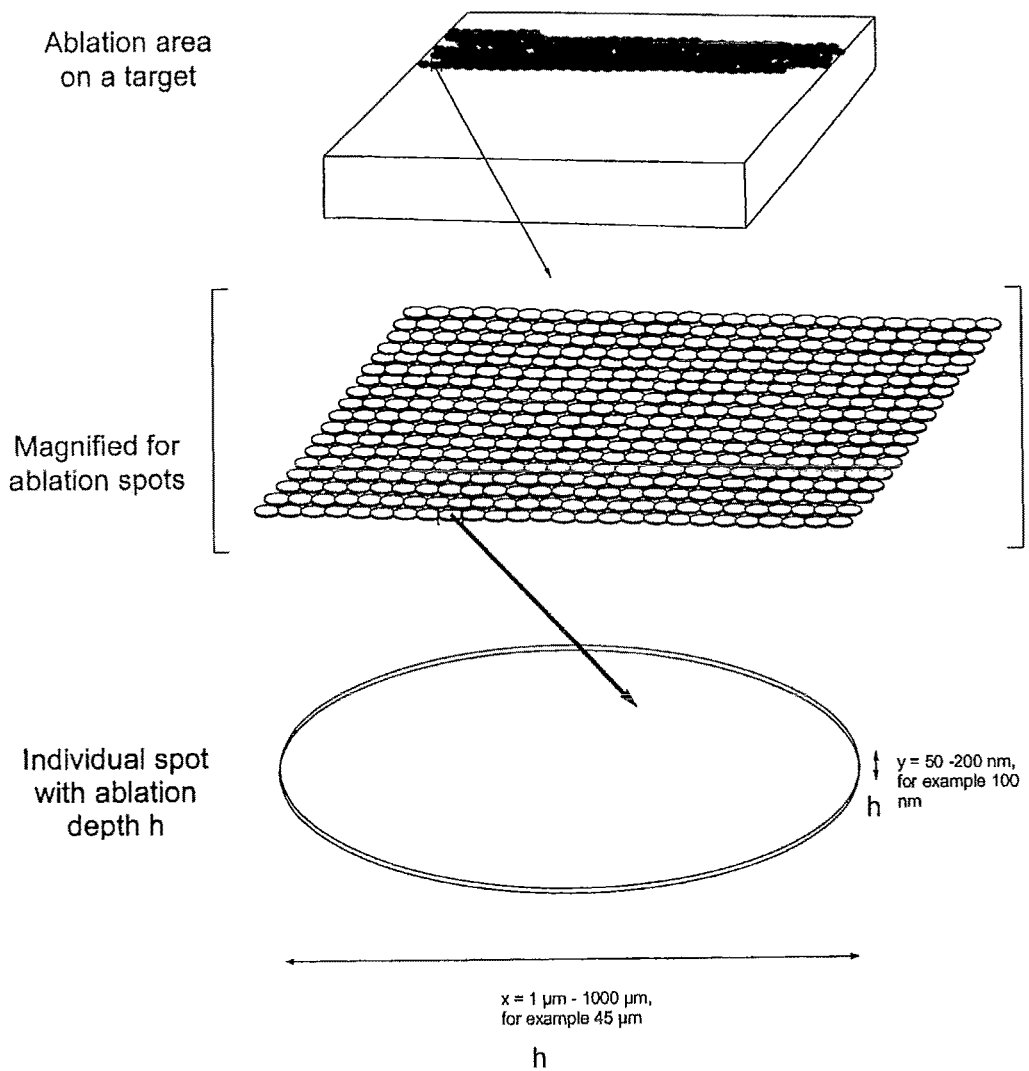
Figure 70:
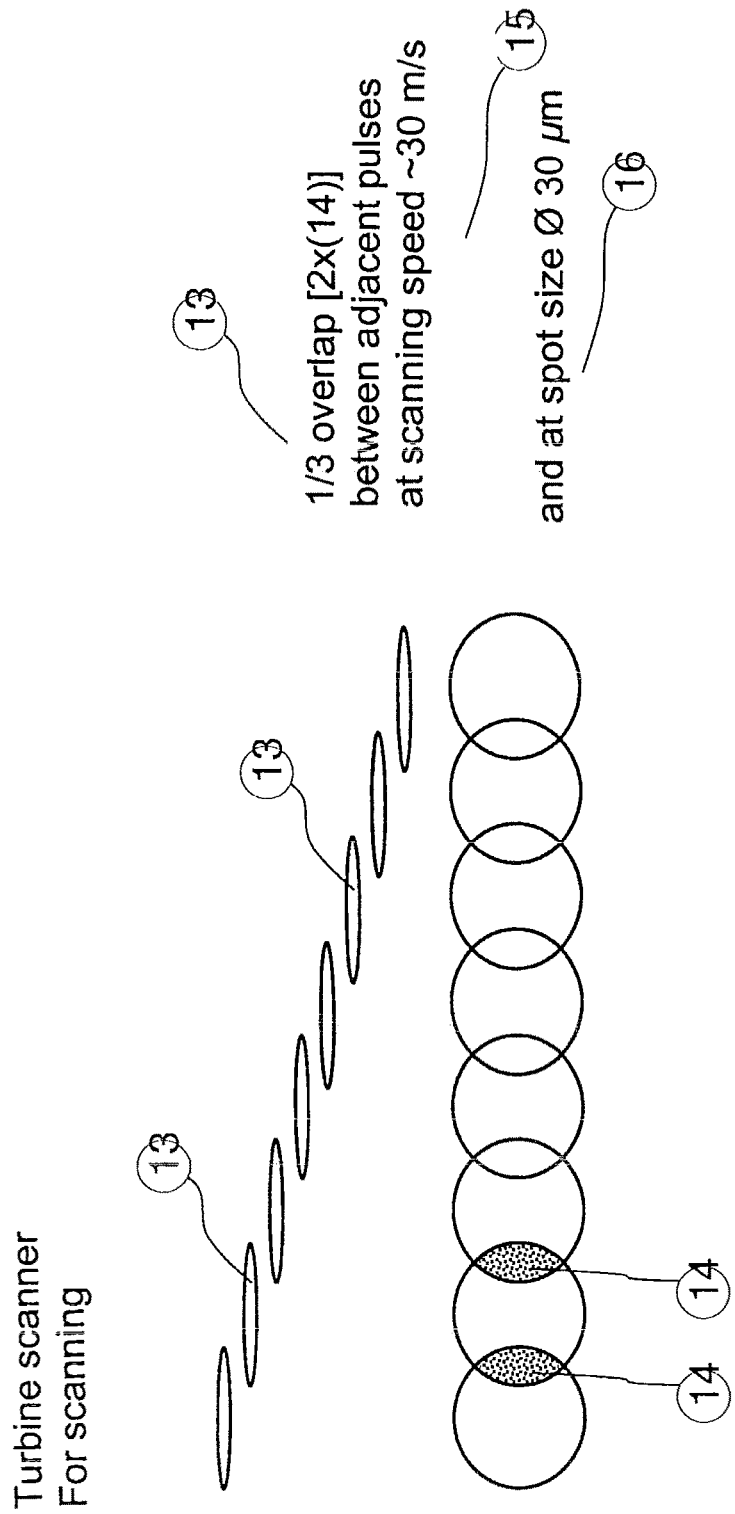

FIG. 1 illustrates a radiation arrangement according to an embodiment of the invention, comprising a diode-pumped fibre radiation source in a radiation system of type of modular oscillator power amplifier (MOPA), as arranged to form the radiation power at the target, FIG. 2 illustrates a part of a radiation arrangement according to an embodiment of the invention, comprising the power amplifiers of the radiation pulse, such as the diode-pumps, are included into a vacuum evaporation system and in which optical fibre and/or optical high-power connectors are needed only the minimum for the radiation pulse, FIG. 3 illustrates a part of a radiation source arrangement according to an embodiment of the invention, comprising optical path further comprising a turbine scanner to guide the radiation beam, FIG. 4 illustrates a radiation source arrangement according to an embodiment of the invention, in which a diode-pumped radiation beam is arranged to be directable via correction optics into a vaporizable material, FIG. 5 illustrates a part of a radiation source arrangement according to an embodiment of the invention embodied as an example with for radiation units in the radiation source arrangement of the vacuum vaporization device, FIG. 6 illustrates vacuum vaporization device according to an embodiment of the invention, FIG. 7 illustrates a phased-diversified-amplified-directly directable-radiation system (PDADD-radiation system) according to an embodiment of the invention, in which the diode-pumped radiation beam is directable by a turbine scanner via correction optics integrated into the diode-pumped radiation, FIG. 8 illustrates vacuum vaporization device according to an embodiment of the invention with a radiation source unit as a vaporization unit, FIG. 9 illustrates vacuum vaporization device according to an embodiment of the invention with a radiation source unit inside the vacuum vaporization device, FIG. 10 illustrates a radiation source arrangement according to an embodiment of the invention in which at least one or several of an ensemble of radiation beams are directable via an expander and/or turbine scanner to a vaporization target, FIG. 11 illustrates a diode-pumped set of radiation sources according to an embodiment of the invention, wherein each diode-pump has own expander, FIG. 12 illustrates a light pattern formation according to an embodiment of the invention as having an asymmetric shape, FIG. 13 illustrates a light pattern formation according to an embodiment of the invention as having an asymmetric shape, FIG. 14 illustrates examples of target materials according to an embodiment of the invention, FIG. 15 illustrates a scan according to an embodiment of the invention, FIG. 16 illustrates another scan according to an embodiment of the invention, FIG. 17 illustrates a mechanism to handle target material in flat form as foil and/or ribbon, for example, FIG. 18 illustrates the mechanism of FIG. 17, plume and the radiation source arrangement, as parts of vacuum vaporization/ablation arrangement according to an embodiment of the invention, FIG. 19 illustrates example according to an embodiment of the invention, FIG. 20 illustrates an example according to an embodiment of the invention, FIG. 21 illustrates a schematic of an embodiment according to FIG. 20, FIG. 22 illustrates a target material utilisation for a coating and/or material production according to an embodiment of the invention, FIG. 23 illustrates a plume from target material during a scan line part, FIG. 24 illustrates as an example a view from a control unit display of an embodiment arranged to control a stone or stone-plate coating process, such as to produce marble or like surfaces, FIG. 25 illustrates targets, substrates and/or products according to embodiments of the invention, in respect to example of the manufacturing conditions, FIG. 26 illustrates embodiments of low-faced turbine scanner according to an embodiment of the invention, FIG. 27 illustrates embodiments of low-faced turbine scanner according to an embodiment of the invention, FIG. 28 illustrates embodiments of high-faced turbine scanner according to an embodiment of the invention, FIG. 29 illustrates embodiments of high-faced turbine scanner according to an embodiment of the invention, FIG. 30 illustrate embodiments of high-faced turbine scanner according to an embodiment of the invention, FIG. 31 illustrate radiation path during a scan with a turbine scanner with a face tilt, FIG. 32 illustrates radiation paths during scans with a turbine scanner with another face tilt, FIG. 33 illustrates rotating part of the turbine scanner and the scan line on target, FIG. 34 illustrates a examples of a layered structure on a substrate, FIG. 35-52 illustrates further examples of use of coatings, each indicated substrate to be coated or made according to an embodiment of the invention, FIG. 53 illustrates an example of an embodiment of the invention, FIG. 54 illustrates a 3D-printer according to an embodiment of the invention, FIG. 55 illustrates a 3D-copy machine according to an embodiment of the invention, FIG. 56 illustrates a laser system according to an embodiment of the invention, FIG. 57 illustrates a radiation source arrangement according to an embodiment of the invention, FIG. 58 illustrates a target material unit according to an embodiment of the invention, FIG. 59 illustrates target material feed according to an embodiment of the invention, FIG. 60 illustrates a surface processing method according to an embodiment of the invention, FIG. 61 illustrates embodiments of scanners to be used in option or in addition to turbine scanner according to an optional embodiment of the invention, FIG. 68 illustrate an example on an ablation path according to an embodiment, FIG. 69 illustrates short pulses according to an embodiment of the invention for the ablation depth, FIG. 70 Illustrates overlapping pulses with an overlap, and FIG. 71 illustrates products to be coated according to an embodiment of the invention.

The parts or details in the figures are not necessary in the scale, and thus have only an illustrative character. In different figures, also same reference numerals may be used for indicating like parts, if not otherwise indicated for local use. The like-parts are not necessarily exactly the same in one figure as in another, which potential differences a skilled man in the art can realize from the context relating to embodiments shown and/or in the application text. The term "comprise" has been used as an open expression. Term "one embodiment" as well as "another embodiment" has been used for simplicity reasons to refer to at least one embodiment, but can also comprise an ensemble of embodiments with the indicated feature, alone, or in combination of suitable other embodiments.

DETAILED DESCRIPTION OF EMBODIMENTS OF THE INVENTION

In accordance of the objectives, and the related aspects of the invention the embodiments of the invention relate ablation techniques to produce fine plasma to be used according to the aspects of the invention.

Embodiments of the invention concern radiation source arrangement. According to an embodiment of the invention the radiation is especially laser radiation. In a radiation source arrangement according to an embodiment of the invention, at least one or more radiation beams originating to a radiation source are directable to a target via an optical path according to an embodiment of the invention. A radiation source arrangement according to an embodiment of the invention comprises a laser source as a radiation source. According to an embodiment of the invention, a radiation source comprises a diode-pumped radiation source. According to an embodiment of the invention a radiation source is a lamp-pumped radiation source. According to an embodiment of the invention a radiation source is a pulsed radiation source. According to an embodiment of the invention a radiation source is a pulsed radiation source, in which the pulse length is determined by the time of successive switch on and off of the radiation source, so including into the scope of the radiation source arrangement as one embodiment such an extreme embodiment of the invention comprising a source of continuously operable radiation source, between the moments switch on and off of the very radiation source.

In the following, an optical laser radiation has been used for simplicity reasons as an example only, so illustrating a coherent in phase radiation and/or its source without any particular intention to limit or exclude other wavelengths from the applicable electromagnetic spectrum for the radiation source arrangement.

In the following, vaporization refers to a phase transition from liquid and/or solid phase to gaseous, if the energy used in vaporization does not produce significant amount of plasma, from the target material exposed to the radiation arranged to vaporize. However, when the phase transition of the target material is in significant sense about to yield a plasma phase, the phase transition of the target material is considered as ablation, although the writer of the applicant thinks that clear indication between vapour phase comprising ionized matter and pure plasma may at least in some cases not available.

According to an embodiment of the invention, the target comprises/is made of vaporizable/ablatable matter. Such matters, that are very easily vaporizable, comprise for example organic compounds and/or metals vaporizable in a low temperature as the temperature of vaporizing aluminium. The embodiments of the invention facilitate also vaporization/ablation of other substances, elements and/or compounds thereof, individually or in compounds, one substance individually or in groups, even several substances in parallel and/or in series, according to the respective embodiments. Of course, a provision is made on that some compounds can break into constituent parts of the compound during the vaporization/ablation, however as depending on the structure and/or the strength of the bond there between the parts of the compounds in question. Examples of substances having a high vaporization temperature are such substances as many other metals, their compounds, and carbon, which of the latter can form diamonds when leaving the vapour phase in industrially controllable conditions.

Thus, utilization of the radiation source arrangement according to an embodiment of the invention in the vaporization/ablation of target materials facilitates composing several materials quite freely, and thus manufacturing even new compounds. The substances can be so purified, manufactured as such, or used in coating applications to coat surfaces of various kinds once and/or several times.

According to an embodiment of the invention, the radiation source arrangement is arranged so, that the vaporization of the target material is made in a vacuum. Vacuum should be understood as a macroscopic volume, in which there is some material still present in a gaseous form. However, skilled men in the art know that vacuum can be considered as being several kinds of vacuums from the conditions of intermolecular empty space related conditions, via the empty space in the stellar space to the barely under-pressure conditions comparable to the ambient standard conditions. Atmosphere can thus comprise a vacuum with a predefined constituent composition, in under pressure. However, some embodiments of the invention can be implemented in an atmosphere that is over pressure, especially in embodiments in which the atmosphere comprises a product constituent, and/or in embodiments in which the phase balance is aimed to favour non-gaseous forms of the constituents.

Vacuum vaporization/ablation arrangement according to an embodiment of the invention comprises a radiation source arrangement according to an embodiment of the invention, but arranged to vaporize target material in vacuum conditions.

According to an embodiment of the invention the vacuum vaporization/ablation arrangement is embodied as a device. The path according to the embodiment of the invention, the radiation source arrangement according to an embodiment of the invention, the target material according to an embodiment of the invention and/or the handling equipment thereof are comprised in the same closure with the vacuum chamber unit in such a device. The device can also comprise the maintaining gadgets such as pumps, power sources, and/or data acquisition equipment etc. but is not limited only by said gadgets, their presence or absence.

According to an ensemble of embodiments of the invention, the path is at least partly outside the device. Particularly, such objects that change the radiation geometry and/or propagation direction as situated individually inside the device embody each an embodiment of the device. Also each combination of said objects situated inside the device define each an embodiment of the device.

Parts that are mounted solidly onto the chases of the device, essentially or completely outside the interior of the device, are included to the scope in the same cover.

Further embodiments on the vacuum vaporization/ablation arrangement have been further described via a non-limiting example within a paragraph addressed to examples.

A path of radiation transference for guiding electromagnetic radiation, (referred also as "path" in the following suitable context), according to an embodiment of the invention comprises a turbine scanner arranged to guide said electromagnetic radiation, in a radiation-geometry, from the radiation source to the target of the radiation. According to an embodiment of the invention the radiation is transferred as pulsed high-power laser beam pulses.

According to an embodiment of the invention the path of radiation transference for guiding electromagnetic radiation can comprise a beam expander, but is not limited thereto, for changing the radiation geometry of the radiation originating to the radiation source. A path according to an embodiment of the invention can comprise a correction optical means arranged to correct the beam geometry at the path. The expander and the correction optics are the same in one embodiment, but are separate in another embodiment. According to an embodiment of the invention the geometry can be modified in order to achieve a certain focus geometry, for example on the target to be vaporized. According to an embodiment of the invention the path can address the focus point being set above, into inside the target material or somewhere there between, in respect any of the surface formations of the target material to a certain distance, selectable by the target material, the radiation source features and/or other parameters relevant to the desired plume formation form the target piece. According to an embodiment of the invention the corrected geometry can be the geometry in which the beam is arranged to hit the turbine scanner part.

According to an embodiment, there can be also geometry for the radiation to hit the turbine scanner, a first geometry, and/or a geometry for the radiation to hit the target, a second geometry, which are not necessary the same, but each can be adjustable by the correction optics where absolutely necessary for the plume optimization emittable from the target. According to an embodiment of the invention the path is arranged from the radiation source to the target so that the radiation beam in said path is directed to another direction than an emitting plume, which is arranged to form from said target by said radiation.

Expander part, connectable to a diode-pump of the radiation source arrangement, can be an integrated part in one embodiment but connectable via a power fibre in another embodiment.

The path comprises advantageously a turbine scanner. Such a turbine scanner can be a conventional turbine scanner, which can tolerate radiation of the radiation source arrangement at a certain maximum level. Such a scanner in movement can tolerate very high pulsed radiation power without essential damage, and in theory facilitates the increase of the laser power, if not completely without limitation, at least to very high level. The currently embodied radiation source arrangement can comprise several turbine scanners, in one path according to an embodiment of the invention or in several paths according to another embodiment. Conventional turbine scanners are commercially available, and the speed can be typically about 5 km/s at the priority date of the current application.

According to an embodiment of the invention, a conventional turbine scanner piece can be arranged to be as a substrate, to receive a coating plume from a target, and the turbine scanner can be coated within a vacuum vaporization/ablation arrangement, which comprises a radiation source arrangement according to an embodiment of the invention and thus a path, comprising a turbine scanner, another one in duty. When the coating material is selected to be carbon, the turbine scanner according to an invention can be made by coating the conventional turbine scanner at least partly with a diamond coating and thus considerably increase the operating temperature and thus thermal conduction properties with a suitable dopant selection to be used to dope the diamond coating.

Such a turbine scanner according to an embodiment of the invention can tolerate radiation in a significantly higher level than a conventional turbine scanner. Thus, an improved path according to an embodiment of the invention comprises advantageously a turbine scanner according to an embodiment of the invention. Accordingly, an improved radiation source arrangement comprises an improved path according to an embodiment of the invention. Thus, an improved embodiment can be achieved from an embodiment of the invention, where applicable.

As according to an embodiment of the invention also according to an improved embodiment of the invention, the radiation from the radiation source arrangement can be directed to the target. Where applicable or necessary, in such an embodiment, an expander or correction optics can be used to form the radiation geometry at the target. According to an embodiment, each source of radiation sources arrangement or an ensemble of the sources can have its own path. The paths can lead to separate targets according to one embodiment, but to same target according to another embodiment. Those mentioned targets can be the same, but not necessarily at the same time. According to an embodiment of the invention two paths can lead to the same target in serial way in respect of time, but also in parallel in surface area, simultaneously or at least partly simultaneously in respect of the pulse durations.

Radiation source arrangement can be embodied to various embodiments according to radiation-source types present in each embodiment. So, for instance in one embodiment the arrangement can comprise hot-work laser such as micro- and/or nanosecond-laser. According to a more preferred embodiment of the invention, the arrangement comprises a cold-work laser, such as pico-, femto- and/or atto-second-laser. According to an embodiment the arrangement can comprise a laser that sends its pulse between a switch on and successive switch off, so including into a scope also a continuously operating laser, between said switch on and offs. The embodiments of the invention have advantages such as the radiation source arrangement avoids as much as possible, if not entirely, the utilisation of high-power connectors in the radiation source arrangement parts, which connector utilisation limit the increase of the radiation power, and further the transferring the power into the target. At the priority date of the current application a theoretical tolerance of a fibre in optical range is about 5 µJ per pulse. Thus a great step forward can be achieved by using a path or an improved path according to an embodiment of the invention. For instance a radiation source arrangement as embodied as a cold-work laser can thus increase the power per pulse having shorter pulses at a constant pulse energy. Thus, limitations to the radiation sources are not so serious any more because the limiting fibres can be omitted. This leads to even larger pulse powers and working temperatures on the target, so facilitating vast potential to produce plasma from any material. When the pulse length and/or pitch are adjustable, the target material can be ablated from deeper layers. This avoids reflections thus contributing the power in the target to vaporization/ablation with a better yield.

For instance, a high-power laser pulse can be produced, scanned and used in one target. The diode-pump, optical expander in an optical application with optical laser light, scanner, and correction optics are in the same place, mountable into the same chases. The laser light is produced thus at the target. However, the radiation wavelength is not limited to the mere visible laser light, but also other wavelengths of the electromagnetic spectrum can be used for the laser radiation.

Expensive fibres can be omitted, thus saving the money and replacement periods are excluded, because there is no such part to be replaced. Especially expensive are the optical high-power connectors for visible radiation, for instance. The dimensioning of a fibre laser has been suffered from the limited applicable fibre length. The radiation source arrangement according to an embodiment or improved embodiment can be dimensioned much more freely.

FIG. 14 illustrates target material surface structure, as a piece of the target material, which has formations on a base-structure. Inventors have noticed, that the target material surface formations influence on the ablation plume formation for optimizing the conditions. Different formation geometries can influence on the energy distribution in the target material, the formation itself, as well as on the thermal conditions inside the formation under the ablating radiation.

According to an embodiment of the invention, the base can be thin (A, B, C, D, E, F, G, J, K, L, M, N, O, P) or thick (H, I). The formations can be of different material than the base, but are not limited thereto only. Even on the same base there can be surface formations of different material, so arranged there to be utilizable for blending and/or phasing a coating with different materials in a vaporization/ablation. The skilled men in the art know from the FIG. 14 that although there are shown only surface formation on one side of the base, there can be also another surface at the opposite side of the base with similar surface formations, according to one embodiment, or different surface formations according to another embodiment.

For instance, in FIG. 14 the item A embodies a cubic like rectangular periodic structure of the surface formations, with a cube side as a characteristic formation parameter for the very embodiment. Another characteristic formation parameter in A is the pitch there between the formations, which are made with the pitch to certain deepness on to the thin base. The embodiment in FIG. 14 denoted by item B embodies rectangular formations on a thin base, so that the pitch is also very small in comparison to the cross-wise parameter of the rectangular ridge, whereas in the elongated direction the length of the formations is larger than cross-wise parameter. The deepness seems to be the same as in the example denoted A, but is not limited to the shown examples with their measures, which embody only certain examples having an illustrative nature only. The pitch can be even larger than the characteristic parameter in a direction and/or in a crosswise direction to said direction.

The surface formations in the item C are holes with a distance as the pitch. The holes are round in this embodiment of the target material, but could be in another embodiment rectangular, ellipsoid or even multi-conical.

In the embodiment in the item D the surface formations are like cut pyramids, whereas in the item G, the pyramids have a sharp cone, although in the embodiment D the bottom of the pyramids is rectangular, as an example on a multi-conical bottom, but the bottom in the item G is triangular. The embodiment with E is similar to the embodiment with B, but in the E the ridges are triangular, whereas in B rectangular. The pitch in embodiment E appears to be zero, but only because of drawing-technical clarity reasons. In a variant of embodiment E the pitch can be even of the magnitude of elongated ridges, or of that of the cross-section thereof. In one embodiment ensemble, the pitch is defined at the bottom of the surface formation, at the joint to the base without limitation to the orientation of the macroscopic target piece, as a distance of successive similar formation parts. In another embodiment ensemble, the pitch is defined at the middle of the surface formation height from the top deep to the joint of the base. In a further embodiment ensemble the pitch is defined at a height in a plane parallel to the base somewhere else. Embodiment at F is related to cylindrical surface formations having their axis perpendicular to the base plane. However, according to another embodiment of the invention the ridges can be elongated half cylinders having parallel axis to each other but also with the base surface as defined by the joint of the surface formations and the base.

The embodiment of H shows an example of embodiments with thick base, so the base thickness is larger than the height of the surface formations from the base. The surface formations in H are similar as in A, and the surface formations of I are similar to B, but only as the illustrative nature of the shown examples. A skilled man in the art knows from the FIG. 14 and the related embodiments that whatever surface formations can be embodied also with a thick plate, although not all are advantageous to the ablation.

The embodiment examples from J to P illustrate modifications to the surface formation basic form as embodied with the examples from A to I. A modification can be orientation modification, tilt of a part of the formation, or the whole formation, distance there between two successive adjacent formations in line, which can vary periodically, or in an escalating manner. A modification can be formation shape curvature in one direction, and/or in a cross-wise direction. A modification can be also a material and/or material structural modification. In one embodiment, for instance a certain cubes can be made of left-handed polarizing matter, but the next one for each in a certain direction could be made of right-hand polarizing matter. The degree of polarization or way of it could be also one modification.

In the embodiment J, the cubes of A have at least one modification of the mentioned, or a suitable combination of the above mentioned. In the embodiment K, the rectangular ridges of B have at least one modification of the mentioned, or a suitable combination of the above mentioned. In the embodiment L, the holes of C have at least one modification of the mentioned, or a suitable combination of the above mentioned. In the embodiment M, the cut pyramids of D have at least one modification of the mentioned, or a suitable combination of the above mentioned. In the embodiment N, the triangular pyramids of G have at least one modification of the mentioned, or a suitable combination of the above mentioned. In the embodiment O, the cylinders of F have at least one modification of the mentioned, or a suitable combination of the above mentioned. In the embodiment P, the triangular ridges of E have at least one modification of the mentioned, or a suitable combination of the above mentioned.

The orientation of the formations in A-I and the orientation of the formations J-P also illustrate the target material feed in different possible orientations to be used in an arrangement/apparatus for vaporization/ablation according to an embodiment of the invention.

The target material has been shown in FIG. 14 as a film-like ribbon 1400, with an indication to have the target material on one side in one embodiment only but in another embodiment on both sides. The second sided target material is indicated by the dashed line. According to an embodiment of the invention the target material is used from the film side. According to another embodiment the target material is used from the end of the target material ribbon. According to an embodiment of the invention target material is arranged into a form of a wire.

According to an embodiment of the invention the wire has sub-structure comprising several wires. According to an embodiment of the invention the sub-wires in the substructure are arranged to match to the composition of the plume and/or the coating. According to an embodiment of the invention the target material is arranged to fit into target material unit that has electrostatic means to catch particles and/or potential fragments of the target material.

FIG. 15 illustrates an operation of a scanner to be used in the radiation path according to an embodiment of the invention. The scanner is a conventional turbine scanner, or an improved turbine scanner 1502 according to an embodiment of the invention. The rotation direction has been illustrated in the figures by a curved arrow. The radiation source 1600 (not shown in FIG. 15, but demonstrated by the beam 1510) can be embodied as a laser source embodied according to diode-pump of PDAD-system or any other cold ablation capable laser, i.e. with sufficiently powered laser, preferably with 100 W or larger in total power and having pulse length of pico-second, femto-second, or atto-second, with an inter-pulse pitch, and a pulse repetition rate larger than 20 MHz, advantageously larger than 50 MHz. The wavelength can be in the visible light region, but is not limited to that only. Although just one drawn, there can be also two or more radiation sources, operable in the same path in parallel or in series, which are not limited to the embodiment of similar source nor to that with all-different sources.

In FIG. 15, the radiation beam is reflected as a reflected beam 1503 via the turbine scanner 1502 mirror surface to an optical lens 1501, to the target 1400, which can have a smooth surface structure, roughened arbitrarily or a surface structure described according to FIG. 14 or the related text. The ablation point at the target is illustrated by H and the related number to illustrate also the scan on the surface of the target. So, the H1 defines a moment when the beam 1503P, which can be polarized to a certain polarization by its production and/or the optics 1501. Polarization of the beam in one hand, but the certain pattern of the surface formations on the target as arranged to have the same polarization with a certain composition but the others with a different composition and polarization on the other hand, can be used for certain selectiveness of the ablation during a scan, at least in theory. By selecting materials that are easy to ablate and materials that are very hard to ablate, the selectivity can be boosted for an embodiment of the invention. The FIG. 15 demonstrate the scan point H1, H2, H3, H4 and H5 which forms a series of arbitrary points from the scan path on the substrate 1400. The scan path can be continuous, according to an embodiment, from the scanner mirror part edge to the next edge, but can be discrete according to another embodiment, as depending the exact repetition rate of the radiation source, and/or the rotation speed of the turbine scanner 1502, in a certain fixed geometry. Also the inter-point times T1, T2, T3, T4 and T5 are shown.

The 1503Tr illustrates the beam part, which is gone through the substrate, and thus can be used for the estimating of even each individual pulse intensities and thus for the quality monitoring. In FIG. 15 the beam 1510 formed in the radiation source meets an expander 1508, which expands the beam to tapered shape, then the collimator unit 1507 to form a curtain-like broad but thin radiation wedge to be deflected by the turbine scanner 1502, through the correction optics 1501 optionally or in addition to polarization operation so that the beam 1503P hit the ablation target 1400 at the H1.

FIG. 16 embodies a similar kind of cycle as FIG. 15. The mirror 1502 can be a Turrent mirror, other rotatable mirror with mirror surfaces or a mirror part of the turbine scanner according to an embodiment of the invention. The angles α1 and α2 are embodied in the figure to indicate the useful range α2 for the scan to avoid the beam to hit the radiation arrangement 1602 and thus instability as a consequence. Although not shown in the figure, it is also advantageous to select an optical path, so that first surface modifying beam of the radiation source arrangement does not go through the material beam, the plume, ablated from the target. The measures apparent from the FIG. 16 are only examples and do not limit the size of the rotor of the turbine scanner only to the just mentioned.

In one example of the embodiments, the primary beam has 20 μm diameter. The beam has a wavelength of 1064 nm. The optical path has been arranged so that the beam has a focus diameter at a hit spot (H1, H2, H3, H4, H5) of 20 μm. The beam has proceeded the radiation path so that it has been having an elliptic cross-section, having a width of 30 mm in one direction and in crosswise 0.02 mm, at the scanner 1502 surface to avoid burning the mirror. The scan width has been 250 mm from the beginning to the end of the path. In the example, the focused beam is provided with linear correction (1501) on whole scan width on the target 1400. The distance from the optics to the target was 150 mm in the example.

FIG. 17 embodies a foil-like/ribbon type target material, but also flat belt or solid rod like target materials and related mechanisms to be used in a target material unit to feed the target material. In the figure, the target film can be stored in a material reel, that is operated optionally by the friction of the target film pulled by the pulling motor or by a gear or by a system of its own in synchronism with the waste reel collection of the used material, so that film is tense only for the suitable part not to break. Flat solid belt-type target material sheets can be stored in a stack and as used in another stack, according to an embodiment of the invention. The mechanism can comprise breaking roll, a pressing roll to arrange the target material feed. The figure shows also a heater to be mounted in the cavity for optional heating element for the target material heating at the ablating area where the laser beam as a radiation has been indicated to meet the target material. The FIG. 17 shows the unit from several directions, also along the lines B-B and A-A as indicated in the FIG. 17.

FIG. 18 demonstrates a radiation source arrangement 1801 to be used for a plume 1802 formation for a coating application with a target material fed to the coating process by the target material unit mechanism of FIG. 17. The arrangement 1800 can be comprised by a vacuum vaporization/ablation arrangement according to an embodiment of the invention. The target material can be fed optionally by a wire or a bunch of wires, the ablation to occur from an end of the wire. In such an embodiment with wire feed of the target, the system advantageously comprises an electrostatic collector arranged to collect potential fragments so increasing the product quality and performance security for the high quality products.

FIG. 19. demonstrates vaporization/ablation arrangements according to an embodiment of the invention comprising at least one arrangement from FIG. 18. According to an embodiment, such arrangement can be arranged to operate in vacuum, but according to another embodiment in a sheath gas atmosphere, in conditions of FIG. 25 for instance. The embodiment denoted by the capital A shows an embodiment for an arrangement for one side coating of the substrate, but also a two-sided coating application as a top view. The capital B embodiment illustrates a two-side coating by a suitable arrangement according to an embodiment of the invention. The capital C arrangement illustrates a two-side arrangement in which the coating can made in a serial way to the substrate sides that are opposite. The dots in units 1801 in A-type embodiments indicate a difference to the ones without the dot. The difference can be related to the position as in C, but also or optionally to the radiation source arrangement and/or target material as embodied in the various embodiments. The number of units 1801 and 5900 indicate that there can be several units or just one as embodied in FIG. 18, however, the number of the said units is not limited only to the shown. A skilled man in the art can see from the embodiments of the invention that the relative aspects of the units 5900 and 1801 fall into the scope of embodiments of the invention, as well as the positional aspects to situate said units in various positions in respect to the gradient of gravity. FIG. 20 illustrates a coating arrangement according to an embodiment of the invention. The arrangement comprises an input chamber 2001 for the substrate to be arranged and/or prepared for the coating. The substrate to be coated comes to the chamber via the port valve 2004, which can comprise means to recognize the substrate body to be coated for the measures and/or the material thereof. The coating can be made in one main chamber 2002 for a coating. The target material unit is referred also by the plasma generator in the figure for such embodiments in which the ablation is used for the coating. The plume 1802 for a substance of a target material is indicated, which plume is used to coat one side of the substrate. Additionally also another side of the substrate can be coated. In one embodiment, there are several units in same main chamber each arranged to prepare a coating of its own kind on to the substrate for a layered coating structure, but in another embodiment, there are several separate main chambers each for a target substance, to have a better separation/purity between the substances in layers. The output chamber 2003 is arranged and/or equipped to condition the substrate as coated for the output and ready to be used.

The FIG. 21 illustrates the arrangement embodied in the FIG. 20 as a schematic diagram. The embodiment in figure comprises an atmospheric means 2101 as demonstrated by the Ar and $O_2$ containers therein. The arrangement comprises a maintaining unit 2102 and the pump controllers 2103 arranged to control the pumps that can be parts of the maintaining unit, as indicated by the lines to each controller. The maintaining unit can comprise also the necessary valves that control the atmosphere and/or the vacuum in the chambers indicated in the figure. The figure demonstrates also the pressure measurement 2107 and the valve controlling 2105 by the valve terminal. The motors of the arrangement (M) can be controlled by the electromechanical PLC-unit 2106, as well as various transducers that are used to detect the position of the substrate and/or the phase of coating in the appropriate chamber. The whole system can be controlled by a microprocessor and a memory arranged to collect the information and to control the system progress in a pre-determined way. Also the pulse control and/or count as well as the count of the beam quality can be made by the microprocessor or several ones.

FIG. 22 illustrates making a coating and/or material piece 2229 by an ablation plume 2228 from the target material 2227. The laser beam 2230 can be used to heat and/or to condition the surface of the piece 2229 in order to promote the adhesion of the material from the plume to attached better to the zone 2232, while the substrate 2231 is pulled to the direction 2233, in order to have the process going on steady for a smooth material piece 2229.

FIG. 23 illustrates a plume 1802 emitted from the target material, when an ablating beam sweeps the target material surface on 100 mm line 2377 on focus 2376. The plume has a dimension 23 of 80 mm as demonstrated in the figure. The plume can be for coating application according to an aspect of the invention to utilise the material from the plume as a second surface modifying beam, but as a material plume, which however originates to the first surface modifying beam influence on the target material.

FIG. 24 illustrates a view to a display of a control unit display of a device-embodiment arranged to control a stone or stone-plate coating process, such as to produce marble or like of surfaces. The example indicates therein that marble plate is heated at 200° C. in approximately 1000 mbar pressure to remove gas and/or water from the surface that would be, as present in certain extent, have adverse effect to the coating. Within a PLD can be used for making an adhesive layer. So that necessary deposition energy and/or chemical bonding are assured, but without changing too much the optical properties. Depending on the desired purpose of the surface, a PLD is used to coat the surface by Y/Zr to thickness of 100-1000 nm, with or without oxygen. Also Al/Ti or Y/Al to thickness of 100-1000 nm, with or without oxygen. In an embodiment the co-deposition can be made from the same metallic target so that the ratio of the substances is 3-10/97-90, in the Y/Zr example. Additional pigments and/or colorants can be added, especially if the stone plate is porous, for filling to a desired degree before the sealing of the surface to tolerate gas and/or liquid. This is advantageous for example to marble to be protected against the air pollutants of gaseous, liquid and/or mixed form. In the method, also the defects and/or expansion are controlled by oxidation to achieve transparency/opacity and/or the structure tightness. In order to keep the surface clean a non-stick coating can be used. RTA can be made with a lamp. Thermal oxidation may be used in 500° C., and/or by boiling water in certain temperature and pressure. $TiO_2$ by PLD or a polymer hybrid by a PLD can thus be produced. For instance, a marble appearance with a green stain and/or colour can be made.

FIG. 25 exemplary embodies Laser Deposition Applications in accordance of the invention and the aspects thereof. The figure shows various targets 2513 to be used as the target material. Ensemble of the examples of suitable target materials comprise carbides, nitrides, oxides, non-metallic compounds, carbo-nitride as well as alloys, polymers, silicon, and metals, but also carbon/diamond, to be used individually or in combination, however, not limiting the scope of the target material only to the mentioned.

FIG. 25 embody also several substrate 2516 examples, such as stone, metal, ceramics, glasses, plastics and composites however, not limiting the scope of the substrate material only to the mentioned.

FIG. 25 also embody substrate material utilisation 2517 as coated with target material for manufacturing tools, products and/or parts relating to the fields of semiconductors, component manufacturing, telecom, decor, space technology, turbines, medical, aircraft, weapons, defense and/or military, construction, interior, lining, energy, consumer products, motors, engines, cars, optics, nuclear and/or optical fibres. The manufacturing conditions 2514 in the example of FIG. 25 are indicated to occur for instance conditions of vacuum of $10^{-1}$-$10^{-11}$ mbar, and/or in atmosphere 2515 comprising a gas such as for example He, N, $N_2$, O, $O_2$, Ar, Ar/$H_2$, or a combination thereof. Presence of other chemicals may be advantageous in some cases, like in one embodiment water. However, the fields are only examples and thus are not limiting the scope of the fields only to the mentioned.

FIGS. 26-30 illustrate several embodiments of turbine scanner according to an embodiment of the invention. The rotation axis is indicated by a circle at the middle of the polygon in the FIGS. 26-30. Although there are shown polygons that approximate a circle as a cross-section, a skilled man in the art knows form the figures that the number of faces is not limited to the shown only. A skilled man also understands from the figures, that although the approximate circle cross-section shown, also such geometries that have a star-like structure are included as embodiments of the invention to the scope of the turbine scanner. Therein in the FIGS. 26-30, turbine scanner part 2660a is triangular, 2660b rectangular, and 2660c is pentagonal. Turbine scanner part 2661a is hexagonal, 2661b has 7 cones and faces, and 2661c has 8 cones and faces. Turbine scanner part 2762a has 9 cones and faces, 2762b has 10 cones and faces, 2763c has 11 cones and faces and 2762d has 12 cones and faces.

The above-mentioned in FIG. 26 and are with 0° tilt between the rotation axis and the face. In FIG. 27 there are also tilted faces of the turbine scanner part, shown so that the scanner part has a pyramid or cut-pyramid structure. Such are triangular scanner part 2763a, rectangular scanner part 2763b and pentagonal scanner part 2763c in FIG. 27.

In FIG. 28 the scanner parts 2864a, 2864b, 2864c, 2865a, 2865b, 2865c and 2865d are shown so that the number of the faces and the cones there between is countable for the mentioned parts, each embodying a scanner rotating part with a tilt in a non-restrictive manner.

In FIGS. 29, 30 the turbine scanner parts 2996a, 2996b, 2966c, 2967a, 2967b and 2967c as well as 3068a, 3068b, 3068c and 3068d are shown so that the number of the faces and the cones there between the faces are countable for the mentioned parts, each embodying a scanner rotating part with a tilt in a non-restrictive manner.

FIG. 31 demonstrate an optical path during a scan and the scan line, which the incoming radiation beam 3101 draws after the reflection from the scanner 3100 face as a scanned beam 3102 onto a target, during a rotation of the scanner face around the axis 3103. The incident 3103 and reflected 3102 beams are in the same plane perpendicular to the axis 3103 in this embodiment example, whose faces have tilt of 0°. The reflection plane defined by the incident and reflected beam parts is however not necessarily limited only to perpendicular angle to the axis 3103.

FIG. 32 demonstrate another optical path during a scan and the scan line, which the incoming radiation beam 3101 draws after the reflection from the scanner 3100 face as a scanned beam 3102 onto a target during a rotation of the face around the axis 3103. The incident 3103 and reflected 3102 beams are in the same plane perpendicular to the axis 3103 in this embodiment example. The tilt in one embodiment which is shown as an example, is less than 45° and in another exactly 45° or greater. As the figure demonstrates via the faces of the scanners, the scanner as such is not limited to a particular shown embodiment. Also variable tilt of the individual face belongs to scope of an embodiment concerning a turbine scanner. Another embodiment of the invention comprises a turbine scanner that has mirror faces, which have different tilts from a face to another. In an embodiment each face can be replaceable mirror face, or in another embodiment a solid mirror face. In one embodiment the turbine scanner can comprise the faces so that they form a star-shaped structure, arranged to deflect the incoming radiation. In one embodiment of the invention the mirrors are plane arranged to produce a smooth scan line, and/or focus on the target. In certain embodiments, in which the focus were advantageous to vary from a location of a scan line to another in effective depth direction on the target, the coating properties on the substrate and/or the plume should be a non constant type, a curved faced scanner can be used. In one embodiment the curvature can be the same for all faces. In another embodiment there are differently curved mirrors. In one embodiment the mirrors are curved in a concave manner, but in another embodiment to convex manner. In one embodiment the mirrors are curved only in one direction, for example in a direction defined by the segment as a plane perpendicular to the axis of rotation. In another embodiment the mirrors are curved in another direction in respect to the axis. In a further embodiment a mirror has two curvatures in different directions.

In certain embodiments of prismatic, paddle-wheel type and/or star shaped turbine scanners each mirror may have a sub-structure, so that the beam can be directed to at least two separate scan lines during a scan of the mirror movement from the first edge to the last edge of the very mirror. This can be embodied by such embodiments that comprise several planes having an angle to the neighbour plane.

A turbine scanner according to an embodiment of the invention can comprise a first mirror which is arranged to change direction of radiation beam in a radiation path and a second mirror for the same purpose, but arranged to cool while said first mirror is about to change the direction of the coming radiation in the radiation path. A turbine scanner according to an embodiment of the invention comprises exactly or essentially similar mirrors as an ensemble of mirrors, having at least one mirror, later referred as a first mirror. A turbine scanner according to an embodiment of the invention comprises exactly or essentially similar mirrors as an ensemble of mirrors, having at least one mirror, later referred as a second mirror. The first and second mirror are not necessary identical in an embodiment of the invention. A turbine scanner according to an embodiment of the invention is arranged to be rotatable around an axis, preferably through the symmetry axis of the turbine scanner having a form of polygon or comprising a paddle wheel structure. Because of very large rotation speed in duty expected for an embodiment of the invention, non-symmetric axis may not tolerate the torsion and/or wobbling around the non-symmetric axis in an embodiment. However, although if the material in the bearing or the turbine scanner itself were made sufficiently hard and/or sticky/elastic material, such a non-symmetric rotation may be used for modifying the scan duration, its length at the target, pitch of the successive scans, radiation beam geometry, power at the target, and/or the focus of the beam. Consequently in embodiment, which comprises coating of a substrate, the plume form and/or structure can be utilised.

According to an embodiment of the invention the turbine scanner is embodied as a polygon, which comprises an ensemble of mirrors arranged to form a polygon with faces of which said first and second mirrors are. In an embodiment, said first mirrors have a different tilt angle as said second mirrors in respect to the central axis of polygon. Because of the very high in-duty-speed of rotation, the turbine scanner according to an embodiment of the invention is arranged to rotate by means of a fluid bearing. The fluid can be liquid, however, the drag force resisting the movement may be large, so at least the surface of the bearing may be advantageously covered by gas. One suitable gas is air for an air bearing to be used within the turbine scanner, but in one embodiment also other gases and/or liquids may be used in various forms to minimize the friction-related forces in-duty of the scanner. In an embodiment Helium is used, in such a variant of the embodiment at the-near-zero point temperatures.

It is advantageous to cool the mirrors while off duty by a fluid. The cooling can be arranged by feeding a cooling fluid on the mirror surface, but preferably at the opposite side of the mirror to avoid any deposit slag from the fluid to the surface. This is advantageous if reactions of the mirror surface and the coolant are to minimized also in long term. In an embodiment of the invention, the turbine scanner has an inner-side structure that operates as a pump for a fluid to be used for the cooling. In such an embodiment the turbine scanner piece is made form warm conducting material. According to an embodiment of the invention, the material is metal. According to an embodiment of the invention, the material has diamond structure. When using mechanical bearings instead of air or magnet field based bearings, the fluid can be different than at the mirror surface. Consequently in such embodiments, liquid can be used for the cooling, when the feed is arranged via the hollow space in the axis for instance. According to an embodiment, the cooling is mad by liquefied gas, which is sprayed on the mirror as an aerosol with suitably fine particle size, which particles evaporate and yield a thermal flux that maintains the cooling of the off duty mirrors. In one embodiment, carbon dioxide can be used for cooling of the mirror during a sublimation into a gaseous phase from a mirror surface.

According to an embodiment of the invention the at least one of the first mirrors and/or second mirrors are made of diamond. The skilled man in the art knows very well from the embodiments, that the first and second mirrors are only examples of using different kinds of mirrors in the turbine scanner, and thus a scanner that has more than two ensembles of mirrors at the polygon shape belong to the scope of the embodiment of the invention directed to the turbine scanner thereof.

According to an embodiment of the invention the turbine scanner according to the invention is arranged to form a paddle wheel so that the paddles thereof are mirrors of the turbine scanner, arranged to be rotatable along a circular path around the central axis of said paddle wheel. In a variant of the embodiment each of said mirrors in said paddle wheel are arranged to a sharp angle with a tangent of said circular path. Irrespective has the turbine scanner embodied as such as a polygon or paddle wheel, the mirrors can be arranged so that first mirrors have a tilt angle with said axis of said paddle wheel. According to an embodiment of the invention, the turbine scanner comprises an ensemble of mirrors with a first tilt angle and mirrors with a second tilt angle, however, without any intention to limit the number of the ensembles of different sub-ensembles with such a specific tilt angle. According to an embodiment of the invention a tilt angle is adjustable during the duty cycle to have an extra freedom to the beam at the path. According to an embodiment of the invention, a mirror itself and/or a part of it can be replaced by another one so that it is not necessary to replace the whole scanner itself, for an ordinary maintenance.

According to an embodiment of the invention the mirror surface itself comprises the target material. According to an embodiment of the invention the mirror may be not a mirror in conventional sense, but it can be replaced by a porous material, that allows a diffusion-like feed through from the inner parts of the polygon to the outer surface of the turbine scanner for a gas and/or liquid-like fluid. An advantage of such an embodiment is that the simple structure of the target feed for certain kind of target materials to be ablated, provided that the surface itself with the pores tolerate the radiation beam and the plume direction has been arranged, say, by electric fields for instance to the substrate.

A turbine scanner according to an embodiment of the invention comprises a mirror that has a diamond surface. The diamond structure may be not only at the surface in an embodiment of the invention, but the whole mirror may be made of the diamond. According to a variant of an embodiment of the invention the whole turbine scanner is made of diamond. According to an embodiment of the invention diamond bodies can be made according to the various aspect of the invention. According to an embodiment of the invention the turbine scanner is dimensioned to the same scale as the beam to be deflected. In such an embodiment of the invention the heat transfer and sufficient cooling of the off duty mirrors actually define the lower boarder to the scanner size, which can be down to the millimeter scale and even further down, provided that the material tolerate the radiation beam at the radiation path to be deflected and the consequent heat. An advantage of using small-scale turbine scanners is the lightweight and the rotation speed may be increased as high as the material can tolerate as a whole without breaking by the forces relating to the rotation as such. According to an embodiment of the invention, the turbine scanner rotor is made of aero-gel for a lightweight structure. According to an embodiment of the invention such an aero-gel piece of said rotor is at least coated on the mirror surfaces. According to an embodiment of the invention diamond plasma is deposited into the aero-gel structure to yield a thermal flux from one surface to another across the aero-gel material for facilitating the cooling of the rotor.

FIG. 33 illustrates a prismatic low-faced turbine scanner 3321, but especially the rotor part of it 3321. The part 3321 can be a conventional turbine scanner part, but also a part according to an improved embodiment of the invention. In the example of the figure, the part 3321 has faces 3322, 3323, 3324, 3325, 3326, 3327 and 3328. The arrow 3320 illustrates the rotation of the part 3321 around the axis 3103. The faces are mirrors, each of which in-duty, arranged by its own turn, to deflect the incoming radiation beam via the radiation path and to cool when the mirror is off-duty. Tilt angles of the faces are shown for various embodiments. The FIG. 33 illustrate one revolution of the turbine scanner part in time scale from the first mirror, mirror 1, to the last mirror, mirror 8. The scan line 3329 is indicated on a target, which can be any target material according to an embodiment of the invention, but also any other target material with a sufficient structure to cold ablation. The return of the beam is indicated by the line 3330. The mirrors are indicated by the apparent reference number. Although 40-μm-scan line has been demonstrated as an example, embodiments of the invention are not limited only to shown beam size. The location of the scan line on the target material may be the same in one embodiment for at least two successive scans, but the scan line for two successive scans can be different in another embodiment, if for example, the material is likely to form fragments even in cold-work based on ablation. The number of faces is not limited to the 8, which is only an example in the figure. Faces can be of tens or even hundreds in number, however, influencing to the scan line length.

In one embodiment of the invention number of different scan lines at the target surface can be achieved by variation of the tilt from face to the next face of the turbine scanner, or in another embodiment by changing the face tilt of at least one mirror or several mirrors.

The turbine scanner has an advantage that the beam won't stop one location at the target and thus the yield is rapid and homogenous during a scan resulting a homogenous plume from the target.

The size of the turbine scanner is freely scalable for a skilled man in the art who has read the application text. The embodiments comprise variations of microscopic scaled to macroscopic scale so that in the macroscopic scale according to one embodiment the diameter is about 12 cm and height 5 cm. The distinction of low-faced turbine scanner from a high face turbine scanner can be made by the measures of the height of the mirror in an axial direction in relation to the width of the mirror in a perpendicular direction of the axial direction. If the height and width are essentially the same, or exactly the same such an intermediate embodiment is included to either low- or high-faced embodiment according to the ratio so that if the height is smaller than the width, it is low-faced but if the height is larger than the width it is high-faced.

It is advantageous to use turbine scanner in the radiation path for such systems in which use pico-second laser systems whose repetition rate is above 4 MHz, advantageously over 20 MHz and/or the pulse energy is above 1.5 µJ.

It is advantageous to control the radiation power at the target. Thus, even each pulse can be evaluated and the knowledge on the departures of the pulse/radiation properties from pre-defined values can be used in a feed-back loop for controlling the radiation beam focus, the ablation of target material, substrate coating, and/or the plume formation.

FIG. 34 illustrates a layered structure on a substrate. The substrate 3473 can be any substrate, but the FIG. 34 uses plastics as an example of the material. The layers are indicated at one side by the letters A, B, C, D, E for the layer structure at one side of the substrate 3473. Although there is a similar layered structure 3475 on the other side of the substrate, the number of individual layers is not limited only to the indicated, nor the number of coated sides of the substrate, which can be coated only on one side, or several sides, including possible cavities or inner sides that can act as substrate. The item 3457 illustrates a vehicle's windscreen, but that can be as well a window and/or a winds screen of a boat, ship submarine, motorcycle, aeroplane, or a window of a vehicle or of a building. The substrate can be plastics, glass or a composite. The substrate 3475 can be coated on one surface by a first coating, but optionally or in addition on another surface by a second coating. The substrate can be coated by a third coating, however without limitation to the number of the coating layers at a side. One coating can be solar cell coating, i.e. coating with suitable layers arranged to form a solar cell, which could be transparent according to one embodiment for a range in visible light. The word "glass" refers to window glass of various windows and/or screens made of glass, plastic, a composite and/or a combination of the just mentioned. Some layers are indicated as an example for a layered windscreen. The layers can be in a laminated glass structure. In addition, also bodies of the above-mentioned objects can be coated, including civil used objects as well as military related vehicle bodies. In military applications also stealth related coatings can be made in suitable part. Also sunglasses, spectacles 3417 and/or shields and visors 3420 of various kinds can be coated.

FIGS. 35-52 illustrate examples on several kind of coatings to be made in accordance of aspects of the embodied invention. The coatings and/or carvings can be made according to the method and/or arrangement according to the embodiment of the invention. The processed surfaces can be inner and/or outer surfaces of the bodies.

Figure 35:
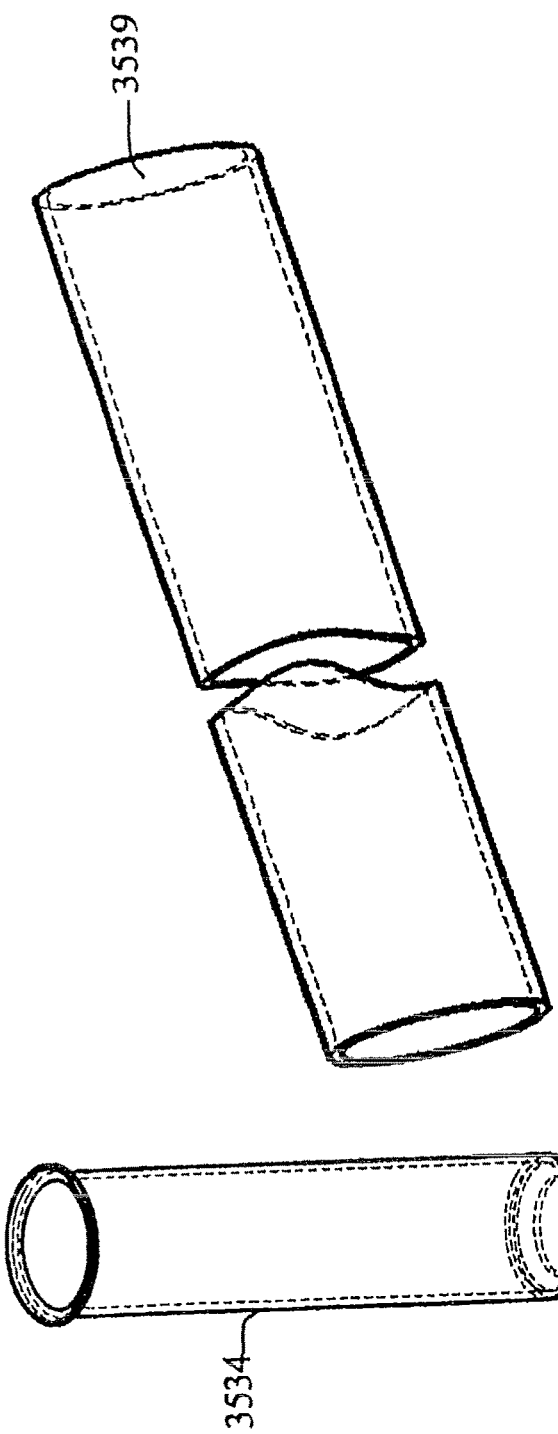

FIG. 35 illustrates tubular structures 3534, 3539 to be coated according to an embodiment of the invention. Tube can be open-ended 3539 or sealed at least one end one 3534, depending the tube and/or the intention to be used. The tube can be coated inside as shown in the figure and/or also outside, according to the conditions appropriate therein.

The tube can be a part of a material transfer line, such as for instance, water pipe, sewer, gas pipe, oil pipe and/or a connector thereof. The wear-out and/or corrosion exposed parts of the tube can be coated. For instance in heat exchange surfaces the wear and/or corrosion resistant materials can extend the in-duty time for the parts as coated. Suitable materials can comprise carbo-nitride and/or diamond as coated on the surface according to an embodiment of the invention.

Figure 36:
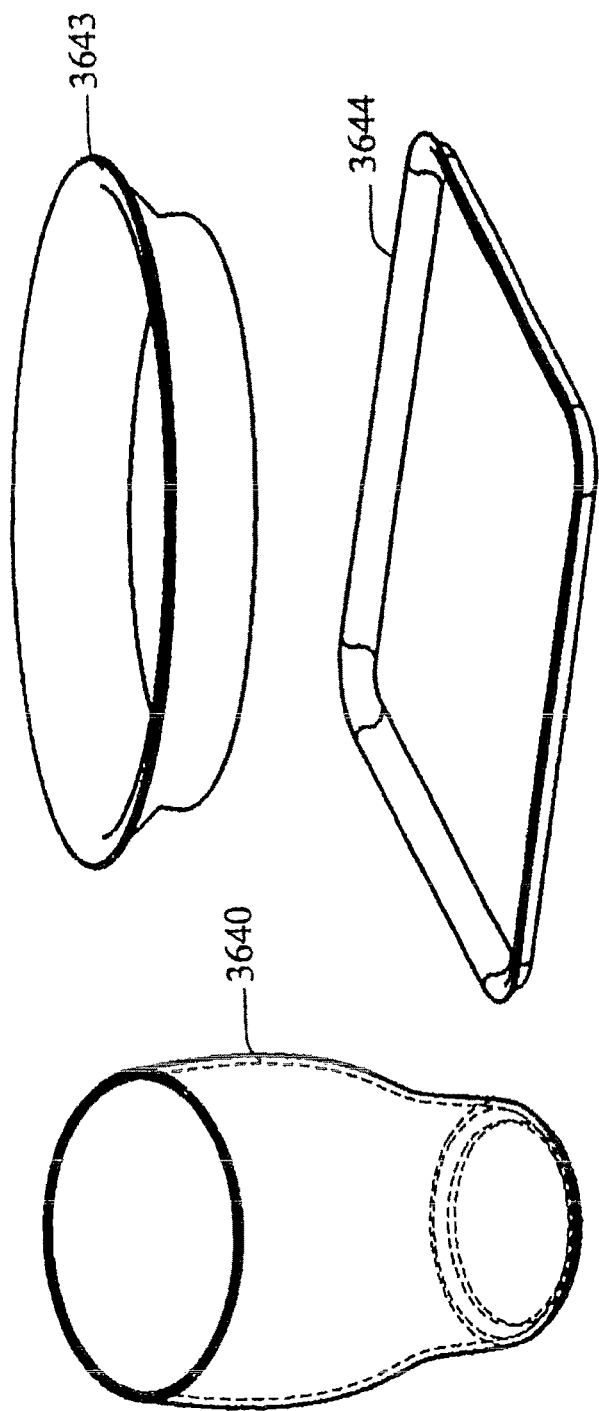

FIG. 36 demonstrates coatings of several kinds of vessels. Any glass 3640, plate 3643, saucer 3644 can be coated by using embodiments of the invention. Although the examples relate to certain shape, geometry and/or degree of transparency, the coating examples embodies also vessels and/or jars to be used in domestic purposes, in chemical industry, laboratory related purposes, medical equipments as well as reactors of different kinds in several industries. The material of the vessel as such as uncoated is not limited to any special, but metal, ceramic, plastics as well as glass, or a suitable composition thereof can be used for the substrate in the vessel form.

Figure 37:
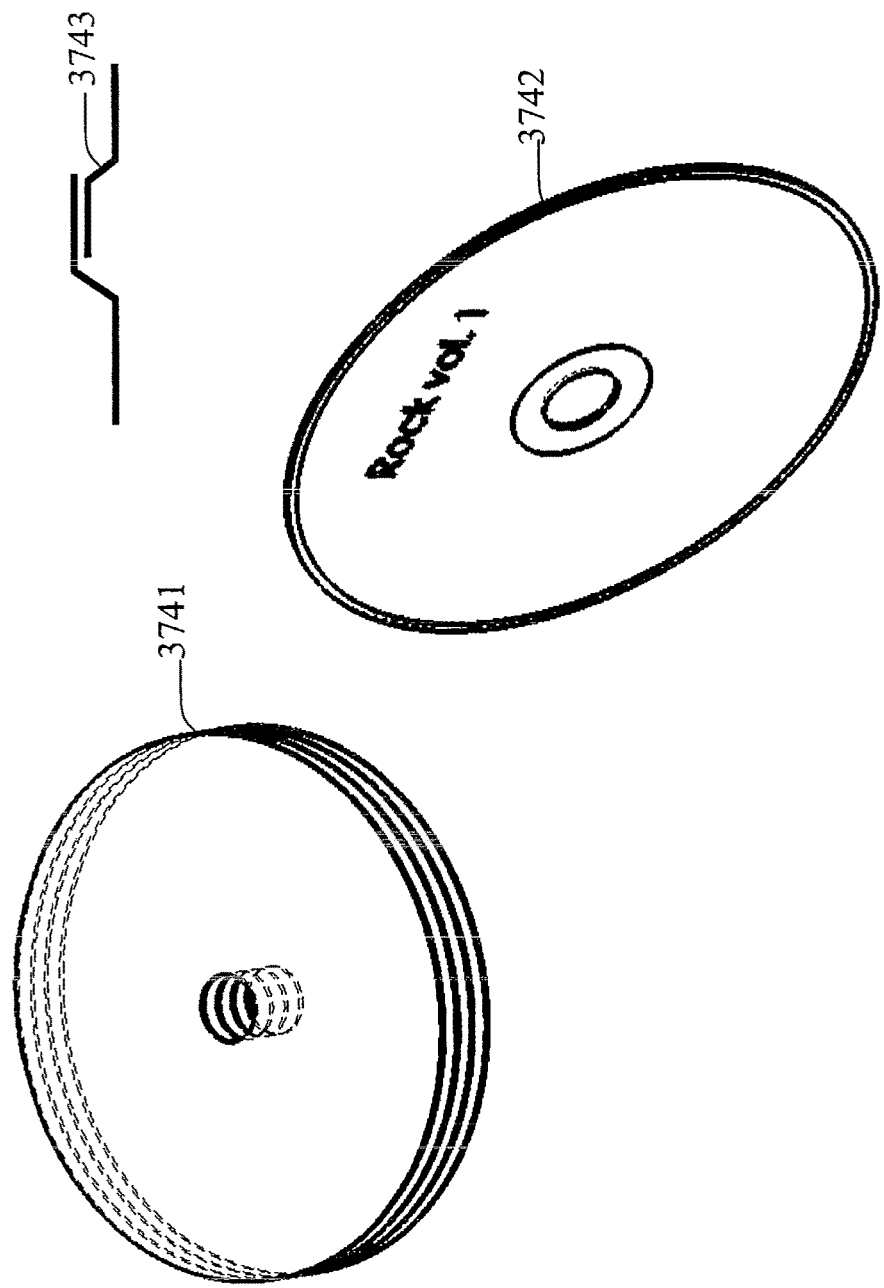

FIG. 37 demonstrate coatings to be used to coat hard disk parts 3741 of a computer, embodied for optical and/or magnetic saving, DVD, and/or CD-disks 3742, or other media that can be used to carry information, pictures and/or music in any readable form. The reading head of a hard disk can be manufactured and/or have coated in suitable part according to embodiments of the invention.

In the same figure, also the part 3743 demonstrates any electro-mechanical component to be coated at least on the mechanical part that is exposed to wear. Thus, any electrical contactors can be thus provided with a surface that improves the wear resistance, with a suitable electric resistance gained by the substrate material selection in combination with the coating material as doped in the necessary part for the particular purpose. Also thin-film wires can be provided on the substrate, and also with suitable magnetic material on a substrate to be used as a case for a protectable object, an RF-protection can be provided for said object with a coating according to an embodiment of the invention. The components can be of normal electronical component size, but however, they can be so called micro-mechanical elements, in microscopic scale, nano-scale devices or intermediately sized objects of mechanical use and/or electrical components.

Figure 38:
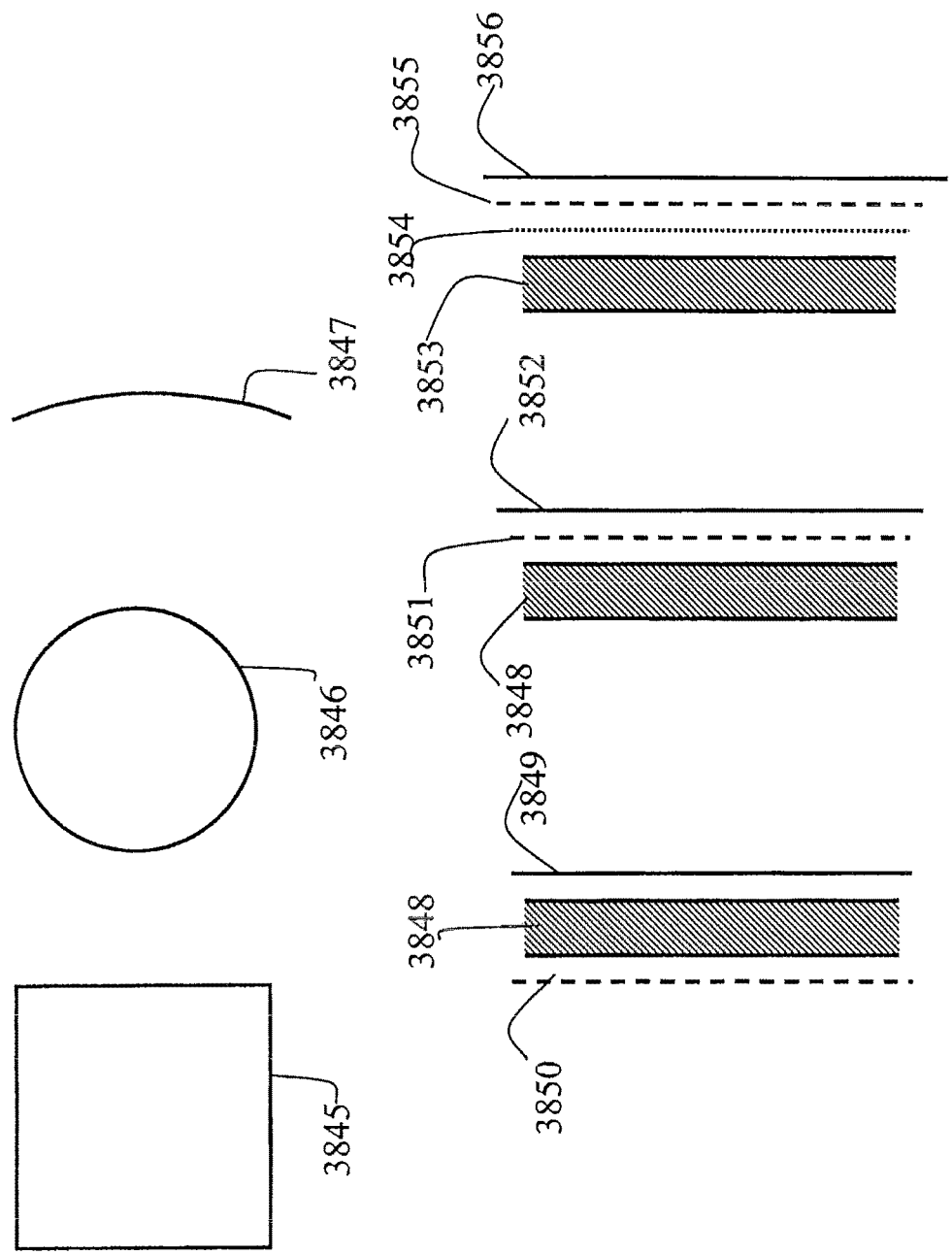

FIG. 38 illustrates utilisation of embodiments of the invention for coating substrates to be used for windows and/or mirrors. In the figure, the mirror 3845 comprises a glass layer 3848, behind of which there can be silver, aluminium, or other suitable substance to form the reflective layer. The layer can be self-cleaning layer in one embodiment, polarizing layer, and/or IR-reflective in other embodiments. The layer 3849 at the other surface of the glass layer 3848, can be embodied as a layer structure 3849 suitable for a photo-catalytic reactions and/or as solar-cell-comprising-layer. Such layer can be transparent at a wavelength range of visible light, but arranged to transform other radiation to electricity. The body 3846 can be as a substrate made of metal or other material according to FIG. 25. The body can be coated from one side by a first coating 3851 but also by a second coating 3852 on the other side. The body could be a lens 3847, convex, concave or a combined lens, a spectacle lens, to be coated with a suitable coating. 3854, 3855, 3856 on the lens material 3853.

Figure 39:
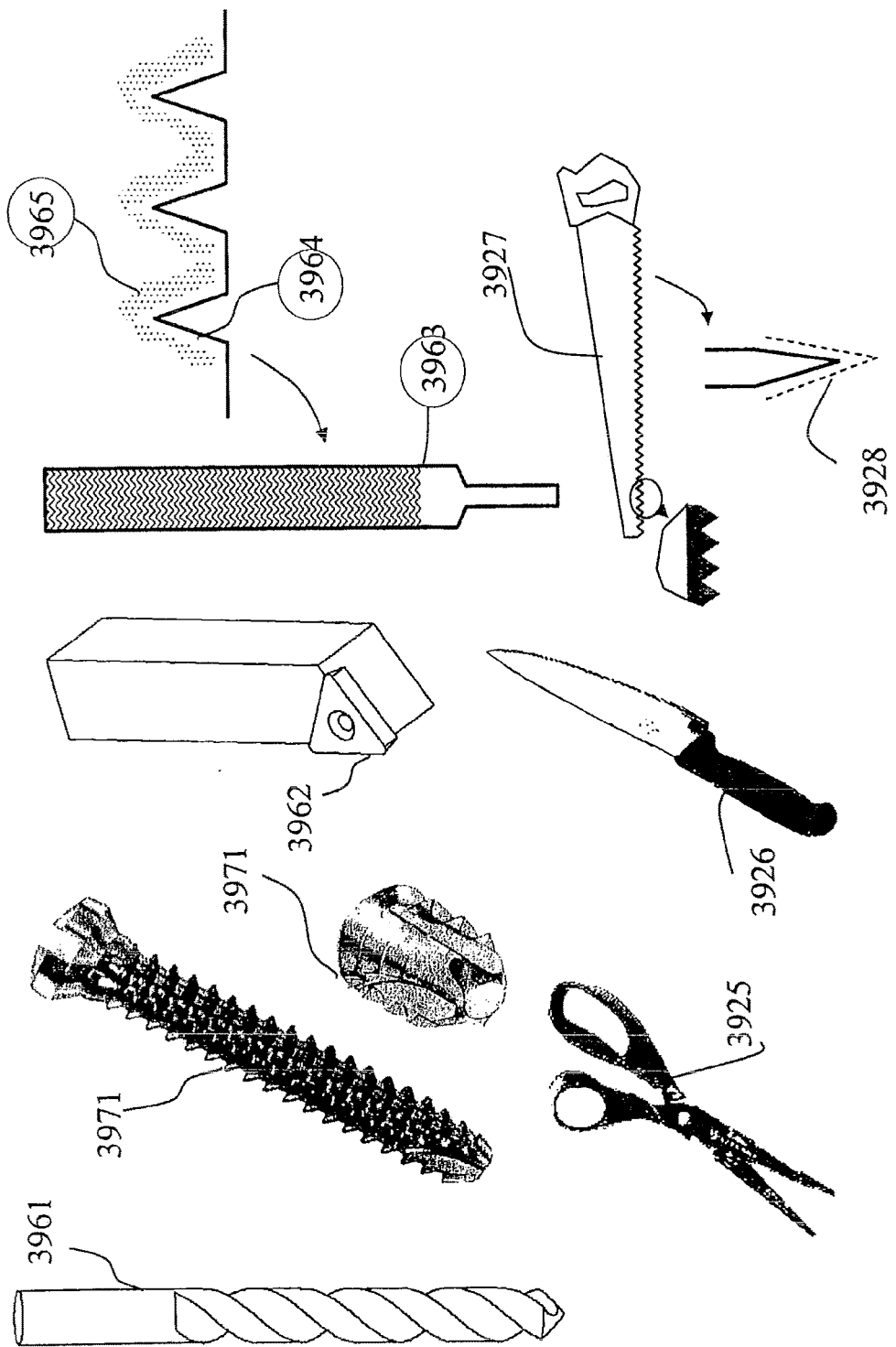

FIG. 39 illustrates use of embodiments of the invention to coat tools and/or parts thereof. The bore 3961 is just an example in the figure, as well as the edge or blade 3962. They symbolize in addition to bore or drilling means also parts of lathes or any kind of a turning machines. The knife 3926 symbolizes use of coating as various cutting means of various kinds, from a kitchen blade to industrial blades in butcher's and/or bakery use, as manually utilizable or as a machine part. Also blades of scissors 3925 can be coated. Scissor blades are not limited to the FIG. 39 exemplifying a pair of domestic scissors, but also garden scissors are included in to the scope of use for coating as well as scissors like cutting means. The saw 3927 is just an example of serrated blades and/or saws, without any intention to limit the scope only to the indicated form of linear type of serration. The whole saw blade 3927 can be coated, or just a part of it. Also rotating saws can be coated. Saws can be hand operated, motor operated, and/or parts of an industrial machine. Also any handle of any tool can be coated. The item 3963 illustrates file to be coated. Individual spike and/or ridge 3964 is indicated in the figure as a magnification taken from the file, as well as the coating on the file surface 3965 at the ridge. The item 3971 is not a tool as such, but related to bore, so the attachment means with several kinds of spiral structure are also included. Although the item 3971 as indicated in the figure has a screw structure, also nails of various kinds of studs and rivets are included to the coatables by using embodiments of the invention.

In addition to the blades aimed for cutting, also spoons and/or forks as well any dining means can be coated for the wear resistance, to improve cutting performance and/or the appearance to give a certain artistic look.

A tool to be coated, although may be not directly indicated in the figure, according to one embodiment, a hitting means as a hammer or axe, wedge, chain saw or a rotating cutting circle, or rotating file, brush or a cloth made of coated fibre. Although file has been indicate, also sand papers or various means of emery or the kind as well as any grinding means, grinding wheels and/or linearly movable grinders are included into the scope of an embodiment of the invention to coat.

The attachment means in the figure can be normal hard ware store sold products but coated according to an embodiment of the invention. The coating can be used to increase or decrease the corrosion resistance in the environment. In building and engineering environments, generally taken, corrosion as such is not a desired phenomena and thus to be prevented with a suitable surface material protecting the means, but in case of fixing a broken bone there can be situations, in which the attachment means is desired to join into the bone structure without further edges as an example of an attachment means made of material that is to be corroded in sense to join the surroundings. Lower friction, less damage to bone, less failures, no corrosion in the critical parts of the attachment means that would weaken the structure weaker than the surrounding material, and where necessary, easy to remove. The attachment means can be also coated with lubrication-provider type substances to ease the attachment itself.

Also medical tools for surgery, for instance, operate better as coated according to an embodiment, the knives having a better cut-pattern, when for example diamond-coated with an embodiment of the invention. The smooth surface of diamond coating promotes also the hygienic aspects of the tools. So, the forceps, scissors, scalpels, supports as well as artificial parts as joints, for instance, as coated by a diamond coating according to an embodiment, tolerate the use, but also increase the hygiene in surgeries. When a screw for attaching a bone is coated by diamond, the irritation of the tissues of the patient can be minimized. The friction is also lower when mounting a bone with a screw, and thus the potential damages to the bone can be possibly avoided at least in some extent, if not totally.

Other attachment means suitable for the coating are various supports and/or iron angles. The attachment means can be also very specific kind of structures used in spacecrafts, aeroplanes, and/or ships as well as in sub-marines, including also military related attachment means.

FIG. 40 illustrated coated parts of guns of various kinds. Although only barrel 4071 of a pistol is shown having an outer coating 4072, also any other part of the pistol or all the other parts 4073 in suitable part can be coated. The barrel or several barrels of a gun can be coated, optionally or in addition also inside. The smoothness of the barrel decreases the friction and thus heat formation of the barrel, which thus may be minimized. If the ammunition as well has a smooth coating, the matching there between the barrel and ammunition may be improved, which improves the hitting accuracy by the gun provided with such a barrel. This is useful also to improve resistance to wear away the barrel during the use of it, and thus increase the lifetime of it.

The decrease of the friction is useful in military related, and/or other machine guns, appearing as decreased need for cooling so making also portable guns lighter to handle, but also in the automatic weapons in the loading system performance. Although hand guns for civil related as well as military related pistols and rifles are included to the scope of the coating of the barrels and/or other parts, also cannons of various kinds are included. Also revolvers, or parts thereof as well as those of one- or two-shot shotguns are included. Also bazookas, the parts thereof as well as rocket launchers are included as well as the parts thereof to be coated in suitable part. Also the ammunition, the shells, grenades and/or bullets as well as their parts can be coated against corrosion, but also by a lubricant that protects the barrel and/or decreases further the friction, where not desired.

Figure 41:
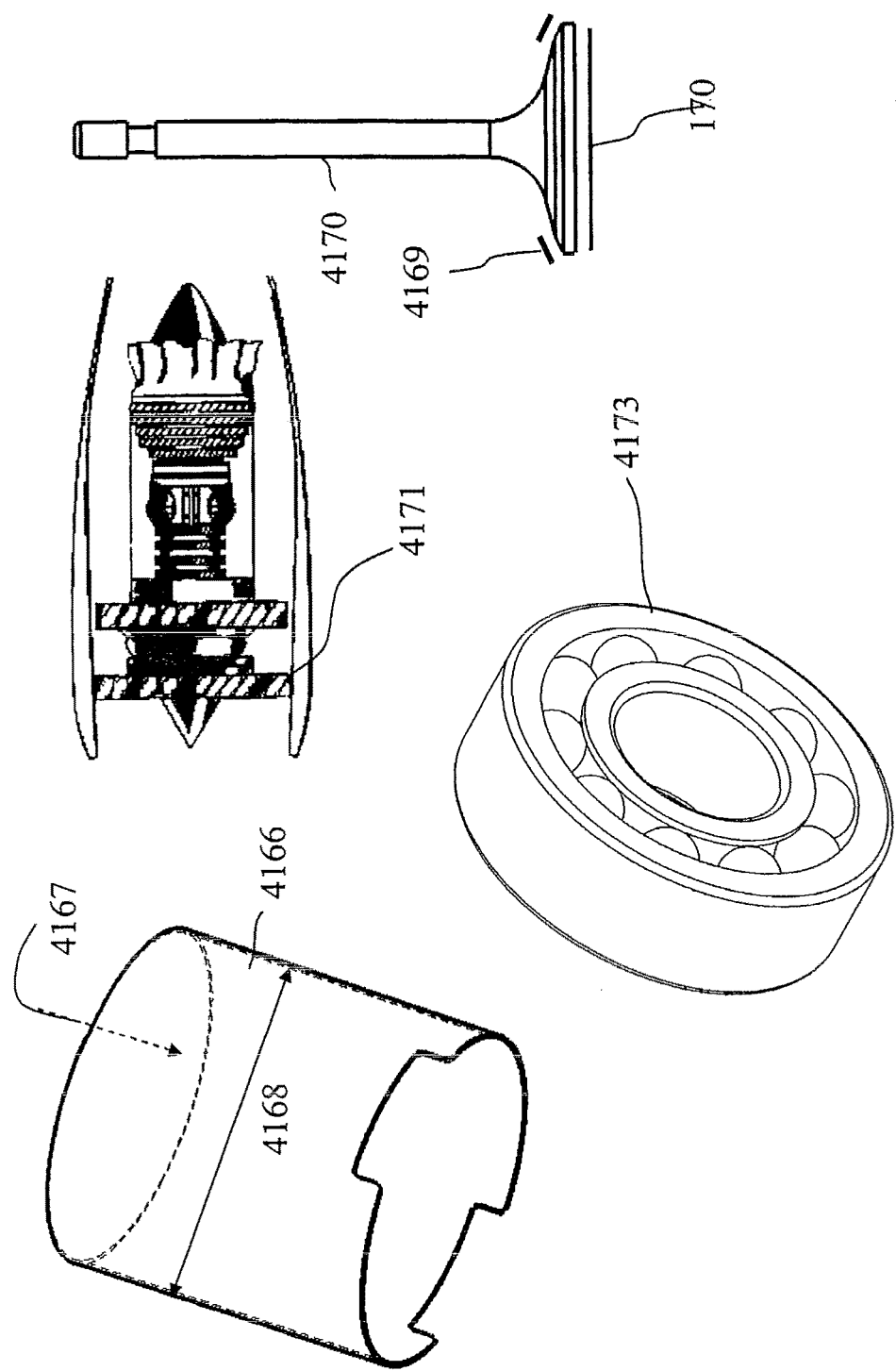

FIG. 41 illustrates use of an embodiment of the invention to coat a motor part. The motor can be actually any kind of combustion related engine. The figure shows a cylinder 4166 surface, which can be a surface 4168 inside, outside and/or other combustion space of the cylinder. Also the piston meant to move in the cylinder can be coated. Any Otto-motors, steam engines, as well as wankel-motor-parts can be coated. Also jet or rocket motors or the parts thereof can be coated. Turbos or turbines can be also coated in suitable part to increase the resistance against the wear out in the operation environment. For example, diamond coating can increase smoothness and thus decrease the friction, and the wear out time can be extended also by using for instance carbo-nitride at the friction surfaces.

Turbine parts 4168 are demonstrated in FIG. 41. Other motor parts are demonstrated by the valve to be coated in suitable part. Also cams, camshafts, crankshafts, chains, gear wheels, spiral and/or conical gear-parts can be coated against the wear out and/or corrosion. The figure shows a ball bearing structure 4173 to be coated by using an embodiment of the invention at least partly if not all the parts. However, also other kind of bearings are also included independently on the shape of the bearing-surface and/or its curvature, so comprising bearings from nano-scaled embodiments up to the embodiments to coat largest bearings, such as those of nuclear power plant generators. Thus all kinds of bearings comprising spherical, cylindrical and/or conical bearings are included to the coatable bearings. According to an embodiment, diamond coating can be arranged to conduct warmth so that the bearing won't get heated as a usual non-coated bearing. It is also possible to manufacture the whole bearing part from diamond. Even the macroscopic bearing surfaces can be made smooth easily according to an embodiment to meet nano-scale precision of ±30 nm, advantageously ±10 nm, and more advantageously ±3 nm, or within even a smaller range in an embodiment.

Such a coating also avoids micron sized unnecessary and/or harmful particle fragments larger than 70 nm on the bearing surface. In an embodiment, no particles at all are formed on the surface of the bearing. According to an embodiment of the invention any bearing part could be made by the 3D-printing according to an embodiment of the invention.

Figure 42:
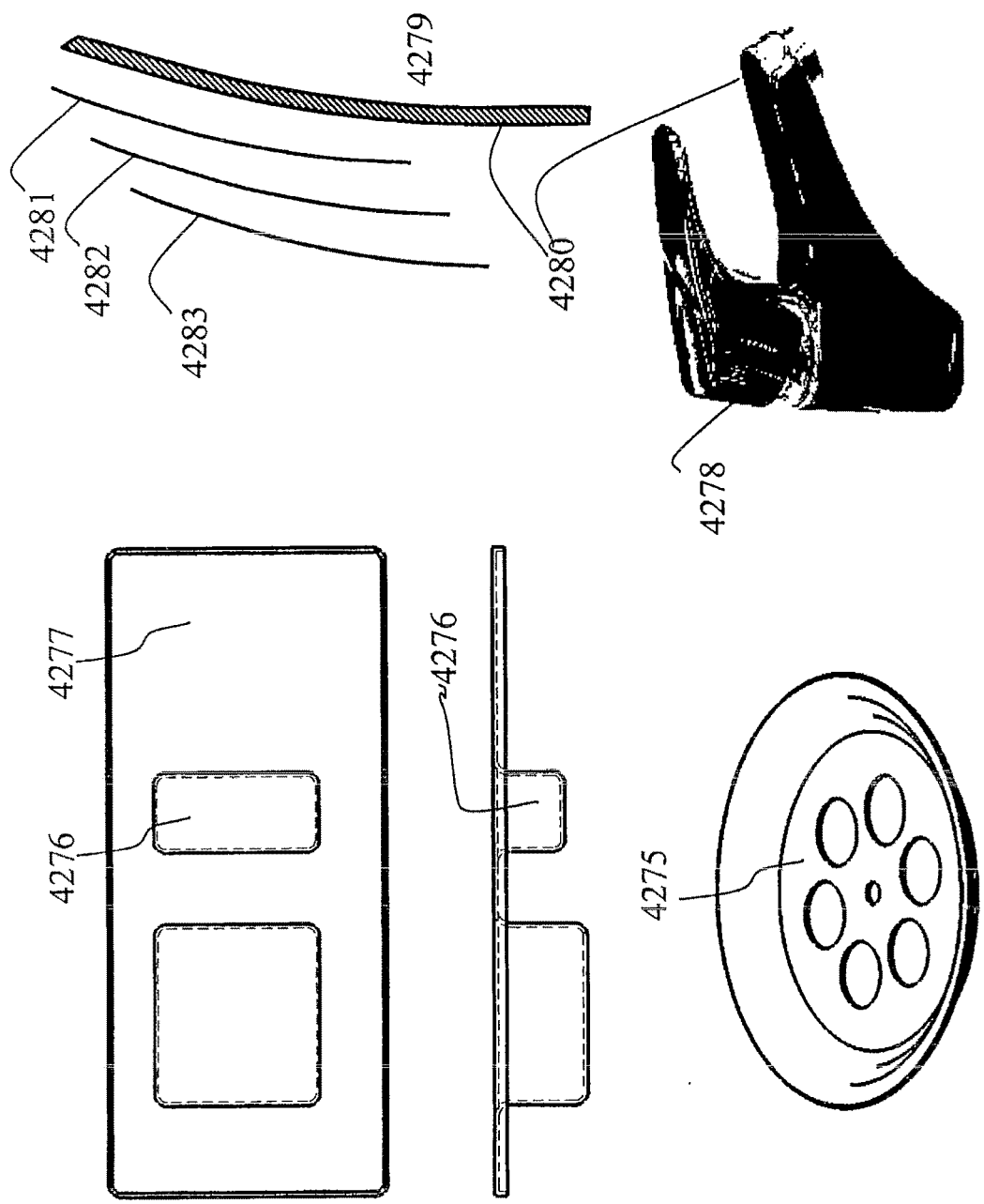

FIG. 42 illustrates water-piping related coatings to be made according to an embodiment of the invention. The bottom sieve 4275 illustrates sewer related piping as well as other parts relating to the waste water management related parts. The desk 4277 demonstrates the coating to any metal desk, or another desk. The sink of a kitchen desk, domestic, medical and/or industrial desk can be coated as demonstrated by the parts 4277 and/or 4276. The sieve 4275 can be part of such a bowl or sink 4276. The tap 4278 demonstrates coating of a tap or another kind of kitchen/bathroom related water valve, but also any kind of a tap used in industry, medical, and/or foodstuff related applications. So, the tap and/or the sink can be made of metal plastic or ceramics in suitable part as substrate 4280, to be coated by laser ablation generated copper, gold, chrome, or an alloy, and/or finalized with laser ablation. Electrochemical etching could be used in addition as well as catalysts to improve attachment of certain layer on the substrate, if they do not fit without such treatment as such together. In the figure the coating is demonstrated at the outside the tap by the layers 4281, 4282, 4238. However, the number of the layers is not limited, not side of the tap. Although not indicated in the figure also the inside wall 4279 of the tap as substrate can be coated. In the example, the layer 4281 can be an adhesive layer, the 4282 could be a gold layer, and the layer 4283 a wear resistant transparent/and or stained diamond layer, so to have the tap for instance coated for a certain appearance. However, the layers can be less or more, depending the appearance and/or degree of resistance against the wear out and/or corrosion desired. Also self cleaning coatings can be used for the coating in the tap water and/or sewer related pipes, connectors and/or valves. Antistatic coatings can be made, and thus for instance oil-refinery related piping can be produced without in-use risk of electric sparks.

Figure 43:
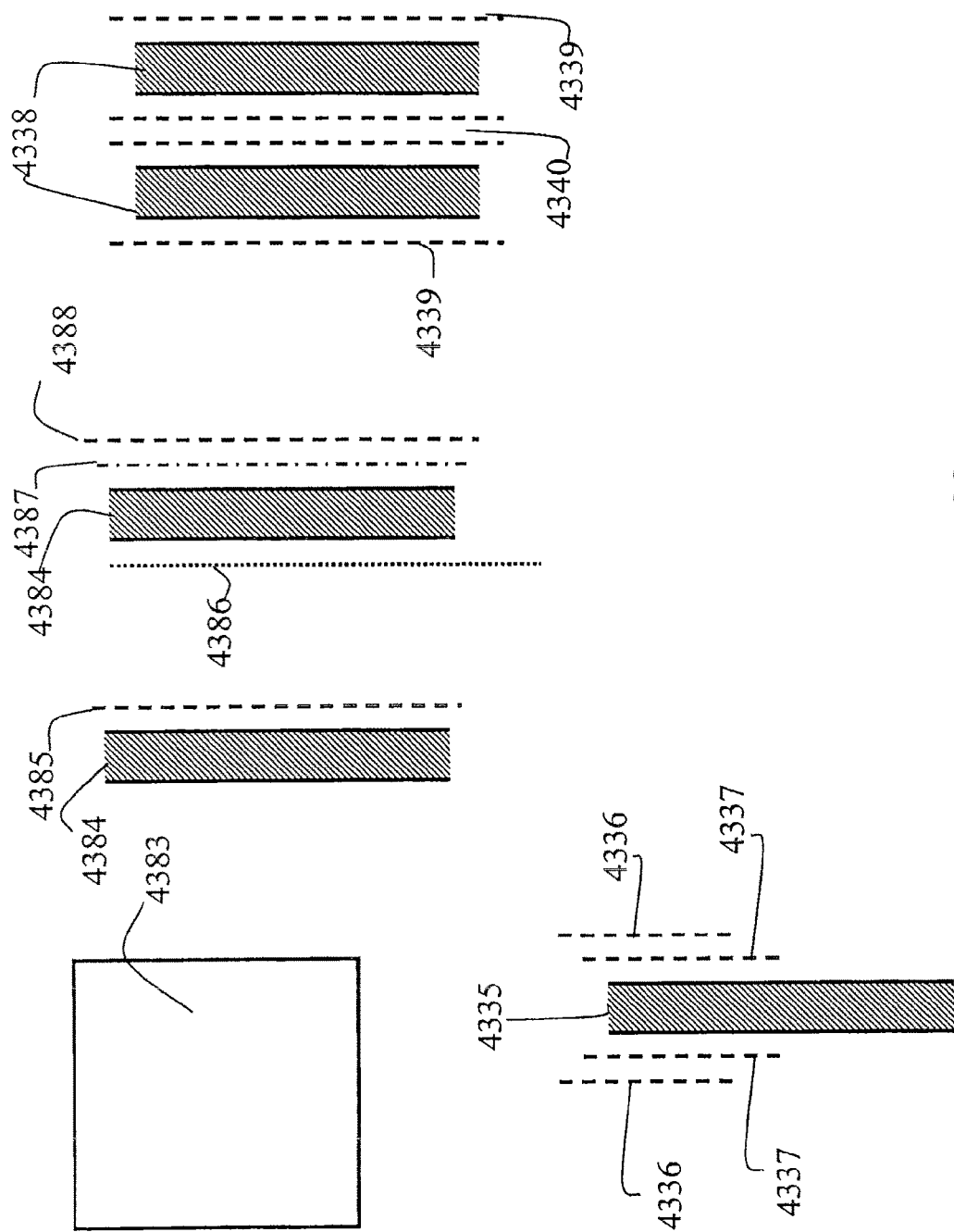

FIG. 43 demonstrates coating of a window 4383 made of glass, and/or plastics. The use of embodiment of the invention can be addressed to making a self cleaned 4384 coating. The window can be coated inside, for example against infrared stop coating 4386, but outside with a coating 4387 to tone or stain the glass at the outside. The outer most coating layer could be provided with a photo catalytic layer 4388 to achieve visibility in sufficient level.

The substrate can be an ordinary glass, but also a glass or other substrate material to achieve a laminated structure. One of the layers can be a polarizing layer 4337 to decrease adverse effects of bright light to a pilot or driver, but the layer can be photo catalytic layer 4336 to keep the glass or window clean. It is also possible to manufacture layered window structures on substrate 4338 with a diamond layer 4339. It is also possible to utilise a structure with a plastic layer 4340.

FIG. 44 demonstrates use of an embodiment of the invention for coating a stone and/or ceramic surface 4489. The surface can be inner surface, or a plate outside on the yard, marble or synthetic ceramics, which can be stained 4490 to green, and can be additionally provided with a diamond coating 4491 for increasing wear resistance.

FIG. 45 illustrates use of an embodiment of the invention for coating a metal element 4592. The surface can be stained with a colorizing agent as a layer 4595, after which the surface can be coated by a layer 4594 of carbonitride and/or diamond for increasing the wear resistance and/or corrosion resistance. The element can be a building element for inside and/or outside use to be used for building a house, bunker, other building, tank, car, ship, boat, or other moving vessel as a lining element. In military applications also stealth coatings can be made to protect the objects being observed by radar.

FIG. 46 demonstrates use of an embodiment of the invention for coating of a television 4696 or other similar kind of a display or a part thereof. However the surface to be coated can be an inner surface, and/or an outer surface. The shown example appears to be an EAD 32", however not restricting the unit by any means only to the shown example. The front surface of the television appears to be of type of having OLED, LCD or plasma TV. A coating 4697, 4699, 4600, 4601 material for a screen substrate 4697 can be selected from the usual materials, but can comprise also diamond coatings and/or photo-catalytic coatings to keep the screen clean and/or unscratched. Also other surfaces on electronic devices can be coated. For instance, ipods, video recorders, DVD-players, record players, CD-players, and/or radio receivers, but also refrigerators, stones, air cleaners with their filters etc.

FIG. 47 illustrates use of an embodiment of the invention for coating of railings 4702 and/or door handles 4703, but also other kind of pullers or handles as well as hinges of several kinds in industry, business and/or for domestic use.

FIG. 48 illustrates use of an embodiment of the invention for coating of lightning elements and/or parts thereof. The mirror 4804 of the light-element can be stained with a suitable coating 4805 for a desired wavelength distribution for instance in a plant house, but also the light bulb itself or other light source can be coated inside or outside of the cover 4806. Additionally, sealed light providers can be made, so that a cover piece 4807, (of glass, plastics, composite or laminated) can be coated to comprise a suitable staining coating. Photo-catalytic coatings are also possible to provide clean optical surfaces for a coated surface, also for other surface, not only for mirror of a lighting device.

FIG. 49 illustrates use of an embodiment of the invention for coating of a wing surface of an air-craft device. The surface can be an inner 4909 surface and/or an outer 4908 surface. Especially, when the inner parts of the wing are to be used for fuel tanks, the surfaces are advantageous to make by an anti-static coating, which can be light and hard, which properties can be achieved by diamond coating made by an embodiment of the invention. The coating made as sufficiently thick can also support the wing structure and thus the weight of the wing can be lighter. Smooth surface arranged to minimize friction of the air decreases fuel consumption as well. So, sufficiently thick diamond coatings can be used, but also with other coatings also in laminated structures to achieve sufficient strength/hardness.

Thus, the wing structure can be made so that the wing structure 4910 has on one side a coating 4912 and on another side a coating 4913, which can be diamond coating. Stiff structures can be thus made, but also arrange them to tolerate hard loads at a bending or alike area 4911. Such areas can be strengthened by the coating so to tolerate better local stresses, such as the motor mounting areas on aeroplanes frames wings and/or other body parts, for instance.

FIG. 50 illustrates use of an embodiment of the invention for coating of carbon-fibre composite piece 5014 by a coatings 5015 and/or 5016 according to FIG. 25. Such a piece can be linear shaft like, but not limited thereto only. The piece can be a plate like structure. In addition, the coating can be made over the whole piece, or to a certain particular part of the piece, which may be a bending part or otherwise active or exposed to wear-out related things in the environment. In embodiments, that are related to bone or similar structures as replacement parts, such parts can be coated to increase the mechanical strength, but also, or, in addition, to increase chemical resistivity of the structure in the environment.

Figures 51, 52:
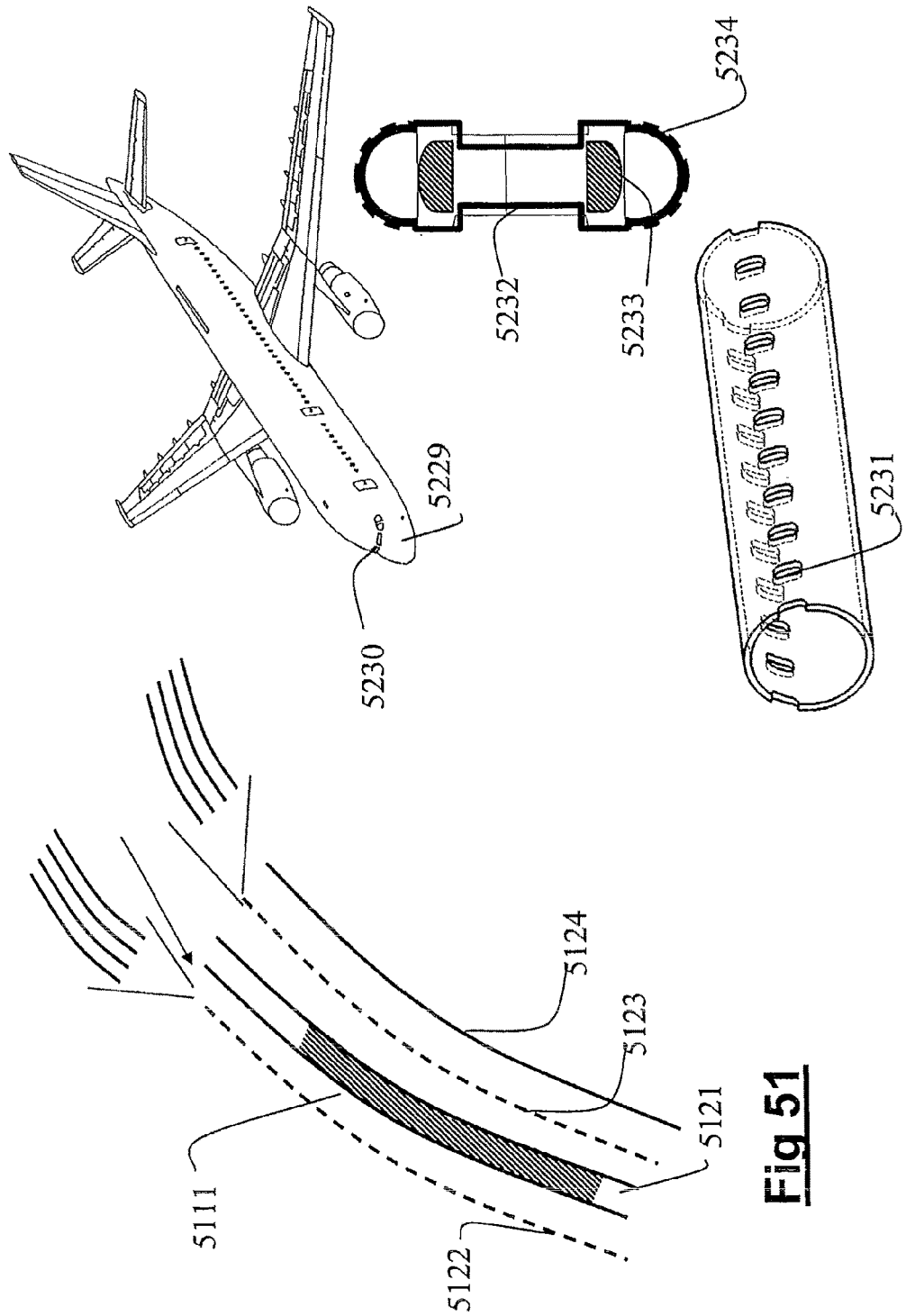

FIG. 51 illustrates use of an embodiment of the invention for coating of screen part. The screen can be a flexible paper-like screen. The shown example is illustrative and does not restrict the scope of the embodiment only to OLED, LCD, plasma or any other particular screen type only. Also card boards can be manufactured on a flexible substrate by an embodiment. That facilitates new and practical way of providing rollable and/or spiral shaped card boards for electronics. The substrate 5121 can be coated on one side by a layer 5122 for creating a card board pattern, and/or coated on another side by another layer 5123 for creating another card board pattern. The layers, partly or in whole, can be protected 5124 by suitable diamond layer. For instance a touch screen can be provided on a substrate as a coating. Electronic books can be thus made by using such flexible screens, which in part can also be provided with a solar cells operable in IR and/or UV wavelengths, thus leaving a part of wave length range in visible light for the reader's use.

FIG. 52 illustrates use of an embodiment of the invention for coating of an aircraft vessel 5229 and/or a part 5230, 5231 thereof. What ever part can be coated without limitation to only the shown windows or the mounting frames of it and/or gaskets. FIG. 52 illustrates also coating of a part of an air craft. The part shown is a part of landing gear part, as a wheel 5234 or rim 5232 for a wheel or a rim part 5234. Also wheels for trains and car rims and/or tyres can be coated. Rails for trains can be coated to prevent corrosion.

FIG. 53 illustrates coating according to an embodiment of the invention. The coating can comprise substances from the FIG. 25, but also noble gas compounds. The matrix and/or barer 401 are selected, the dopant 402 is selected, the matrix and/or dopant are ablated 403, and the substrate is coated with the consequent plasma. Although very simple flow chart, the steps can be used in multiple times in series and/or in parallel for coating a plurality of substrates with at least one substrate.

FIG. 54 illustrates a printer 500 according to an embodiment of the invention. The printer has, for a 3D-printing, a target holder 501 arranged to hold the target for its exposure to a first surface modifying beam with the effective depth, means 502 to produce the first surface modifying beam and/or a transfer line as a radiation path for transferring said beam along said path on to the target, means 503 to produce a second surface modifying beam with its effective depth, and/or a transfer line for exposing at least one surface of the substrate to a second surface modifying beam, and a substrate holder 504.

FIG. 55 illustrated a copy machine comprising means 601 for acquiring data of a 3D-body on the shape and/or measures and/or recording into a file 602, means 603 for translating the data into control commands for controlling a 3D-printer (for instance the item 500) for printing a copy of the 3D-body with a certain accuracy. FIG. 56 illustrates a laser system according to an embodiment of the invention. The system comprises a radiation source 701 for generating the radiation for the ablation, a radiation path 702 comprising a turbine scanner 703 for directing said radiation to the target part. The radiation source can be embodied according to an embodiment by several laser sources, which are arranged to ablate target material from a target or a part of such.

A surface processing method according to an embodiment of the invention comprises
  exposing a target material acting as a target to a surface modifying beam,
  directing a radiation path for the surface modifying beam from a radiation source to the target for ablation of the target material,
  vaporizing/ablating target material to effective depth, for a modification of at least a surface in respect of at least one surface characteristic.

A surface processing method according to an embodiment of the invention said characteristic is at least one of the composition, chemical structure, mechanical structure, physical structure to said effective depth. An embodiment of the invention comprises a method step in which a first surface is selected to a target and/or a second surface is selected to a substrate, for modifying of target material from said first surface by a first surface modifying beam. In a method according to an embodiment of the invention the modifying comprises is removal of material from the surface at the effective depth by said first surface modifying beam. In a method according to an embodiment of the invention the method comprises setting a surface of a first body to the target and/or a surface of a second body to a substrate so that a second surface modifying beam is used to bring material on to said surface of the second body. In a method according to an embodiment of the invention the method comprises modifying of said surface comprises addition of material on said surface to the effective depth defined as the layer thickness of said material. In a method according to an embodiment of the invention the method comprises transferring material to a second surface by a second surface-modifying beam so that said material originates to said first surface, as being removed by a first surface-modifying beam.

A coating method according to an invention comprises a surface processing method according to an embodiment of the invention. The surface processing method is applied for a plurality of substances comprising at least one or several substances to be used for the coating. A coating method according to an embodiment of the invention comprises ablating at least two substances from essentially same target part. However, the target part can be different, even a different target can be used. A coating can be made directly form the elements fed into the coating process in the stoichiometric relation of the desired coating composition. According to an embodiment of the invention the first and second substances are ablated in that order, in series, whereas according to a variant of an embodiment, at least one substance is ablated simultaneously at least partly with another ablated substance, in respect of the duration of the ablation of each substance. According to an embodiment of the invention the ablation is made for carving, but according to an other embodiment the ablation is made for making a coating, i.e. the ablated target material is used for the coating formation on a substrate to be coated.

The ablatable material can comprise the coating matrix substance or other kind of a carrier, which can be doped by a dopant. The doping may be made to gain additional features to the substrate surface, and/or to the coating layer. Such an additional feature may be a desired elasticity, Young module, crystalline structure, a dislocation of such and/or tensile strength of the coating and/or substrate surface. A coating to coated according to an embodiment of the invention, on a substrate, can comprise carbon, as graphite, diamond in amorphous, polycrystalline form or monocrystalline form in a layer. Such layers can be coated even several layers on one by one, especially in such an embodiment in which the coating is used as sliced way for 3D-printing and/or copying.

The substance for the carrier matrix and/or the dopant can be chosen from the elements available in the nature, but is not limited to only them. Suitable substances can be uranium, trans-uranium, earth metal, rear-earth, alkaline, hydrogen, lanthanide, and/or a noble gas, the substance can comprise as a dopant uranium, trans-uranium, earth metal, rear-earth, alkaline, hydrogen, lanthanide, and/or a noble gas. Other suitable dopants are dopants from boron-group (IIIb), dopants from carbon-group (IVb), dopants from nitrogen-group (Vb), dopants from oxygen-group (VIb), and/or dopants from halogen-group. However, a skilled man in the art knows form the current embodiments, that all possible permutations and variations may be not as advantageous for a coating as the others. For example, dopants that form unstable and/or poisonous mobile compounds are not desirable as such as such compounds for all the purposes in the scope fitting into the scope of the embodiments.

According to an embodiment of the invention the coating method can be used to coat several kinds of objects. The surfaces to be coated can be inner and/or outer surfaces of a body. The bodies can be even nano-scaled bodies, machines or parts thereof, as well as macroscopic bodies such as buildings, or intermediate sized bodies.

The coating can be illustrates for some examples on the bodies suitable for coating, however, without intention to limit the scope of the embodiments only to the mentioned examples. A coating according to an embodiment of the invention can be used for the body and/or lining structure of an air-craft vessel, ship, boat, sailing ship or a part thereof, vehicle, or space-craft-vessel, to a surface of a motor and/or a part thereof for an air-craft vessel, ship, boat, sailing ship or a part thereof, vehicle, or space-craft-vessel, to coat a surface of a lining structure and/or a part thereof for an air-craft vessel, ship, boat, sailing ship or a part thereof, vehicle, or space-craft-vessel, to coat a surface of a body, which is tool and/or a part thereof, to coat a surface of a body, which is a piece of furniture aimed to domestic and/or industrial use, to coat a surface of a body, which is a vessel, dish, holder, receptacle, tank, vat, jar, can, pot, bowl, container; tray, bin, trough, tub and/or barrel, to coat a surface of a body, which is aimed to be used in kitchen and/or industry comprising metallurgical industry, food industry, medical industry, chemical industry, painting and/or pigment industry, semiconductor industry, to coat a surface of a body, which is kitchen-related body, reactor, reactor for a chemical reaction, and/or transfer line of material, to coat a surface of a body, which is one of the following:

a transparent plate of glass, plastics, composite or a laminated structure, opaque plate of glass, plastics, composite or a laminated structure, solar cell and/or part thereof, and a combination of the mentioned of.

A coating according to an embodiment of the invention can be used for to coat a surface of a body, which is a building element for a building for housing and/or other building, to coat a surface of a body, which is a building element for a building for housing and/or other building composing of natural and/or non-synthetic material originating to nature, to coat a surface of a body, which is a toy or a part thereof, to coat a surface of a body, which is a watch, clock, mobile, PDA, computer, display, TV, radio, or a part thereof of the any mentioned, to coat a surface of a body, which is a casing and/or a shell, or a part thereof of the any mentioned, to coat a surface of a body, which has a fibrous composition at least partly, to coat a surface of a body, which is thread, yarn, chord, filament, wire, string, solid conductor, strandline, rope, to coat a surface of a body, which has a web structure and/or has a textile structure, to coat a surface of a body, which is one of the following: fibrous filter, industrial textile, textile for a cloth or paper, to coat a surface of a body, which is waveguide for electromagnetic radiation, to coat a surface of a body, which is made of diamond at least partly, to coat a surface of a body, which is has a different composition before the coating than after the coating, to coat a surface of a body, which comprises means for practicing sports, coat a surface of means, which comprises means for practicing sports, to coat a surface of a body, wherein said means are means for skiing, slalom, snow boarding, skating on ice or ground, cradle, sledge, sleight, playing games with at least one stick, to coat a surface of a body, wherein said means are throwing, shooting, sliding, gliding, scrolling or bowling, to coat a surface of a body, which is cycle or a part thereof, chain, bearing, or another part of the just mentioned, to coat a surface of a body, which is a piece of jewelry, decoration, artwork or a copy thereof, to coat a surface of a body, which is a micromechanical element, to coat a surface of a body, which is a semiconductor, to coat a surface of a body, which is a insulator for electricity and/or warmth, to coat a surface of a body, which is a conductor for electricity and/or warmth, to coat a surface of a body, which is spare part of human being and/or animal, to coat a surface of a body, which is a joint surface, to coat a surface of a body, which is an fixing means, as a rivet, stud, screw, nail, hook or nut, to coat a surface of a body, which is at least a part of a radiation path, to coat a surface of a body, which is a turbine scanner, or a mirror thereof, to coat a surface of a body, which is a plastic film, in product form of sheets and/or web, to coat a surface of a body, which is an optical element, to coat a surface of a body, which comprises a lens, prism, filter, mirror, an attenuator, polarizer or a combination thereof of the just mentioned, to coat a surface of a body, which is spectacles or contacts, to coat a surface of a body, which is bond, stock or another paper of value, or means of payment, to coat a surface of a body, which is a container for storing a substance, to coat a surface of a body, which is a container for storing hydrogen and/or releasing hydrogen, to coat a surface of a body, which is a container for storing hydrocarbon and/or releasing hydrocarbon, to coat a surface of a body, which is a container for storing nuclear fuel and/or an element thereof and/or to coat a surface of a body, which is a substrate body to be coated with an UV-active coating. According to an embodiment of the invention optical elements can be coated in a precise manner, to comprise coatings that have layers arranged to form the optical properties of optical element as uncoated.

FIG. 57 illustrates a radiation source arrangement 5700. The example shown comprises a radiation source 5701 and/or another radiation source 5707. The number of the sources as such is not limited only on or two. In the arrangement, there is also indicated the target 5706, which can be target material according to an embodiment of the invention. FIG. 57 also illustrates radiation path 5703 as arranged to guide radiation from a radiation source 5701 to the target 5706, to used for ablating the target material. The path comprises a scanner 5704, but the number of scanners per path is not limited to the shown only. The figure illustrates adapter 5702, 5705 arranged to adapt the path 5703 to the source 5701 and the target 5705, respectively. The adapter can comprise an expander, contractor and/or a correction optics parts, which are necessary for the focussing in such embodiments, in which the geometrical beam shape is necessary to change in the path from the source to the target.

FIG. 57 also embodies such variations of the arrangement 5700 in which there is also an additional source 5707 to be used in parallel and/or in addition to the source 5701. The additional source can be exactly the same according to one embodiment but according to another a different one. According to one embodiment, the source is a heater. The adapter 5708 can be the same as 5702, but is not necessary such. It can be also an integrated adapter as an expander. The scanner 5709 can be same as the scanner 5704, but is not limited only thereto. The scanner is advantageously a turbine scanner according to an embodiment of the invention. According to the way of drawing, the adapter 5710 is arranged so that the radiation from source 5707 arrives to the target 5706, as the radiation from the source 5701. The arrangement do not necessary need the adapters at all, provided that the geometry of the beam directed via the scanner is sufficiently uniform and/or in correct focus, above, beneath or the on the surface of the target material or its base. The radiation of the source can be in one embodiment directed to several targets, although only 5706 shown as an example.

FIG. 58 illustrates a target material unit 5800 arranged to provide target material for the coating related embodiments according to the aspects of the invention that relate to the coating. Although the target material unit has the casing 5805 in the example to cover the radiation source arrangement 5700 as well as the target 5804 in the same cover, it is not limited only thereto. The figure illustrates the beam 5803 as a material plume of the ablated target material. The plume 5803 can be used to coat the substrate 5802 by the coating 5801 that is already attached on the substrate. Such a target material unit can be utilised in embodiments of the invention in suitable part, for instance in 3D-printer to print coating layers, as well as in the copy machine. The unit 5800 in FIG. 58 comprises advantageously means to heat the target to the correct temperature. According to an embodiment of the invention the heating means 5806 is implemented by a laser and/or by an RF-source. According to an embodiment of the invention the target material unit comprises a pump 5807 arranged to condition the ablation/coating according to the example in FIG. 25, for instance. The atmospheric means 5808 in figure are arranged to condition the composition of the atmosphere in the target material unit for the optimum of the ablation of the target and/or coating of the substrate. The target material unit can comprise also means for catch dust and/or fragments if any, (not shown). Such means can be electrostatic precipitator means arranged to collect potential target material fragments and thus to improve the quality of the coating. The field can be arranged according to the mobility of the constituents for the minimum disturbance to the plasma plume 5803, but sufficient to collect solid/liquid particles.

FIG. 59 illustrates a ribbon like feed module 5900 of target material in a target material unit. A reel 5903 is arranged to give target material 5902 for the use as target, optionally or in addition to the heating by the heating means 5905 at the ablating area. The used target material ribbon 5906 is collected with the potential residue on the reel 5904. According to one embodiment the module is one time use only module, but according to another embodiment the module is re-circulatable and the ribbon acting as the base can be coated again for the next use.

FIG. 60 illustrates a coating method according to an embodiment of the invention. The method has phase 6001 of selecting and/or exposing the target, substrate and/or the coating. According to one embodiment of the invention the target can comprise a constituent of the coating, but part of the coating can be formed by the atmosphere at the substrate, and/or the substrate surface constituent or several. According to another embodiment of the invention the target material is the same as the coating. A radiation beam is directed to the selected target material in phase 6002 in order to expose a target material to the radiation. According to an embodiment of the invention there can be also another target material to be ablated. Although drawn in parallel to phase 6003 the second ablation phase 6004 is not necessary a parallel phase, but can be a serial phase according to one embodiment. Certain optionality of the coatings, related not only to the different aspects of the invention, is illustrated by the dashed lines. The coating phase 6005 can be used as only coating phase according to one embodiment, but the second coating phase 6006 illustrates that in another embodiment there can be several phases of coating. According to an embodiment of the invention after each ablation and/or coating the method comprises a phase of checking if all the coating layers were already made. That is illustrated by the arrows directed as shown in figure backwards from higher reference numerated phases to the lower reference numerated phases. The freedom to select of a coating 6011 for a phase 6003 and/or 6004, substrate 6010 and/or target material 6007 is illustrated by the periodic system of elements 6008, 6009. However, that is not limiting the said materials as such only to elements, although the target material is ablated. Also compounds of the elements can be used.

The substrate to be coated with a coating, according to an embodiment of the invention, can be any solid body from the patent class of human necessities.

3D-printer according to an embodiment of the invention comprises a target holder for holding a processable surface for exposure of said surface to a surface modifying beam to an effective depth thereof, means for producing the surface modifying beam and/or radiation transferring path to direct said second surface modifying beam to the target, means for producing a second surface modifying beam and/or a second radiation transferring path to direct said second surface modifying beam to the target, and a substrate holder for holding said substrate for exposure of said surface to a second surface modifying beam to an effective depth thereof.

3D-printer according to an embodiment of the invention comprises means to produce a surface-modifying beam as an ablating beam to stylization of the print. According to an embodiment, the 3D-printer comprises controller means arranged to control the printing of the 3D-body slice by slice, each slice with its effective depth, wherein said second surface modifying beam is a material plume. According to an embodiment, 3D-printing may need also carving by cold-ablation. Basically there are two options to implement 3D-printing. A first way for the implementation is to select a starting piece sufficiently large for the printed body and to sculpture pr carve the print. Another implementation is a coating related approach to produce and direct layer by layer the second surface modifying beam as the plume to form the print.

3D-copy-machine according to an embodiment of the invention comprises at least a 3D-printer according to an embodiment of the invention. However, although not all parts are described, advantageously such a copy machine further comprises first means to define and/or formulate data of a 3D-body on its shape and/or dimensions for recording into a file, second means to convert said data to control commands for controlling a 3D-printer. According to an embodiment of the invention said first means comprise optical means for UV, visible light and/or IR. Such first means can be implemented also so that they comprise X-ray tomography and/or acoustic means. The shape and measures can be detected by using interference. Especially with the nano-scaled bodies to be printed and/or copied, the wavelength should be selected appropriately for sufficient resolution of the details. Thus, the relative errors of nano-scaled bodies may be larger than those for macroscopic bodies, or hose of intermediate bodies to be printed and/or copied.

Manufacturing method of target material according to an embodiment of the invention comprises a phase of selecting and/or exposing a film and/or a sheet like base to a material plume of the ablatable target material for coating a part of the base at least on one side with said target material. According to an embodiment of the invention the method comprises utilisation of a mechanical shaplone for providing the target material a shape feature. The shaplone can be implemented in mechanical way, which however may lead to significant material losses, shown in the product price. According to an embodiment of the invention, the method comprises providing the base markings for the target material for giving a shape feature with at least a pitch in one direction and/or two directions. According to an embodiment of the invention said markings are electric markings; magnetic markings or the markings comprise a thermal markings. Said markings can be provided as seeds onto locations on the base for a heterogeneous nucleation and/or a following condensation to be used for the formation of the target material into certain predefined form. However, when an exact form desired for the shape feature, the method comprises a stylization phase of forming the target material formations on the base. In the manufacturing, a target material unit according to an embodiment of the invention can be used.

According to an embodiment of the invention the target material is pre-heated before and/or during the ablation. The heating can be made by a heater arranged to operate in RF and/or IR frequencies. According to an embodiment of the invention the heating is arranged to occur by a laser with a lower power than the ablating beam. The heating can be arranged in one embodiment for the whole target material that is supposed to be ablated during the ablation event, but in another embodiment a pre-heater beam precedes the ablating beam on the part of the target material to be ablated. According to an embodiment the pre-heater beam is arranged to over lap at least partly the ablating beam. According to another embodiment of the invention, there is a relaxation time arranged according to the material to be ablated there-between the pre-heating of the spot of the target material and the ablating beam. An advantage is gained by the heating of the target, which can be of various forms, for example film, ribbon, foil, plate, belt, rod or a combination of the just mentioned. One advantage seems to be that the structure of the surface that is made by the beam and/or the coating by the ablation can be better controlled with a preheating. The coating structure can be more advantageous in 3D and/or a higher quality. The preheating can be utilised for several targets, but especially for carbon and related derivatives as target, but also for oxides. The derivatives refer to compounds of carbon, such as carbides as well as carbo-nitrides in various forms, but also to graphite in various forms, sintered carbon, pyrolytic carbon. However, the said examples are not intended to limit the target material only to said examples, with the pre-heating of the target.

Embodiments in FIG. 61 illustrate optional embodiments using various other scanner types than a turbine scanner as embodied as a polygon type Turrent mirror. The Capital letters A-I in FIG. 61 are related to the movements and positions of a scanner part type in the FIG. 61. The letter b refers to a base, axis and/or bearing of the mirror denoted by M for deflecting a radiation beam. However in some embodiments, the mirror can comprise ablatable coating on the mirror, but is not limited only thereto. Embodiments in FIG. 61 at the left indicate one position of the scanner in a scanning cycle, and at the left another position of the scanner. The left hand side of FIG. 61 can be the rest position, but is not limited only thereto. The scanner movement is not in scale to the dimensions of the scanner piece, but the movement is illustrated to give an impression what kind of a movement is in the example demonstrated, but without limitation to a certain angle of deflection or twist. In FIG. 61 at the A a torsion based scanner is demonstrated with a deformation of the scanner part shape, whereas at the F demonstrates such a torsion, in which the scanner form remains essentially as unchanged for a single movement. Embodiments at the B. C and D demonstrate various type of linear bendings of a cantilever or a beam comprising the mirror in a part of the cantilever or beam, however without any limitation only to shown embodiment at a one end of the cantilever or beam. At the B the b bends from one portion of the beam, but in the embodiment of E during the whole length dimension of the beam. The G embodies a padding wheel type scanner, which has only one mirror drawn, but the number is not limited only to the shown. At the H a torsion type mirror is embodied. It can be an oscillating mirror having a movement back and worth but also in another variant continuously to one direction rotating mirror. At the I an acoustically driven cone is demonstrated with a mirror surface M1 arranged for a scanning surface. The acoustic driving can be made by as in the audio techniques, for a loudspeaker, but the base for the mirror is advantageously a lightweight so to allow rapid movement and/or high frequencies even beyond the upper audible limit of human range to be used to deflect the radiation beam. The piece comprising the mirror M2 can be used to deflect the beam, in the drawn position if the radiation was coming right back to right. According to an embodiment one mirror of the M1 and M2 is arranged to move, but according to another both mirrors, in order to comprise wider variations of the scanned radiation beam. According to the drawn embodiment the surfaces of the M1 and/or M2 are illustrated straight, but conical, but not limited only to the shown embodiments. According to an embodiment of the invention a surface on which the mirror M1 and/or M2 is made, is curved for having a certain width of the scanned radiation. The curvature can be optimized to hit to the target. According to an embodiment of the invention the surface curvature can be presented with exponential functions. According to an embodiment of the invention, at least two shown movements of A-I can be combined in suitable part in order to increase the virgin path of the radiation beam at the target surface.

It is clear to a skilled man in the art that the FIG. 61 demonstrates movements and/or torsion in certain dimensions, but from the shown examples on the embodiments a skilled man realizes that at least some of the movements can occur in further dimensions and/or in combinations, so that although bending is shown for a linear beam, the beam can bend also to another direction and/or to twist along an axis of the piece. These directions do not need to be limited only to lateral directions demonstrated.

FIG. 61 shows parts examples on the scanner parts that can have the mirror. However, the static parts are not shown as such to respect which the various movements of the various types of the moving, bending and/or rotating parts are to be moving. The attachment of the moving part to the static is not shown in the FIG. 61, but a skilled man in the art knows from the embodiments to which part of the part b the attachment can be made so facilitating the illustrated movement of the part b.

EXAMPLES

Example 1

FIG. 1 illustrates a fibre oscillator (3) and a preamplifier (2), but also formation of an incident laser-light with a diode (4) and sesam-grid (5). The new laser system is a phased-diversified-amplified-direct-mode laser system (-laser system). This is the pre-amplifier unit (1) of the PDADM-laser system, which unit defines the pulse length, pitch, power, and other features of the radiation).

It is actually a digitally controllable control centre arranged to control the whole radiation source arrangement. The radiation source arrangement is completely fibre-based laser system.

The second phase laser-pulse gain/amplification (6) resides in the same central unit (1), so that even several parallel amplification units (7) and (8) can be in duty, as depending on the number of desired working spots and/or targets the laser pulses are addressed to as amplified.

A low powered laser pulse (as a light pulse) (9) is further directed via a divider, say, to three directions (10), (11), (12), according to the example of the figure, to be addressed to separate working spots (13), (14), (15), which can be selectable for example according to FIG. 8.

Diode-pumps (18), i.e. the means to form the high-power laser pulses as optimized, can be a single radiation source in the radiation source arrangement, or there can be several ones, similar or different ones, but arranged as to receive a low-power laser-light pulse as conducted therein.

In a diode-pump (18) a low-power and low grade laser light pulse is amplified and transformed to a high-power and high grade laser-light pulse that can be directed to a turbine scanner via an optical expander (21) for the pulsed laser light.

From the diode pump, a laser pulse can be conducted via a short power-fibre (29) to an optical beam expander, or the optical pulse expander is directly a part of the diode pump (18) itself.

An important feature to an embodiment of a radiation source arrangement concerning a fibrous laser light based arrangement is that, that a large laser-power generating diode-pumps (18), the power-amplifiers, are placed directly to the targeted working-spot according to FIG. 8 and a low-power laser pulse has been conducted from a common control centre to the location where the pulse is amplified to the final power level, to be used in the location.

Such a disclosed embodiment of the invention appears to be a diode-pumped fibre-laser, but having the power-amplifiers comprising the diode-pumps as located as a part of a vaporization/ablation system, contrary to conventional laser units, at the date of the priority of the current application, not to the parts of such conventional laser units.

Thus, high-power laser pulse transference fibres as well as optical connectors for the same are not needed anymore, at least the need appears to be remarkably diminished if not completely ceased. Thus, the laser ablation processes according to the embodiments of the invention suffer less the major problems of the power transference, not to mention the escalation of the current high-power fibres operated with the powers that are intended to be used in the new laser systems.

An important feature to the operating of the new radiation source arrangement as embodied as a laser system is that, the laser system is based on Modulated Oscillated Power Amplifier (MOPA). i.e. diode-pumped fibre-lased laser arranged to bring up the high laser-power at the working spot, for instance at a vacuum evaporation/ablation device (89) according to FIG. 6, as a part of a vaporization cassette (90) and (91). So, the embodied example of the laser system in question comprises the minimum, if not completely lacks, of such an optical fibre and/or connectors for the transference of high power laser pulses. The PDAD-based laser system produces the high-power laser pulse therein where it is to be used, at the targeted location.

Example 2

FIG. 2 illustrates a part of a radiation source arrangement as embodied as a laser related embodiment. In the embodiment, the power-amplifiers, as diode-pumps, are located into a vaporization/ablation system as a part of it, so that high-power laser pulse transference fibres as well as optical connectors for the same are not needed, at least the need appears to be remarkably diminished if not completely ceased. In this example the diode-pumps are in the vacuum vaporization/ablation device. In addition, in the embodiment according to FIG. 2, the optical expander is connected to a diode-pump via a high-power fibre.

Example 3

FIG. 3 illustrates a part of a radiation source arrangement as embodied as a laser related embodiment. In the embodiment, the diode-pumped laser power is directable to a turbine scanner. An extremely large pulsed laser power has been produced, but consequently, the scanning is not possible from a single mirror area, the scanning is implemented by several mirror areas.

Thus, FIG. 3 illustrates a situation in which an extremely large pulsed laser power has been produced and conducted with an optical fibre (47), or more advantageously straight directed into laser beam/pulse expander (48) from which the expanded laser-beam (50) and (51) is directed to a turbine scanner (52) that rotates around its own central axis (57).

Thus, each diode-pump-produced-and-expanded laser-beam (51) and (52) produce its own laser beam reflection surface (53), (54), (55) and (56).

The reason for the manner of procedure relies in that, if four high-power diode-pumped laser beams were directed immediately to the scanner (52) as a one laser beam, the scanner were damaged. The location (58) shows in general, feeding a pre-amplified low-power laser pulse to a diode-pumps (52), the optical power-amplifiers, and (42) shows in general an electric circuit board.

Example 4

It is an extremely high-power laser pulses produced also in this example, but because the scanning of using just one mirror area is impossible, the scanning is made by several mirror areas.

FIG. 4 thus illustrates a consequence from the operation of FIG. 3, wherein four separate laser beams (64) are focussed (65) into a common point (66) by optical lenses (67).

FIG. 4 further illustrates how four separate laser beams (60), (61), (62) and (63) are directed to a single scanner (59) that is rotating around its own central axis (67) and how four separate laser beams are focussed into a single point.

Example 5

Example 5 is shown via the FIG. 5, so illustrating a manufacturing device for a working piece, in which a device the coating is arranged to occur in a controlled volume, as embodied as a vacuum, a volume in over-pressure, or a volume with a certain pre-defined composition of constituents in gaseous phase.

Operation is similar to the already described embodiments in suitable part, but differs from the related examples in that that for example in FIG. 9 the vaporization cassette system is entirely inside the controlled volume, but in operation according to FIG. 5, the vaporization cassette is divided into two parts so that one part is outside the controlled volume (64).

Central unit (71), comprising the pre-amplifiers, power-feed and the control units (72), is the same as the previously embodied, and from the central unit (71) there are lines lead to the vaporization cassette system.

In this embodiment example according to FIG. 5, the diode pumps, the optical power-amplifiers (73), (74), (75), (76) are located outside the controlled volume (64), as well as the optical laser beam expander and the scanner (78).

The expanded laser beam is directed via the mirror (79) so that it (80) is contracting, for the focusing onto/into a desired location of the target (81).

In this application of FIG. 5, as illustrated for example in accordance to the application of FIG. 9, it is the same technology utilising the PDAD-laser-system to produce the final large laser power at the in-use location, by the diode pumps, the optical power-amplifiers that are integrated in the example into the vaporization cassette system.

In the new method, it is actually at least two related ensembles of inventions, first the PDAD-laser-system itself, and second the use of it in combination of material production and/or coating within a controlled volume comprising vacuum or a predefined and controlled gaseous atmosphere, as applied for example to coatings comprising diamond, sapphire, silicon carbide, carbo-nitride etc.

In addition, a novel aspect of certain embodiments is that even more than one vaporization cassette systems can be addressed to utilise a single production volume, as embodied as a vacuum volume for example.

Example 6

Example 6 deals with a vacuum vaporization/ablation arrangement and/or a related apparatus illustrated in FIG. 6. The device is capable for coating with metals, their oxides, boron, its compounds, nitrides, ceramic compounds and/or organic substances, directly. Also new compounds are possible to be made in the working process. Combining an element to another like aluminium to oxygen, alumina ($Al_2O_3$) can be made for coating the working piece.

The apparatus is easily as such applicable for diamond production directly from carbon by vaporization/ablation. Additionally, derivables of diamond can be manufactured, such as nitride-diamond, which is an example of a compound that is harder than the natural diamond, or completely new compounds can be brought up, such that has not been commercially available before, or have been very difficult to be manufactured in a technical sense.

A novel embodiment as an apparatus is based on diversified feature of the laser system, wherein the laser beam itself is brought up in its complete form at the targeted area.

A novel embodiment of an apparatus is based on a full fibre semi-conductor diode-pumped laser beam system, having a diversified structure so that the laser beam itself is brought up in its complete form at the targeted area, which is situated into a vaporization cassette system as a part of it, so facilitating the manufacturing device of the working piece.

The shown manufacturing device of the working pieces as indicated in the FIG. 6, can be very large in size, for example the vacuum chamber (89) itself can be even 5 m long, and comprise even 20 pieces (91) (92) of vaporization cassettes, each typically comprising a laser of 100 W or larger in power as a pico-second laser embodiment. However, the shown measures in this example are only illustrative and thus not binding.

The device is applicable for instance to issues of cold-ablation techniques, i.e. to pico-second, atto- and/or femto-second laser applications using extremely large pulsed energies ~5-30 µJ/30 µm spot, so yielding so large a power level per pulse as 200 kW-50 MW.

In laser ablation a great importance emerges from the angle in which the laser beam meets the target material to be ablated, especially for the plume, and/or the angle of direction into which the plume is propagating when formed. Typically the ablatable target can be round and can additionally rotate around its own central axis in one embodiment, but the final yield of the ablation, in respect of the plume, target material, and/or a coated substrate may be not so smooth and high graded as in such an embodiment of this application that utilizes a vertical and/or linear movement (119) (FIG. 8) for the target (112).

If the situation appears to be according to FIG. 6, so therein in duty 4 pieces (91) and (92) of vaporization cassettes, which in addition, but not limited to that only, can be oppositely placed to each other so that the product to be coated is arranged to pass through the active coating area in such a way that each side of the product is to be coated at the same time.

If the products are in a horizontal position (but not limiting to that only), when fed through the pair of vaporization cassette, one of the laser beams advantageously can be directed form below and the other beam above, each directed to its own target as turned 90°, so that the laser beam hit perpendicularly to a target, so yielding a plume of the target material as plasma towards the working piece.

It is difficult to understand that how such a laser ablation application described above were made with completely free propagating laser beams.

Example 7

PDAD-laser system according to the example 7 and an embodiment of the invention is illustrated in this example, which comprises in the embodiment a solidly integrated expander and/or correction optics attached to a diode-pump arranged to produce the radiation to be directed to a turbine scanner.

Example 8

FIG. 8 illustrates a PDAD-laser system comprising a diode-pump (112) arranged to generate a high power laser pulse (115) into the working target, which is inside a vacuum chamber (124) as a part of the vaporization/ablation system itself, which comprises a path or an improved path according to an embodiment of the invention, so comprising a turbine scanner (111), and the necessary optics comprising the collector lenses (116) and the vaporization cassette (119), in which the laser beam is directed and/or focussed into/onto the target (121) itself.

In such case, the diode-pump (112), in which the high-power laser beam has been brought up, has been fed only by a low-power pre-amplified light pulse via an optical fibre. The produced high-power laser-light is expanded within the diode-pump (112) immediately so that the light can be scanned with a turbine scanner (111) and/or the collimating/focussing lenses onto/into the target. The turbine scanner (111) and the motor rotating it, diode-pump (112) and the necessary electronics are situated onto a common circuit board (120), which has been situated into a multi-operational body (123). A system according to FIG. 8 has been situated for example inside (91) (92) into a vacuum evaporation/ablation arrangement (89) according to an embodiment shown in FIG. 6.

Example 9

An operating principle of according to a method of an embodiment the invention has been shown also in FIG. 9, wherein a typical case according to the FIG. 6 is illustrated for producing the work-pieces. It is important for the example that there are more than one vaporization cassettes (135), which feature has been depicted in more detail in FIG. 8 in the production apparatus (For example, FIG. 6). The work processes are identical in the vaporization cassettes (135), (136), (137) and (138), independently on the exact number of said cassettes but, also from the repetition rate [Hz], pulse length and/or pitch [ns, ps, fs, as], pulse energy [J], pulse power [W] etc. However, situations can occur in a variant of an embodiment of the invention that substances are used in the vaporization processes, which need individual parameterization of the quantities above for each or some vaporization cassettes (136), (137) and (138) if common parameters are not applicable.

In the novel method according to an embodiment of the invention, the pulse power and/or pulse-energy can be adjusted or controlled vaporization cassette specifically. An advantage of that is that the adjustment does not necessary influence on the PDAD-system at all. The adjustment can be made by adjusting or controlling the diode-pump, the power-amplifier output power, and in said method the power of the power-amplifier is not limited as such at all to any specific, so each power amplifier can be thus adjustable individually and independently for each diode-pump, however, not limiting the adjustment only to that.

Identical in association to the work-process means that the work-process as such is made always with a same vaporization cassette, and that parameters which are essential for the detailed process taken as a whole are constants, such as the repetition rate [Hz] and or pulse length, but also the pitch. In an embodiment of the invention, the whole preamplifier and controlling unit are common to all vaporization cassettes at each working place with the target/substrate, the repetition rate [Hz], pulse length and/or the pitch are a constant in suitable part for such a unit, but in another embodiment the number of units is dependent on the number of repetition rates, the number of the pulse lengths, and/or the pitch between two successive pulses. Thus, keeping the device or apparatus specific properties as constant as possible, however not limiting modular applicability of extending or deducing the arrangement, method and/or system according to an embodiment of the invention.

Further on the FIG. 9, according to the indicated operation principle therein, the working points, the vaporization cassettes (135), having each a working width of 150 mm, for example, but without limitation to the mentioned only, can be mounted operationally in parallel and/or in series, respectively say, for example only, five of (136) and ten of (137). In addition or optionally, the same system can comprise the same parts (136) and (137) comprised by a wholeness (138). The vaporization cassettes should not be limited according to any of the details of this example only, but the given details should be understood as an example from which a skilled man in the art can see many ways for implementation for an embodiment without leaving the scope of the example.

Providing a production device for a purpose of certain product manufacturing, keeping the device as economic to manufacture, and to comprise scalable modularity to any reasonable size, the device should be made for such a respect that the components and the parts such as the vaporization cassette, pre-amplifier, controller are sufficiently identical so that the system size can be scaled by simply adding units into the system comprised by the production device.

For instance, the central unit of a PDAD-laser system, which can be situated wherever in a reasonable place for the optimum operational aspects in consideration, even at a distance of 20 m, even in a different room, the central unit can be comprised so that at least the power sources for the diode-pumps, for the power amplifiers, are situated into where ever advantageous location but so that a line (126) leads from the central unit to each working point, as the divided at the working volume (139) to each working point with target/substrate, for instance to fifty parts (129). The controlling unit for the whole laser system to control each radiation source can comprise as many controllers as radiation sources with the appropriate path to control, but in another embodiment at least some radiation sources are controlled as a group, and some others as independently on each other, so to gain a freedom to control the various radiation sources and/or the related optical path components.

So, for instance the operation of 10 vaporization cassettes can be controlled by a feed-through (127) having 22-terminals as a constant arrangement for a certain number of cassettes, but the controlling can be made normally by a single light cable leading the signal to each controllable vaporization cassettes. Equally well, a Bluetooth, IR—or any other data transfer format known as such can be applied to the control media.

A vaporization cassette (135) comprises electronic circuit board (FIG. 8) (120) on which any data transfer component can be situated, if needed.

The light fibre (128) is most advantageously in FIG. 9 branched at the working point (139) inside the working space to the parts (131), for instance to 20 separate branches. It is shown additionally in FIG. 9 that each vaporization cassette (135) receives a line (134) that provides the energy for the vaporization cassette for its operation, a line for (138) the control and/or the line (132) for pre-amplified laser pulse. The lines (132, 134, 138) shown can be separate lines individually or in combination, or the lines can be integrated into one line.

Additionally, a line leads from each vaporization cassettes (135) to, for providing, the central unit with information on the state, results from the vaporization process, phases, etc process parameters, and/or alarms that relate to the operational aspects of the cassette, etc.

Thus, the laser pulse of the each diode-pump is so strong that it is not possible to deliver it via a known fibre from the diode-pump to the target, but the each diode-pump can be controlled by a low-power laser beam.

Thus, according to the PDAD-principle the large radiation power in pulsed form is produced at the very location of the use, i.e. by means that are integrated into the vaporization cassette, FIG. 9 (135).

Thus, also two generic problems of a fibre-lasers are eliminated, namely the fibre and the connector, so the optical laser pulse need not to go via the fibre nor through optical connectors, which are not needed in a system according to the embodiment of the invention concerning the PDAD-system.

Example 10

Example 11 illustrates a radiation source arrangement according to an embodiment of the invention, comprising several diode-pumped laser beams each directed via a turbine scanner and a expander to a vaporizing/ablation target (FIG. 10).

Example 11

Example 11 illustrates a diode-pump set according to an embodiment of the invention, comprising for each diode-pump its own optical beam expander. Such a mini-module structure can produce for separate laser beams.

Example 12

Example 12 (FIG. 12) illustrates asymmetric light pattern generation.

Example 13

Example 13 (FIG. 13) illustrates symmetric light pattern generation. According to an embodiment of the invention the diode-pump can be located outside of the vacuum vaporization/ablation device, whereas the turbine scanner, correction optics and/or the target material are inside the device. However, a skilled man in the art knows from the embodiments of the invention that there are many ways to implement the device into the same cover as a device, however, without leaving the scope of the embodied and so claimed arrangements.

Example 14

An optical surface has been cold-worked with an arrangement of a vacuum vaporization/ablation arrangement according to an embodiment of the invention, according to the first, second or third aspect of the invention. Such an optical surface can be actually almost any optical surface as manufactured with the help of an embodiment of the invention. Scope of optical surface in this example includes lenses of various kinds, irrespective their shape are they concave, convex, or halfly either or, or both. Scope of optical surface in this example includes also plate-like at least partly transparent, clear or opaque windows or like that pass through electromagnetic radiation. Scope of optical surface in this example includes also mirrors and/or screens. Scope of optical surface in this example includes also surfaces of prismatic objects, Fresnell-plates, grids of various kinds, television tube surfaces or display screens etc.

Example 15

A blade has been cold worked with an arrangement of vacuum vaporization/ablation arrangement according to an embodiment of the invention, according to the first, second or third aspect of the invention. Scope of blade in this example includes at least any blade, irrespective is it a domestic knife in kitchen or in garden, industrial part of a cutting device in textile, paper factory, or consumables factory like butchers and/or bakery or a tool in forestry for cutting tree or timber. Scope of blade includes also blades that have shape of linear and/or curved, with, or without serration. Rotating blades are also included into the scope of blade. Shaving blades as well as swords and axes are included into the scope of blade.

Example 16

A transformer has been made by cold-work with an arrangement of vacuum vaporization/ablation arrangement according to an embodiment of the invention, according to the first, second or third aspect of the invention. Scope of transformer includes in this example at least any transformer suitable for utilization of the aspects. Transformers that transform for instance electromagnetic radiation to electricity or vice versa with help of a coating are included into the scope. Solar cells, heating elements or Peltier-elements, irrespective the transparency or not, feature of opaque or clear are included into the scope of example 16. Membranes that bend, by radiation, heat, and/or electricity are included into the scope of transformers, irrespective are they micro-mechanical elements or macroscopic elements that comprise a bending/oscillating part or not. Also surfaces that comprise a coating manufactured according to the first, second and/or third aspect of the invention for a self-cleaning feature by a film, irrespective are they window like or mirror like and irrespective on the fact are such surfaces transparent or not, are the surfaces opaque or clear, they appear in the scope of this example.

Example 17

A vessel has been made by cold-work with an arrangement of vacuum vaporization/ablation arrangement according to an embodiment of the invention, according to the first, second or third aspect of the invention. Scope of vessel includes in this example at least domestic and/or industrial vessels from a tea cup to a reactor of a chemical factory. Also transfer lines for transferring a fluid are considered into the scope of the vessel in this example. The coating can be made on to a outer, and/or inner surface of the vessel. The coating can be a wear resistant improving, but also act in addition or optionally for increasing the radiation tolerance of the vessel, chemical tolerance of the vessel and/or increasing the cleaning efficiency when the vessel is to be cleaned. Into the scope of this example belong a vessel that has a roughening made by the second aspect of the invention, for a certain appearance or for a purely to a technical aim, for bonding a part for example. Into the scope are included in this example also boats, ships submarines, flying devices, motor driven vehicles like busses, trucks, lorries, cars and trains and/or parts thereof as well as military vehicles such as related cars and tanks.

Example 18

A tool has been made by cold-work with an arrangement of vacuum vaporization/ablation arrangement according to an embodiment of the invention, according to the first, second or third aspect of the invention. Scope of tool includes in this example at least any hammer, screw driver, wrenches or alike as of solid or adjustable capacity, saws, chain saws, drills, rotovators, cutters, scissors, blades. Into the scope of tool are also included ropes, chains, nails, spikes, and screws, as well as bolts and/or nuts but also studs and rivets, and mechanical bearings and hinges for any kind for medical, domestic or industrial use.

Example 19

A medical replacement part has been made by cold-work with an arrangement of vacuum vaporization/ablation arrangement according to an embodiment of the invention, according to the first, second or third aspect of the invention. Scope of medical replacement part includes in this example at least any medical replacement part of bone, which part comprises a surface made according to an embodiment of the invention. Also individual tooth and/or teeth are included into the scope with the coating. Artificial joints and hinges are in the scope, with an surface coating that is wear resistant for the purpose. The coating can increase the mechanical wear-resistance, but also chemical wear resistance in the mounted environment of each such part. The coating can enhance also bone/cement attachment for a replacement part. On other hand, surfaces that are manufactured for such a replacement part that is planned take part for potential bone formation in an ossifying process can be suitably roughened and/or coated for the optimization of the ossifying. The parts can be provided with a surface coating that a tissue next the part can attach easily. Into the scope of medical replacement parts are also included ropes or alike, chains, nails, spikes, and screws, as well as bolts and/or nuts but also studs and rivets, and mechanical bearings and hinges for any kind. Stents, or artery parts, made with or without a coating are also included into the scope of this example, as well as replacement parts of arteries as coated in suitable part are also included. Embodiments of the invention according to the first aspect, second aspect or third aspect of the invention can be used to produce texture surface with coating on a surface or a certain part thereof, not only to medical replacement parts but also to, say, electro-mechanic-related and/or optical surfaces or any surface suitable for the coating.

Example 20

An electro-mechanical part for an electronic device has been made by cold-work with an arrangement of vacuum vaporization/ablation arrangement according to an embodiment of the invention, according to the first, second or third aspect of the invention. Scope of the electro-mechanical part includes in this example at least electric component or a circuit made of such, made by means of a semiconductor substrate in a suitable lithography according to the first and/or second aspect of the invention. Into the scope are included also resistors, that can be made with a suitable material as a coating, directly onto a substrate with a lithographic pattern and/or onto a separate substrate body made of an insulator. Into the scope are included also capacitors provided with the coating on a plate and/or insulation for aiming to improved leak current behaviour, characteristic in the frequency response, operating voltage, and/or mechanical size, for example. Especially beneficial are adjustable electro-mechanical components like potentiometers or alike that can be manufactured with wear resistant coating materials. Beneficial are also motor bearings. Insulators of various kinds are included into the scope of this example, provided that the insulating material has been formed for aiming to improved leak current behaviour, characteristic in the frequency response, operating voltage, and/or mechanical size, for example.

Example 21

A magnetic composition is made by cold-work with an arrangement of vacuum vaporization/ablation arrangement according to an embodiment of the invention, according to the first, second or third aspect of the invention. Scope of composition includes in this example at least composition in a form of a thin and/or thick film or other kind of a coating, but also pieces, that have essentially a 3D-form. According to example, any material used for any conventional magnet can be ablated into a plume, another such material and/or several ones can be ablated each forming a plume in the ablation of suitable target. The plumes can be separate in one embodiment but can be mixed in another variant, at least partly. The target material selection, as well as the ablation rate of the materials can be use for the composition of the final material that have magnetic properties. The film could be a layered structure comprising just one layer or several layers. Each layer can be made of its own composition and/or structure. The layers can be made on a plane plate and/or onto a curved geometry. The curved geometry may be a bead geometry or a cylindrical geometry. Magnetic field can be present during the film formation from the plume at the surface to be coated.

Example 22

Example embodies a laser arrangement according to an embodiment of the invention, in accordance of the objectives. The mentioned parameter values are examples, and are thus not restrictive only to the mentioned values. The turbine scanner as embodied is only an example, and thus not restrictive.

Pico-second laser system (A)+Turbine scanner (B)+target feed (C) as lamels or film yield high quality products and/or surfaces of large amounts. The products can be of single crystalline diamond and/or silicon to be used as a substrate for semiconductor industry for instance, produced in vacuum, or in a gas atmosphere.

| | | | |
|---|---|---|---|
| Diode-pumped fibrous laser system | A<br>PICO-SECOND LASER | | over 10 W<br>advantageously, 20 . . . 1000 W<br>pulse energy 2 . . . 15 µJ<br>repetition rate 1 MHz,<br>advantageously. 10 . . . 30 MHz<br>or higher |
| | + | | |
| Smooth operated,<br>linear beam movement,<br>high laser power,<br>vacuum and/or atmosphere | B<br>TURBINE SCANNER | | Velocity 0 . . . 4000 m/s, or higher,<br>typically 50 . . . 100 m/s or higher |
| | + | | |
| Repetition 100%,<br>High quality,<br>High laser power | C<br>Film and/or lamel target feed | | Material thickness a) below,<br>b) the same or<br>c) larger than in-<br>side the focus |
| | + | | |
| Layer-structures, each layer formed from the same or different materials | D<br>AUTOMATIC PULSE ENERGY/<br>POWER CONTROL<br>SYSTEM | | control rang 0, 5 . . . 15 µJ<br>fast, max 1 µs<br>pre-progammable,<br>quality control even to micro-scale |
| | + | | |
| Integration to the laser system possible | E<br>INTEGRATED PLASM INTENSITY<br>MEASUREMENT | | Whole work width operation<br>pulse precison<br>quality control even to micro-scale |
| | + | | |
| The shorter wave-length the better yield | F<br>LASER RADIATIOIN<br>WAVE LENGTHS | | 1064 nm,<br>293 . . . 420 nm,<br>420 . . . 760 nm<br>other wave lengths |
| | + | | |

| | | |
|---|---|---|
| Operation applicability according to the embodiment | G VACUUM, GAS-ATMOSPHERE, FREE SPACE | Choice according to the cleanliness, reactivity, coating rate, and/or the economics. |

The coating can be formed on a surface of any kind, as demonstrated in FIG. 25. For example, on metal, plastics and/or paper. In one embodiment the coating has a coating layer thickness of 5 µm. The semiconductor material can be a silicon as pure or as a compound, but in a flexible form, suitable into use of electronics, micro and/or nano-electronics. The points D, E, F and G help the manufacturing of high quality products in industrial scale, repeatable and promote the quality control.

A path of radiation transference for guiding electromagnetic radiation according to an embodiment of the invention is arranged so that said path comprises a scanner arranged to guide said electromagnetic radiation, in a radiation geometry, from the radiation source to the target of the radiation, said radiation being transferred as pulsed high-power laser beam pulses. According to an embodiment of the invention, a path of radiation transference for guiding electromagnetic radiation is arranged so that said path comprises a beam expander.

According to an embodiment of the invention, a path of radiation transference for guiding electromagnetic radiation is arranged so that said path comprises a correction optical means arranged to correct the beam geometry at the path. A path of radiation transference for guiding electromagnetic radiation according to an embodiment of the invention is arranged so that said geometry is a focus geometry. According to an embodiment of the invention, a path of radiation transference for guiding electromagnetic radiation is arranged so that said geometry is the geometry in which the beam is arranged to hit the turbine scanner part. According to an embodiment of the invention, a path of radiation transference for guiding electromagnetic radiation is arranged so that said geometry is the geometry in which the beam is arranged to hit the target. According to an embodiment of the invention, a path of radiation transference for guiding electromagnetic radiation is arranged so that said radiation geometry comprises at least a first geometry for the radiation at the radiation source and a second radiation geometry for the radiation at the target.

According to an embodiment of the invention, a path of radiation transference for guiding electromagnetic radiation is arranged so that said turbine scanner is arranged into such a radiation geometry in said path that the beam from the part between the radiation source and the turbine scanner is directed to another direction than an emitting plume arranged to form from said target by said radiation. According to an embodiment of the invention, a path of radiation transference for guiding electromagnetic radiation is arranged so that said first geometry is different than said second geometry.

A radiation source arrangement according to an embodiment of the invention can in said arrangement comprise at least one or several radiation sources and that each radiation source has an optical path according to an embodiment of the invention.

According to an embodiment of the invention, a radiation source arrangement is arranged so that said arrangement comprises at least two radiation sources having at least partly same optical path. According to an embodiment of the invention, a radiation source arrangement is arranged so that said arrangement comprises at least two radiation sources having the same target area at the target side of the optical path. According to an embodiment of the invention, a radiation source arrangement is arranged so that said arrangement comprises at least a first radiation source with a first feature and a second radiation source with a second feature.

According to an embodiment of the invention, a radiation source arrangement is arranged so that said first feature and that said second feature comprise at least one of the following:
  (i) the wave-length characteristic to the radiation source,
  (ii) on-duty pulse length,
  (iii) length of off-duty period between two successive pulses,
  (iv) repetition rate of the on-duty occurrences,
  (v) radiation intensity,
  (vi) energy and/or power per pulse,
  (vii) polarization of the radiation,
  (viii) a radiation geometry, and
  a combination of at least two or more of the features (i)-(viii).

According to an embodiment of the invention, a radiation source arrangement is arranged so that said first feature is at least partly different than said second feature. According to an embodiment of the invention, a radiation source arrangement according to an embodiment comprises at least a laser in a plurality of lasers comprising at least one laser that is a diode-pumped laser or other than a diode-pumped laser. A radiation source arrangement, according to an embodiment of the invention, comprises at least one of said radiation sources as arranged to produce radiation having a wave length in range which wave length is at least one of the following:
  wave length range between a radio wave-length and an infrared wave length,
  wave length range in infrared,
  wave length range of visible light,
  wave length range of ultraviolet,
  wave length range of X-rays,
  an intermediate wave length range between any just mentioned two wavelength ranges.

According to an embodiment of the invention, a radiation source arrangement according to an embodiment of the invention comprises as a radiation source a pulsed-laser suitable to hot-work, as a micro- and/or nano-second laser. According to an embodiment of the invention, a radiation source arrangement according to an embodiment of the invention comprises as a radiation source a pulsed laser suitable to cold-work, as a pico-, femto- and/or atto-second laser. According to an embodiment of the invention, a radiation source arrangement according to an embodiment of the invention comprises as a radiation source a pulsed laser for which the pulse length is defined as the time there between of the switch-on and switch-off of the laser. According to an embodiment of the invention, a radiation source arrangement is arranged so that it comprises a continuously operated laser.

A target material according to an embodiment of the invention is arranged to be vaporizable and/or ablatable by radiation of a radiation source arrangement according to an embodiment of the invention. According to an embodiment of the invention, a target material is arranged so that said target material has product form of powder refined by ablation by radiation of a radiation source arrangement according to a an embodiment of the invention. According to an embodiment of the invention, a target material is arranged so that said target material has product form of liquid or solution, as refined by ablation by radiation of a radiation source arrangement according to an embodiment of the invention. According to an embodiment of the invention, a target material is arranged so that said target material is arranged to be on a film or on a sheet. According to an embodiment of the invention, a target material is arranged so that said target material is on a rollable web. According to an embodiment of the invention, a target material is arranged so that said target material comprises surface structure arranged to lower the ablation threshold at a certain radiation of a radiation source with a feature. According to an embodiment of the invention, a target material is arranged so that said target material comprises surface structure arranged to improve the ablation yield at a certain radiation of a radiation source with a feature. According to an embodiment of the invention, a target material is arranged so that said surface structure comprises a target feature, which is a geometrical feature, a structural feature and/or a compositional feature. According to an embodiment of the invention, a target material is arranged so that said surface structure comprises a first target feature, which is a first geometrical feature, a first structural feature and/or a first compositional feature. According to an embodiment of the invention, a target material is arranged so that said surface structure comprises a second target feature, which is a second geometrical feature, a second structural feature and/or a second compositional feature. According to an embodiment of the invention, a target material is arranged so that any of said geometrical feature has a surface feature, a base feature and/or a modification feature. According to an embodiment of the invention, a target material is arranged so that any of said surface feature is a figure-shape feature with a shape dimension and a pitch there between two said successive figure-shape parts of same kind.

According to an embodiment of the invention, a target material is arranged so that said figure-shape feature comprises at least one of the following shapes: a cubic shape, rectangular-ridge shape, conical-ridge shape, rectangular-ridge shape, cut pyramid shape, round-hole shape, rectangular-hole shape, cylindrical-shape, prismatic-shape, tetra-shape, and a co-operative combination of at least two of the just mentioned. According to an embodiment of the invention, a target material is arranged so that said shape dimension and/or said pitch is arranged according to a radiation source feature to optimize the target material vaporization/ablation. According to an embodiment of the invention, a target material is arranged so that said base feature is at least one of the following: thin base, thick base, opaque base, transparent base, polarizing base, non-transparent base, reflecting base, vaporizing base and a combination of said base features from which combinations of the complementary features are excluded. According to an embodiment of the invention, a target material is arranged so that said modification feature is at least one of the following: tilt of the figure in figure shape in respect to the normal of a plane defined by three adjacent figure parts, edge curvature of the figure in figure-shape, increase or decrease rate of the pitch in a direction per unit length, increase or decrease rate of the shape dimension per unit length, and a combination of said modification features from which combinations of the complementary features are excluded.

According to an embodiment of the invention, a target material according to an embodiment of the invention has a crystalline structure as a structural feature. According to an embodiment of the invention, a target material is arranged so that said target material has a crystalline structure of at least two crystallines comprising a first structural feature with a first set of Miller-indexes and a second structural feature with a second set of Miller-indexes. According to an embodiment of the invention, a target material comprises as a first compositional feature an element arranged into a target material to be used for ablation plume formation. According to an embodiment of the invention, a target material according to an embodiment of the invention comprises as a second compositional feature, an element arranged into the target material to be used for ablation plume formation and/or adjusting the ablation plume environment composition.

A vacuum vaporization/ablation arrangement according to an embodiment of the invention comprises a radiation source arrangement is arranged so to vaporize/ablate material from a target. According to an embodiment of the invention, a vacuum vaporization/ablation arrangement is arranged so43that said vaporization/ablation arrangement is arranged to coat a substrate by a target material to be used in coating of the substrate. According to an embodiment of the invention, a vacuum vaporization/ablation arrangement is arranged that said vaporization/ablation arrangement comprises a target material unit arranged to operate with a target material. According to an embodiment of the invention, a vacuum vaporization/ablation arrangement is arranged so that said target material is target material according to an embodiment of the invention. According to an embodiment of the invention, a vacuum vaporization/ablation arrangement is arranged so that said arrangement is arranged to, as being in the same cover with an arrangement member of the same arrangement, form a device.

According to an embodiment of the invention, a vacuum vaporization/ablation arrangement is arranged so that said arrangement comprises atmosphere means arranged to adjust the atmosphere in the reactor volume in which the vaporization/ablation is arranged to occur. According to an embodiment of the invention, a vacuum vaporization/ablation arrangement is arranged so that said atmosphere means comprises a vacuum pump arranged to minimize or adjust the pressure in said reactor volume to pre-defined level. According to an embodiment of the invention, a vacuum vaporization/ablation arrangement is arranged so that said atmosphere means comprises a pre-cursor unit arrange to arrange a pre-defined reactor atmosphere for vaporization/ablation in a pre-defined pressure and/or temperature. According to an embodiment of the invention, a vacuum vaporization/ablation arrangement is arranged so that said atmosphere means comprises a heating element arranged to heat at least one of the pre-cursors to a pre-defined temperature.

According to an embodiment of the invention, a target material unit according to an embodiment of the invention comprises a roll-arrangement arranged to handle target material in a film-like form according to an embodiment of the invention. According to an embodiment of the invention, a target material unit is arranged so that it comprises a first reel arranged to release target material in one end of the film path and a second reel arranged to roll the released target material in the opposite end of the film path. According to an embodiment of the invention, a target material unit is arranged so that it comprises at least one roll from an ensemble of rolls comprising at least one roll, arrange to handle the target material. According to an embodiment of the invention, a target material unit is arranged so that it comprises a heating element arranged to heat the target material at the vaporization/ablation region of the film. According to an embodiment of the invention, a target material unit is arranged so that it comprises at least one reel that is replaceable with a similar as empty and/or with the target material. According to an embodiment of the invention, a target material unit is arranged so that it comprises a mechanism to assist the film assembly via a roll to the film path. According to an embodiment of the invention, a target material unit is arranged so that it is arranged so that the same unit is utilizable to release the target material for the use and/or to receive the target material for the manufacturing said target material.

A turbine scanner according to an embodiment of the invention is arranged so that the turbine scanner comprises a first mirror arranged to change the direction of a coming radiation beam and a second mirror arranged to cool while said first mirror is about to change the direction of the coming radiation in a radiation path. According to an embodiment of the invention, a turbine scanner is arranged so that said first mirror is a mirror of an ensemble of similar first mirrors. According to an embodiment of the invention, a turbine scanner is arranged so that said second mirror is a mirror of an ensemble of similar second mirrors. According to an embodiment of the invention, a turbine scanner is arranged so that it comprises an ensemble of mirrors arranged to form a polygon with faces of which said first and second mirrors are. According to an embodiment of the invention, a turbine scanner is arranged that it comprises an ensemble of mirrors arranged to form a polygon with faces of which said first and second mirrors are. According to an embodiment of the invention, a turbine scanner is arranged so that said first mirrors have a different tilt angle as said second mirrors in respect to the central axis of polygon. According to an embodiment of the invention, a turbine scanner is arranged so that it is arranged to rotatable around said central axis. According to an embodiment of the invention, a turbine scanner is arranged so that it has a form of a paddle wheel so that the paddles thereof are mirrors of the turbine scanner, arranged to be rotatable along a circular path around the central axis of said paddle wheel. According to an embodiment of the invention, a turbine scanner is arranged so that each of said mirrors in said paddle wheel are arranged to a sharp angle with a tangent of said circular path. According to an embodiment of the invention, a turbine scanner is arranged so that each of said mirrors in said paddle wheel are arranged to a tilt angle with said axis of said paddle wheel. According to an embodiment of the invention, a turbine scanner is arranged so that a mirror face has a diamond surface. According to an embodiment of the invention, a turbine scanner is arranged so that said cooling of said second mirror is arranged to the opposite side of the mirror by a different fluid as the reflective surface of the mirror.

According to an embodiment of the invention, a turbine scanner is arranged so that it comprises tilted turbine paddles with mirrors, attached to the rotor part that is provided with an axes. According to an embodiment of the invention, a turbine scanner according to an embodiment of the invention comprises a replaceable mirror part. According to an embodiment of the invention, a turbine scanner according to an embodiment of the invention comprises a particular part on said mirror arranged to reflect radiation, which part is a replaceable mirror part. According to an embodiment of the invention, turbine scanner according to an embodiment of the invention comprises a gas bearing, which gas can comprise suitable gas such as a noble gas, nitrogen on air as the bearing material. According to an embodiment of the invention, turbine scanner according to an embodiment comprises a bearing arrangement to separate solid bearing surfaces by a magnetic field.

According to an embodiment of the invention, a scanner according to an embodiment of the invention comprises ablatable material on a part of said mirror surface.

A surface processing method according to an embodiment of the invention comprises:
exposing a target material acting as a target to a surface modifying beam,
directing a radiation path for the surface modifying beam from a radiation source to the target for ablation of the target material,
vaporizing/ablating target material to effective depth, for a modification of at least a surface in respect of at least one surface characteristic.

According to an embodiment of the invention, a surface processing method is arranged so that said at least one of the composition, chemical structure, mechanical structure, physical structure to said effective depth. According to an embodiment of the invention, the surface processing method is arranged so that it comprises
selecting a first surface to a target and/or selecting a second surface to a substrate, for modifying of target material from said first surface by a first surface modifying beam.

According to an embodiment of the invention, a surface processing method is arranged so that said modifying comprises removal of material from the surface at the effective depth by said first surface modifying beam. According to an embodiment of the invention, a surface processing method is arranged so that said it comprises setting a surface of a first body to the target and/or a surface of a sec- and body to a substrate so that a second surface modifying beam is used to bring material on to said surface of the second body. According to an embodiment of the invention, a surface processing method is arranged so that said modifying of said surface comprises addition of material on said surface to the effective depth defined as the layer thickness of said material. According to an embodiment of the invention, a surface processing method is arranged so that in the method, material is transferred to a second surface by a second surface modifying beam so that said material originates to said first surface, as being removed by a first surface modifying beam. According to an embodiment of the invention, a coating method that the method comprises a surface processing phases is arranged so that, it is applied for a plurality of substances comprising at least one or several substances to be used for the coating.

According to an embodiment of the invention, a coating method is arranged so that at least two substances are ablated in the method essentially from the same target. According to an embodiment of the invention, a coating method is arranged so that in the method, a first substance is ablated from a different target as a second substance. According to an embodiment of the invention, a coating method is arranged so that a first substance and a second substance are ablated in the method in the order of first substance first and then second substance for a formation of a coating. According to an embodiment of the invention, a coating method is arranged so that at least one further substance is ablated for the coating formation on a substrate in the method. According to an embodiment of the invention, a coating method is arranged so that, in the method, one of said substances is a matrix substance of the coating. According to an embodiment of the invention, a coating method is arranged so that, in the method, one of said substances is a dopant for the coating used in the method. According to an embodiment of the invention, a coating method is arranged so that in the method, one of said substances is an additional dopant for the coating to achieve an additional feature to the surface and/or coating used in the method. According to an embodiment of the invention, a coating method is arranged so that one of said substances comprises carbon for the coating used in the method. According to an embodiment of the invention, a coating method is arranged so that said carbon comprises graphite used in the method. According to an embodiment of the invention, a coating method is arranged so that said carbon comprises diamond used in the method. According to an embodiment of the invention, a coating method is arranged so that said diamond has mono-crystalline structure for the coating to be used in the method. According to an embodiment of the invention, a coating method is arranged so that one of said substances comprises uranium, trans-uranium, earth metal, rear-earth, alkaline, hydrogen, lanthanide, and/or a noble gas to be used in the method. According to an embodiment of the invention, a coating method is arranged so that one of said substances comprises a dopant comprising uranium, trans-uranium, earth metal, rear-earth, alkaline, hydrogen, lanthanide, and/or a noble gas to be used in the method. According to an embodiment of the invention, a coating method is arranged so that one of said substances comprises a dopant from boron-group (IIIb) to be used in the method. According to an embodiment of the invention, a coating method is arranged so that one of said substances comprises a dopant from carbon-group (IVb) to be used in the method.

According to an embodiment of the invention, a coating method is arranged so that one of said substances comprises a dopant from nitrogen-group (Vb) to be used in the method. According to an embodiment of the invention, a coating method is arranged so that one of said substances comprises a dopant from oxygen-group (VIb) to be used in the method. According to an embodiment of the invention, a coating method is arranged so that one of said substances comprises a dopant from halogen-group to be used in the method.

According to an embodiment of the invention, a coating method and/or the coating according to an embodiment of the invention can be used in a use made according to an embodiment of the invention.

According to an embodiment of the invention, a use of a coating is arranged so to coat a surface of a body, which surface is an outer and/or an inner surface of said body. According to an embodiment of the invention, the use of a coating is arranged so to coat a surface of a body, which is a body and/or a lining structure of an air-craft vessel, ship, boat, sailing ship or a part thereof, vehicle, or space-craft-vessel. According to an embodiment of the invention, a use of a coating is arranged so to coat a surface of a motor and/or a part thereof for an air-craft vessel, ship, boat, sailing ship or a part thereof, vehicle, or space-craft-vessel. According to an embodiment of the invention, a use of a coating is arranged so to coat a surface of a lining structure and/or a part thereof for an air-craft vessel, ship, boat, sailing ship or a part thereof, vehicle, or space-craft-vessel. According to an embodiment of the invention, a use of a coating is arranged so to coat a surface of a body, which is tool and/or a part thereof. According to an embodiment of the invention, a use of a coating is arranged so to coat a surface of a body, which is a piece of furniture aimed to domestic, business and/or industrial use.

According to an embodiment of the invention, a use of a coating is arranged so to coat a surface of a body, which is a vessel, dish, holder, receptacle, tank, vat, jar, can, pot, bowl, container; tray, bin, trough, tub and/or barrel. According to an embodiment of the invention, a use of a coating is arranged so to coat a surface of a body, which is aimed to be used in kitchen, business, arts and/or industry comprising metallurgical industry, food industry, medical industry, chemical industry, painting and/or pigment industry, semiconductor industry. According to an embodiment of the invention, a use of a coating is arranged so to coat a surface of a body, which is kitchen-related body, reactor, reactor for a chemical reaction, and/or transfer line of material. According to an embodiment of the invention, a use of a coating is arranged so to coat a surface of a body, which is one of the following: a transparent plate of glass, plastics, composite or a laminated structure, opaque plate of glass, plastics, composite or a laminated structure, solar cell and/or part thereof arranged to operate at least on one certain wave-length range, and a combination of the mentioned.

According to an embodiment of the invention, a use of a coating is arranged so to coat a surface of a body, which is a building element for a building to be built for housing, business, industry, storing and/or a building to be built for other purpose. According to an embodiment of the invention, a use of a coating is arranged so to coat a surface of a body, which is a building element, for a building for housing and/or other building, composing of natural and/or non-synthetic material originating to nature. According to an embodiment of the invention, a use of a coating is arranged so to coat a surface of a body, which is a toy or a part thereof. According to an embodiment of the invention, a use of a coating is arranged so to coat a surface of a body, which is a watch, clock, mobile, PDA, computer, display, TV, radio, or a part thereof of the any mentioned. According to an embodiment of the invention, a use of a coating is arranged so to coat a surface of a body, which is a casing and/or a shell, or a part thereof of the any mentioned. According to an embodiment of the invention, a use of a coating is arranged so to coat a surface of a body, which has a fibrous composition at least partly. According to an embodiment of the invention, a use of a coating is arranged so to coat a surface of a body, which is thread, yarn, chord, filament, wire, string, solid conductor, strandline and/or rope. According to an embodiment of the invention, a use of a coating is arranged so to coat a surface of a body, which has a web structure and/or has a textile structure. According to an embodiment of the invention, a use of a coating is arranged so to coat a surface of a body, which is one of the following: fibrous filter, industrial textile, textile for a cloth or paper. According to an embodiment of the invention, a use of a coating is arranged so to coat a surface of a body, which is wave-guide for electromagnetic radiation. According to an embodiment of the invention, a use of a coating is arranged so to coat a surface of a body, which is made of diamond at least partly. According to an embodiment of the invention, a use of a coating is arranged so to coat a surface of a body, which has a different composition before the coating than after the coating. According to an embodiment of the invention, a use of a coating is arranged so to coat a surface of a body, which comprises means for practicing sports. According to an embodiment of the invention, the a of a coating is arranged so to coat a surface of means, which comprises means for practicing sports and/or hunting. According to an embodiment of the invention, a use of a coating is arranged so to coat a surface of a body, wherein said means are means for skiing, slalom, snow boarding, skating on ice or ground, cradle, sledge, sleight, playing games with at least one stick. According to an embodiment of the invention, a use of a coating is arranged so to coat a surface of a body, wherein said means are throwing, shooting, sliding, gliding, scrolling or bowling. According to an embodiment of the invention, use of a coating is arranged so to coat a surface of a body, which is a cycle or a part thereof, chain, bearing, or another part of the just mentioned. According to an embodiment of the invention, use of a coating is arranged so to coat a surface of a body, which is a piece of jewelry, decoration, artwork or a copy thereof. According to an embodiment of the invention, use of a coating is arranged so to coat a surface of a body, which is a micromechanical element. According to an embodiment of the invention, use of a coating is arranged so to coat a surface of a body, which is a semiconductor. According to an embodiment of the invention, use of a coating is arranged so to coat a surface of a body, which is a insulator for electricity and/or warmth. According to an embodiment of the invention, use of a coating is arranged so to coat a surface of a body, which is a conductor for electricity and/or warmth. According to an embodiment of the invention, use of a coating is arranged so to coat a surface of a body, which is spare part of human being and/or animal.

According to an embodiment of the invention, use of a coating is arranged so to coat a surface of a body, which is a joint surface. According to an embodiment of the invention, use of a coating is arranged so to coat a surface of a body, which is an fixing means, as a rivet, stud, screw, nail, hook or nut. According to an embodiment of the invention, use of a coating is arranged so to coat a surface of a body, which is at least a part of a radiation path. According to an embodiment of the invention, use of a coating is arranged so to coat a surface of a body, which is a target material base in a certain product form, turbine scanner or a part thereof. According to an embodiment of the invention, use of a coating is arranged so to coat a surface of a body, which is a plastic film, in product form of sheets and/or web. According to an embodiment of the invention, use of a coating is arranged so 106 to coat a surface of a body, which is an optical element.

According to an embodiment of the invention, use of a coating is arranged so to coat a surface of a body, which comprises a lens, prism, filter, mirror, an attenuator, polarizer or a combination thereof of the just mentioned. According to an embodiment of the invention, use of a coating is arranged so to coat a surface of a body, which is spectacles or contacts. According to an embodiment of the invention, use of a coating is arranged so to coat a surface of a body, which is bond, stock or another paper of value, or means of payment. According to an embodiment of the invention, use of a coating is arranged so to coat a surface of a body, which is a container for storing a substance. According to an embodiment of the invention, use of a coating is arranged so to coat a surface of a body, which is a container for storing hydrogen and/or releasing hydrogen. According to an embodiment of the invention, use of a coating is arranged so to coat a surface of a body, which is a container for storing hydrocarbon and/or releasing hydrocarbon. According to an embodiment of the invention, use of a coating is arranged so to coat a surface of a body, which is a container for storing nuclear fuel and/or an element thereof. According to an embodiment of the invention, use of a coating is arranged so to coat a surface of a body, which is a substrate body to be coated with an UV-active coating.

3D-printer according to an embodiment of the invention comprises an arrangement according to an embodiment of the invention as arranged to coat a coating layer.

3D-printer according to an embodiment of the invention, comprises
- a target holder for holding a processable surface for exposure of said surface to a surface modifying beam to an effective depth thereof,
- means for producing the surface modifying beam and/or radiation transferring path to direct said second surface modifying beam to the target,
- means for producing a second surface modifying beam and/or a second radiation transferring path to direct said second surface modifying beam to the target, and
- a substrate holder for holding said substrate for exposure of said surface to a second surface modifying beam to an effective depth thereof.

According to an embodiment of the invention, 3D-printer is arranged so that said surface modifying beam is an ablating beam to stylization of the print. According to an embodiment of the invention, 3D-printer is arranged so that it comprises controller means arranged to control the printing of the 3D-body slice by slice, each slice with its effective depth, wherein said second surface modifying beam is a material plume. According to an embodiment of the invention, 3D-printer is arranged so that it comprises means arranged to carve by cold ablation.

3D-copy-machine according to an embodiment of the invention comprises first means to define and/or formulate data of a 3D-body on its shape and/or dimensions for recording into a file, second means to convert said data to control commands for controlling a 3D-printer, and a 3D-printer according to an embodiment of the invention.

According to an embodiment of the invention, 3D-copy-machine is arranged so that it said first means comprise optical means for UV, visible light and/or IR. According to an embodiment of the invention, 3D-copy-machine is arranged so that it said first means comprise X-ray tomography means. According to an embodiment of the invention, 3D-copy-machine is arranged so that it said first means comprise acoustic means. According to an embodiment of the invention, 3D-copy-machine according to an embodiment of the invention is arranged so that said first means is based on interference. According to an embodiment of the invention, 3D-copy-machine according to an embodiment of the invention is arranged to copy and/or print micro-scale bodies. According to an embodiment of the invention, 3D-copy-machine according to an embodiment of the invention is arranged to copy and/or print macroscopic-scale bodies. According to an embodiment of the invention, 3D-copy-machine according to an embodiment of the invention is arranged to copy and/or print bodies that have their size between the microscopic and macroscopic-scale.

An arrangement to control radiation power of a radiation source via path of radiation transference for guiding electromagnetic radiation according to an embodiment of the invention, is arranged so that the arrangement comprises in said path observation means arranged to observe anomalies in a surface modifying beam from a pre-defined feature and/or to record said anomalies into a file, and feed back means arranged to form a feed back to minimize the observed anomaly and/or to adjust the radiation source to the pre-defined feature. According to an embodiment of the invention, an arrangement is arranged so that said feature is a feature according to an embodiment of the invention. According to an embodiment of the invention, an arrangement is arranged so that said feed back signal is used to adjust a part of a path of radiation transference for guiding electromagnetic radiation. According to an embodiment of the invention, an arrangement is arranged so that said part is a scanner.

According to an embodiment of the invention, use of a coating is arranged so to coat a surface of a body as a substrate, which body belongs at least to a patent class human necessities and/or to a sub-class hierarchy thereof.

Manufacturing method of target material according to an embodiment of the invention, comprises a phase in which a film and/or a sheet like base is exposed to a material plume of the ablatable target material for coating a part of the base at least on one side with said target material. According to an embodiment of the invention, the manufacturing method is arranged so that the method comprises utilisation of a mechanical shaplone or template for providing the target material a shape feature. According to an embodiment of the invention, the manufacturing method is arranged so that the method comprises providing the base markings for the target material having a shape feature with at least a pitch in one direction and/or two directions. According to an embodiment of the invention, the manufacturing method is arranged so that said markings are electric and/or magnetic markings. According to an embodiment of the invention, the manufacturing method is arranged so that said markings are thermal markings. According to an embodiment of the invention, the manufacturing method is arranged so that said markings are provided as seeds onto locations on the base for a heterogeneous nucleation and/or a following condensation to be used for the formation of the target material into certain predefined form. According to an embodiment of the invention, the manufacturing method is arranged so that said method comprises a stylization phase of forming the target material formations on the base. According to an embodiment of the invention, the manufacturing method according to an embodiment of the invention comprises using a target material unit is arranged according to an embodiment of the invention.

According to an embodiment of the invention the photon radiation source can comprise at least one pumped radiation source that it comprises a power radiation source arranged to provide radiation for fine plasma production, a source for a pumping radiation, input means to control the radiation source. According to an embodiment of the invention the input means can be used also to feed a keying signal so to prevent the power radiation source to radiate the power, when the beam were about to hit the surface of the scanner at the discontinuity point. According to an embodiment of the invention the radiation source arrangement can comprise at least one or several radiation sources, which are not necessarily all identical. According to an embodiment each radiation source has an optical path according to an embodiment of the invention.

According to an embodiment of the invention the photon radiation is directed along an optical path for radiation transference to guide the electromagnetic radiation along said path, which is arranged to provide radiation for fine plasma production so that the path comprises a route via a scanner arranged to guide said electromagnetic radiation, in a radiation geometry, from the radiation source to the target of the radiation, said radiation being transferred as pulsed high-power laser beam pulses. According to an embodiment of the invention, the scanner can be turbine scanner in an advantageous embodiment for a certain surface treatment of cold-working and/or coating. However, the scanner can be a vibrating scanner, turbine scanner or a vibrating turbine scanner, from which the first may be not as advantageous as the turbine scanner for said certain surface treatment.

In an embodiment of the invention in which the target material is exposed to pulsed radiation for the formation of an ablation plume, the target spot can be arranged to travel on the target piece surface. A scanner can be used for the purpose, which can be embodied as a turbine scanner. It is important that the pulses do not overlap too much because of the probability to hit the plume centre and thus loose power of a pulse in some extent so potentially risking the clean ablation. So, the spot should be travelling if the plume were to be kept as constant and/or stable for the use of it in a coating process. It is possible to move the target, and/or the radiation beam. If the spot travels with a sufficient speed of several meters per second up to 1 km/s, for instance a radiation source as embodied as an atto-, femto- or pico second laser can be used for a high yield coating process with a high quality coating.

The co-incidence of the successive pulses is dependent on the repetition rate of the pulses, spot size, and the travelling speed of it on the target. For instance, if the repetition rate were 1 MHz, the spot size 16 μm diameter and the travelling speed were 1 m/s, only 8% of each pulse were hitting a virgin surface. When the travelling speed were about to increased to 4 m/s the virgin surface for each pulse were about 30% and for a 10 m/s even 80%.

According to an example on an embodiment of the invention, if the repetition rate of the pulses were about 30 MHz, the spot movement could be of a magnitude of 100 m/s. This magnitude can be achieved by a turbine scanner. However, it is noticed that also vibrating scanners can provide a sufficient spot movement velocity. According to the example, such a vibrating scanner should vibrate at frequencies in the kHz range to have sufficient capability to deflect the laser beam to an angle below 30°, say from 0 to 5-10° for instance. However, the just mentioned values are examples shown without any attention to limit the scope to the mentioned values or estimates only.

According to an alternative embodiment of the invention, the radiation path can comprise another type of scanner than turbine scanner. According to an embodiment of the invention at least one turbine scanner can be in the radiation path of the radiation to be transferred. According to an embodiment of the invention the scanner can be a vibrating type scanner. Such a scanner can be a feed through type, but because of the losses, the power that is tolerated can be quite small to pass the scanner. According to another embodiment of the invention a mirror or a piece comprising a mirror that can deflect laser beam as based on reflection can be used as a scanner for the scanning of the radiation.

In a scanner to be used according to an embodiment of the invention the vibration that deflects the radiation beam in the radiation path can be achieved by a piezoelectric phenomena and/or magnetostriction phenomena to be used to form the scanner surface to bend, and/or move a position of the surface, for the beam deflection. The vibration can be also arranged by electrostatically vibrating element, in a similar fashion as in audio techniques. According to an embodiment of the invention ferroelectric prism can be used as a scanner. Instead and/or in addition to a turbine scanner in the radiation path a piezoelectric scanner, magnetic scanner, acoustic scanner, or any electro-magnetic and/or -mechanic scanners can be used. Additionally the radiation deflection can be achieved according to an embodiment of the invention by a diaphragm such as used in audio techniques as loudspeakers. For instance a beryllium diaphragm or a coated film can be used for a light-weight mirror surface. The scanner can be made in suitable part of microscopic scaled and/or macroscopic components (MEMS, PZT, bi-, tera-morphs and/or their combinations) to achieve sufficient vibration and the necessary deflection of the radiation to keep the dimensions of the radiation path in a reasonable level as well as for the length as the scanning width, preferably in an embodiment in cm-range, but however without a limitation to the just mentioned example only.

However, vibrating mirror or another reflective surface can cause a location at the surface where the radiation spot spends more time than at the other locations on the surface, so yielding more power to those spots. This can be harmful for the plume in certain circumstances in which the plume formation is dependent on the amount of radiation coming outside of the plume. Similar way also turbine scanners that have an arc there between two successive mirror surfaces can cause a defect into the power level of the radiation that arrives to the target. Such a point is in the following referred as a discontinuity point. In order to avoid the power loss and the consequent of degrading of the plume, according to an embodiment of the invention a references beam is arranged to detect and/or determine the timing of the discontinuity points occurrences at the scanner surface and/or at their ends. The reference beam can be a continuous stable low power beam arranged to generate a signal dependent on the degraded level of power at the same path as the power radiation, but the signal is arranged to keep the power radiation source off during the potential moments of occurring of degraded plume. This can be achieved by a teaching period to detect the moments to keep the power radiation source off. An autocorrelator or another kind correlator can be used to match the power radiation sources radiation's degradiation or other changes in the radiation power level that relate to the discontinuity points, to the similar kind of changes of the reference beam at the discontinuity point. In an embodiment of the invention the signal to control the power radiation is formed so that the pitch between the parts of the signal that indicate allowance to the power radiation source to radiate, is adjustable to preserve timing tolerance for the non-radiating period while the mirror's discontinuity point is at the radiation beam target area in a non-advantageous way. When the correlation is made, the electronics and the related software are taught to generate the signal with such parts that indicate power radiation beam on and off. The electronics and/or the software are arranged so that the pitch can be adjusted automatically, but also the information from the scanner can be used in the correlation making. The signal can be used to key a pump that pumps a power radiation source.

According to an embodiment of the invention, a turbine scanner mirror surfaces can be implemented by vibrating surfaces, so forming a vibrating turbine scanner. In such an embodiment the laser pulses can be deflected even during a single mirror spot occurrence to different locations on the target because of the vibrating surface. This way, the spot travelling distance on the virgin target surface can be increased and thus the yield of the plume can be higher from a virgin area of the target, so helping to keep the frequencies of mechanical parts pretty low. In such an embodiment, the turbine scanner can be operated in phase so that the vibrations of the mirror surfaces are in phase to balance the scanner rotation. The electricity needed for the vibrating surfaces can be arranged to the rotating scanner as based on induction, so wires are not needed between the scanner rotor part and the stator part.

Example on Known Art Problems

Conventionally galvanometric scanners are used to scan a laser beam with a typical maximum speed of about 2-3 m/s, in practice about 1 m/s (12). This means that even 40-60 pulses 11 are overlapping with a repetition rate of 2 MHz (FIG. 65).

Example to Demonstrate Known Art Problems

Plasma related quality problems are demonstrated in FIGS. 62 and 63, which indicate plasma generation according to known techniques. A laser pulse γ 1114 hits a target surface 1111. As the pulse is a long pulse, the depth h and the beam diameter d are of the same magnitude, as the heat of the pulse 1114 also heat the surface at the hit spot area, but also beneath the surface 1111 in deeper than the depth h. The structure experiences thermal shock and tensions are building, which while breaking, produce fragments illustrated F. As the plasma may be in the example quite poor in quality, there appears to be also molecules and clusters of them indicate by the small dots 1115, as in the relation to the reference by the numeral 1115 for the nuclei or clusters of similar structures, as formed from the gases 1116 demonstrated in the FIG. 63. The letter "o"s demonstrate particles that can form and grow from the gases and/or via agglomeration. The released fragments may also grow by condensation and/or agglomeration, which is indicated by the curved arrows from the dots to Fs and from the os to the Fs. Curved arrows indicate also phase transitions from plasma 1113 to gas 1116 and further to particles 1115 and increased particles 1117 in size. As the ablation plume in FIG. 63 can comprise fragments F as well as particles built of the vapors and gases, because of the bad plasma production, the plasma is not continuous as plasma region, and thus variation of the quality may be met within a single pulse plume. Because of defects in composition and/or structure beneath the deepness h as well as the resulting variations of the deepness (FIG. 67A), the target surface 1111 in FIG. 63 is not any more available for a further ablations, and the target is wasted, although there were some material available.

FIG. 64 represents example on an ITO-coating (Indium-Tin-Oxide-) on polycarbonate sheet (~100 mm×30 mm) produced by employing a prior art optical scanner, namely vibrating mirror (galvo-scanner), in different ITO thin-film thicknesses (30 nm, 60 nm and 90 nm). The picture clearly demonstrates some of the problems associated with employing vibrating mirror as an optical scanner especially in ultra short pulsed laser deposition (USPLD) but also in laser assisted coatings in general. As a vibrating mirror changes its direction of angular movement at its end positions, and due to moment inertia, the angular velocity of the mirror is not constant near to its end positions. Due to vibrating movement, the mirror continuously brakes up and stops before speeding up again, causing thus irregular treatment of the target material at the edges of the scanned area. This in turn results in low quality plasma (FIGS. 63, 64) comprising particles especially in the edges of the scanned area and finally, in low quality and seemingly uneven coating result. The coating parameters have been selected to demonstrate uneven distribution (FIG. 65) of ablated material due to the nature of the employed scanner, but if selecting parameters appropriately the film quality can be enhanced and the problems may become transparent, but may be not excluded.

Such problems are common both with nano-second lasers in general, and present pico-second lasers if they were employing the state of the art scanners.

FIG. 66 shows that if ablation of material 16 were embodied according to a known art method from a target 17, thermal tension could cause stresses in certain locations of the target and release when triggered fragments 20 yielding also bumpy edges 18.

Example on the FINE Plasma Concept

FIGS. 68 and 69 illustrates an advantage of short pulses according to an embodiment of the invention. The Ultra Short Pulse Laser Deposition has been used, so that the range of the pulse length is in ps-range down to as with a pitch that is longer than the pulse duration, but also longer than the relaxation time of the structure in target material 1311. Thus, the plume is free from particles, the plasma quality is high (1, 1-2, 1-2) and the depth h that is shown in FIG. 69 is exaggerated for presentational reasons out of scale. The spot size is set in a controlled manner to correspond the ablation threshold to be exceeded throughout the spot area, with the appropriate fluence of the photon radiation. The spot diameter/h ratio is high, corresponding also high plasma quality, provided that the plasma is also produced with such a fluency in the ablation so that the pulse duration is selected to a region that does not cause damage to the beneath structures below the depth h.

Example on the Overlapping Pulses with Fine Plasma

According to an embodiment of the invention in the scope of fine plasma quality, the spot areas on the ablation path in FIG. 70 are over lapping only by 30% for a spots that are adjacent on the target surface. The tolerance is constant within 10% accuracy. According to another embodiment of the invention, the spot areas on the ablation path are over lapping by 100% so that the spots are in series in an ablation path in an depth direction of the target, i.e. as drilling or whet the target at one surface. The tolerance is constant within 0.5% accuracy. The numbers are examples only are not limiting embodiments of the invention to the mentioned.

On the contrary to known techniques, with the turbine scanner the scanning speed can be continuously adjusted for example in the range 1-300 m/s. An example of an ablation path according to an embodiment of the invention in FIG. 70 for a scan with about 30% overlap between pulses in a fine plasma concept is illustrated with 0% tolerance in the example of FIG. 70.

In the example, laser pulse energy was kept optimal and sufficiently low for the particular fiber used (5 µJ at maximum for the very fiber), so that each pulse was used for fine plasma. The deposition was run effectively by after adjusting the spot size for optimal fluence. Finally high deposition rate was maintained while increasing the repetition rate.

Example on the with FINE Plasma Embodiment

According to an embodiment of the invention, in the example, high quality indium-tin-oxide films were grown on glass, silicon (Si) and polycarbonate (PC) substrates using ultra short pulsed laser deposition (USPLD) with a 20 ps fiber laser at 1064 nm. Substrate temperature was varied in the range 70-120° C. Both oxide and metal targets were utilized. In the case of the oxide target, deposition rates of 1.5 nm/s were achieved with a relatively low single pulse fluences of 0.29-0.32 J/cm$^2$ on a 26 µm spot with a repetition rate of 2 MHz. This corresponds to a total power on the target of about 3-4 W.

Deposited films were characterized by confocal microscope, FTIR and Raman spectroscopy, AFM, optical transmission measurements, ESEM and electrical measurements. High optical transmission exceeding 90% at wavelengths from 340 to 780 nm for the films of thickness in the range 35-90 nm was achieved by adjusting deposition parameters.

These films had high adhesion and very uniform structure with a low surface roughness, i.e. about the same as the roughness of Si, glass and PC substrates, <3 nm. Electrical resistivity of the samples varied in the range 2.4-40×10$^{-3}$ ohmcm.

So, the properties of ITO films deposited by USPLD can be tailored by adjusting deposition parameters like gas pressure and composition, substrate temperature, target structure and/or composition, deposition geometry and/or laser, scanning parameters. High deposition rate, high adhesion and precise control of deposition are significant advantages of the USPLD method.

The invention claimed is:

1. A method to produce plasma by photon radiation from a target body comprising target material having an ablation threshold and an absorbance of said photon radiation, comprising:

selecting an ablation area on the target body for the generation of plasma from a spot on said ablation area,
selecting a radiation geometry for said photon radiation, to focus said photon radiation onto the spot on said target body,
controlling ablation of said target body by:
  controlling an ablation depth in said target body by adjusting a spot size of said photon radiation on said ablation area or by scaling the power of said photon radiation for said spot so that the photon radiation fluence exceeds the ablation threshold on said target body in the spot to a selected ablation depth defined by the absorbance of the target material in said spot, and
  scaling a spot size and/or radiation power of said photon radiation so that the ratio of the spot size dimension to said ablation depth is adjusted to a constant value for said target area for the duration of the scanning with said radiation,
directing said photon radiation along a radiation path from a radiation source to said spot on the target body via a turbine scanner, in which reflective surfaces are faces of a polygon that is arranged to rotate around a rotation axis, and
generating said plasma by scanning said photon radiation so that said spot moves along an ablation path on said ablation area.

2. The method of claim 1, wherein said photon radiation is pulsed to radiation pulses.

3. The method of claim 2, comprising setting said turbine seamier to rotate so that at least two photon radiation pulses hit the target body at spots with at least partially overlapping areas.

4. The method according to any one of claim 2 or 3, comprising selecting a pulse length smaller than a characteristic value of the target material that characterizes a relaxation time of the target structure for a thermal energy transference mechanism in said target structure.

5. The method according to claim 2, comprising utilising an electric and/or magnetic field to direct the plasma and/or to collect particles that have a characteristic measure of size smaller than the value of said ablation depth.

6. The method according to claim 1, comprising selecting said constant value for optimizing the kinetic energy of the plasma.

7. Use of a coating method according to claim 1 for printing and/or copying.

8. The method of claim 1, wherein said ablation of said target body is cold ablation.

9. A coating method, comprising:
selecting an ablation area on a target body for the generation of plasma from a spot on said ablation area,
selecting a radiation geometry for a photon radiation, to focus said photon radiation onto the spot on said target body,
controlling ablation of said target body by:
  controlling an ablation depth in said target body by adjusting a spot size of said photon radiation on said ablation area or by scaling the power of said photon radiation for said spot so that the photon radiation fluence exceeds the ablation threshold on said target body in the spot to a selected ablation depth defined by the absorbance of the target material in said spot, and
  scaling a spot size and/or radiation power of said photon radiation so that the ratio of the spot size dimension to said ablation depth is adjusted to a constant value for said target area for the duration of the scanning with said radiation, directing said photon radiation along a radiation path from a radiation source to said spot on the target body via a turbine scanner, in which reflective surfaces are faces of a polygon that is arranged to rotate around a rotation axis, generating said plasma by scanning said photon radiation so that said spot moves along an ablation path on said ablation area, and directing said plasma, generated from said target, onto a surface on a substrate body to be coated.

10. The coating method according to claim 9, comprising optimising, via kinetic energy of said plasma, the adhesion of the plasma constituents onto said surface.

11. The coating method according to claim 10, comprising boosting the kinetic energy of the plasma for improved adhesion onto said surface, wherein said boosting is implemented by accelerating said plasma constituents with an electric and/or magnetic field.

12. The coating method according to claim 11, comprising selecting a further constituent for constituting the coating onto the surface via a chemical reaction of a substance originating from at least one of said target body and a material fed into the coating volume surrounding the substrate.

13. The coating method according to claim 12, wherein a second target material is selected for ablation from a second spot, and between said first spot and said second spot, plasma is generated from a third spot on a different ablation path than the ablation path that goes through said first and said second spots.

14. The coating method according to claim 13, wherein said third spot is on a different ablation path and on a different target than said first and second spots.

15. The coating method according to claim 9, wherein said ablation of said target body is cold ablation.

* * * * *

UNITED STATES PATENT AND TRADEMARK OFFICE
CERTIFICATE OF CORRECTION

PATENT NO.         : 8,828,506 B2
APPLICATION NO.    : 12/522991
DATED              : September 9, 2014
INVENTOR(S)        : Jari Ruuttu et al.

Page 1 of 1

It is certified that error appears in the above-identified patent and that said Letters Patent is hereby corrected as shown below:

In the Claims

In claim 3, column 70, lines 29-30, replace "said turbine seamier to rotate" with --said turbine scanner to rotate--.

Signed and Sealed this
Second Day of December, 2014

Michelle K. Lee
*Deputy Director of the United States Patent and Trademark Office*